United States Patent [19]
Kondo et al.

[11] Patent Number: 5,488,299
[45] Date of Patent: Jan. 30, 1996

[54] NUCLEAR MAGNETIC RESONANCE IMAGING WITH IMPROVED IMAGE QUALITY AND OPERATION EFFICIENCY

[75] Inventors: Masafumi Kondo; Hiromi Kawamoto, both of Tochigi, Japan

[73] Assignee: Kabushiki Kaisha Toshiba, Kawasaki, Japan

[21] Appl. No.: 31,185

[22] Filed: Mar. 12, 1993

[30] Foreign Application Priority Data

| | | | |
|---|---|---|---|
| Mar. 13, 1992 | [JP] | Japan | 4-055648 |
| Mar. 31, 1992 | [JP] | Japan | 4-106198 |
| Sep. 11, 1992 | [JP] | Japan | 4-243759 |
| Feb. 25, 1993 | [JP] | Japan | 5-035982 |

[51] Int. Cl.⁶ ............................................. G01V 3/00
[52] U.S. Cl. ............................. 324/318; 324/322
[58] Field of Search ............................ 324/318, 322, 324/314, 307, 309; 128/653.5

[56] References Cited

U.S. PATENT DOCUMENTS

| | | | |
|---|---|---|---|
| 4,646,024 | 2/1987 | Schenck et al. | 324/318 |
| 4,737,716 | 4/1988 | Roemer et al. | 324/319 |
| 5,077,524 | 12/1991 | Hurd et al. | 324/318 |
| 5,177,441 | 1/1993 | Morich et al. | 324/318 |

FOREIGN PATENT DOCUMENTS

| | | |
|---|---|---|
| 0317775 | 5/1989 | European Pat. Off. |
| 0405521 | 1/1991 | European Pat. Off. |
| 2207764 | 2/1989 | United Kingdom. |
| 2208768 | 4/1989 | United Kingdom. |
| 92/05737 | 4/1992 | WIPO. |

OTHER PUBLICATIONS

Van Vaals, J. J. et al., "Optimization of Eddy–Current Compensation", *Journal of Magnetic Resonance* 90, pp. 52–70 (1990). Mo. of pub. unknown.

Boesch, Ch. et al., "Temporal and Spatial Analysis of Fields Generated by Eddy Currents in Superconducting Magnets: Optimization of Corrections and Quantitative Characterization of Magnet/Gradient Systems", *Magnetic Resonance in Medicine* 20, pp. 268–284 (1991). Mo. of pub. unknown.

*Primary Examiner*—Louis M. Arana
*Attorney, Agent, or Firm*—Foley & Lardner

[57] ABSTRACT

A nuclear magnetic resonance imaging with improved image quality and operation efficiency. It uses an active shield coil with an outer shielding coil having at least two coil turns which are provided on a plurality of separate layers and mutually connected electrically, in order to reduce the heat generation. The eddy current in the shielding coil is reduced by providing a slit portion thereon. The eddy current compensation is achieved by using an appropriate eddy current compensation pulse to minimize a residual eddy current magnetic field within a desired field of view according to a model of a general expression of the residual eddy current magnetic field after the eddy current compensation. The optimum setting of the system parameters for various imaging pulse sequences is achieved for the undetermined gradient coil configuration as well as for the predetermined gradient coil configuration, according to a mathematical model analysis of various imaging pulse sequences.

11 Claims, 24 Drawing Sheets

SLIT PORTION    CONDUCTIVE PORTION    ETCHED PORTION

NUCLEAR MAGNETIC RESONANCE IMAGING WITH IMPROVED IMAGE QUALITY AND OPERATION EFFICIENCY

BACKGROUND OF THE INVENTION

1. Field of the Invention

The present invention relates to a nuclear magnetic resonance imaging, and more particularly, to an improvement of an image quality of the nuclear magnetic resonance images to be obtained and an operation efficiency in the nuclear magnetic resonance imaging.

2. Description of the Background Art

The nuclear magnetic resonance imaging (referred also as MRI hereinbelow) is a technique for imaging microscopic chemical or physical information of an imaging target object by utilizing tile so called nuclear magnetic resonance phenomenon according to which the nucleus having a characteristic magnetic moment placed in a homogeneous static magnetic field can resonantly absorb the energy of the high frequency magnetic field of a specific resonant frequency.

In an MRI apparatus for carrying out such a nuclear magnetic resonance imaging, depending on a type of an imaging pulse sequence to be used, numerous different manners of switching of the gradient magnetic fields to be superposed onto the static magnetic field will be required.

Examples of the conventionally known imaging pulse sequence to be used in the nuclear magnetic resonance imaging include the usual imaging sequence such as the spin echo sequence and the field echo sequence, the ultra high speed imaging sequence such as the echo planar sequence, and the nuclear magnetic resonance angiography sequence for obtaining the distribution or the speed of the blood flow in the blood vessels.

Each of these imaging pulse sequences is associated with a characteristic manner of switching of the gradient magnetic fields, and such a switching of the gradient magnetic fields is known to generate the eddy currents on the thermal shielding for the superconducting magnet as well as on the RF shielding, while generating the coupling currents on the shim coils. These transient currents can affect the temporal and spatial characteristics of the gradient magnetic fields to cause the serious degradation of the image quality in the nuclear magnetic resonance images to be obtained such as blurring.

In general, the level of the blurring caused by the transient magnetic fields produced by these transient currents differs at different spatial position, so that it can not be compensated by the usual image quality restration technique such as the inverse filtering at k-space (spatial frequency space).

Conventionally, this problem of the image quality degradation due to the transient currents caused by the switching of the gradient magnetic fields has been at least partially resolved as follows.

First, there has been a proposition for a method to compensate the time response of the eddy currents generated on the thermal shieldings for the superconducting magnet and the high frequency magnetic field shieldings by modulating the currents to be supplied to the gradient coils for generating the gradient magnetic fields by the components corresponding to the inverse response of the time response of the eddy currents.

However, even when the time response of the eddy currents is completely compensated by this method, there still remains the degradation of the image quality due to the fact that the transient magnetic fields produced by the transient currents have the spatial non-liearlity and the field center which are different from those of the desired gradient magnetic fields, which is particularly noticeable at spatial positions rather distanced from the field center. In order words, in this method, the residual eddy current magnetic field can be completely nullified only at a point at which the eddy current compensation has been made, and the significant amount of the residual eddy current magnetic field will be still present elsewhere, where the strength of the residual eddy current magnetic field at each spatial position increases in proportion to the difference of the relative strength of the residual eddy current magnetic field at each spatial point with respect to the residual eddy current magnetic field strength at the eddy current compensation point.

Moreover, this method does not account for the coupling currents generated on the shim coils at all, so that it can only be a partial resolution of the whole problem at best.

Furthermore, there has been no generally applicable analysis of the magnetic field distribution after the eddy current compensation available conventionally, so that the optimal eddy current compensation accounting for the spatial distribution of the residual eddy current magnetic field has been unavailable conventionally.

On the other hand, there has been a more advanced proposition aimed at the full resolution of this problem of the image quality degradation due to the transient currents including the eddy currents as well as the coupling currents, concerning the use of the so called active shield gradient coils (ASGC) comprising the primary gradient coil as inner coil and the shielding coil as outer coil enclosing the inner coil such that the desired gradient magnetic field can be generated only within a space enclosed by the inner coil and the leakage magnetic field outside the outer coil can be eliminated.

FIG. 1 shows an exemplary coil configuration for the outer shielding coil of the ASGC proposed by Roemer et al. in U.S. Pat. No. 4,737,716, which is designed to be used in conjunction with the gradient coil in a direction perpendicular to an axial direction of the static magnetic field. This coil configuration reflects the continuous distribution of the complete shielding eddy currents on a cylindrical shielding body surface along which the ASGC is to be provided.

In general, the eddy current distribution is expressed by a special function such as a modified Bessel function, so that it has been difficult to realize this distribution faithfully by arranging the physically discrete coils according to the conventionally available coil winding techniques, so that it has been inevitable to utilize a highly sophisticated manufacturing technique such as a numerical controlling (NC). In particular, in order to realize a higher shielding rate for the leakage magnetic field, a higher precision coil winding technique has been required, so that the manufacturing steps as well as the manufacturing cost required by the realization of the satisfactory ASGC could be quite enormous.

To this end, there has been a proposition for a considerable reduction of the manufacturing steps and the manufacturing cost required by the realization of the satisfactory ASGC by employing the etching manufacturing method for the formation of the ASGC winding pattern, as disclosed by Schenck et al. in U.S. Pat. No. 4,646,024. However, this reference completely fails to disclose any concrete teaching concerning the practical formation of the desired etching pattern.

For example, the etching manufacturing method is known to have a limit to the thickness of a metal plate such as a copper plate to which this method is applicable, so that there is a problem concerning the greater heat generation due to the increased resistance of the coil to which this method is applicable, compared to the coil materials available to the conventionally available coil winding techniques, but such a practical problem associated with the employment of the etching manufacturing method has not been addresses at all in this reference.

In addition, in the etching manufacturing method, the width of the conductive portion of the metal plate required for each turn of the coil winding becomes quite wide, so that there arises the problem of the self eddy currents appearing within the wide conductive portion of the metal plate for each turn of the coil winding, which can degrade the image quality considerably, but this practical important problem associated with the employment of the etching manufacturing method has also not been addresses at all in this reference.

Moreover, the ASGC is also associated with the problem that the ideal number of coil turns for the outer shielding coils must be approximated by the integer number of coil turns realizable in practice, so that only incomplete shielding property can be realizable and there is a residual eddy current magnetic field. This residual eddy current magnetic field has a negative sign so that it weakens the actual gradient magnetic fields in a case of under-shielding, whereas it has a positive sign so that it strengthens the actual gradient magnetic fields in a case of over-shielding.

Furthermore, the ASGC is also associated with the problem that the shielding property provided by the outer shielding coil functions to reduce the strength of the gradient magnetic fields generated by the inner gradient coil, so that it becomes necessary for the inner gradient coil to increase the number of turns in order to generate the gradient magnetic fields of the same strength with the same amount of the supplied gradient coil currents. As a result, the inductance and the resistance of the inner gradient coil as well as the work and the cost for manufacturing the inner gradient coil must be increased.

Now, various imaging pulse sequences to be used in the nuclear magnetic resonance imaging are also associated with the problem concerning an optimum setting of various system parameters for each imaging pulse sequence, as follows.

For example, in the one shot ultra high speed MRI pulse sequence, the major technical problem encountered is how to realize the reading pulse sequence which requires a large amplitude and high speed switching. Conventionally, this problem is resolved by using a multi-filer gradient coil scheme in which each gradient coil is divided into a plurality of sections to be driven in parallel by a plurality of linear amplifiers called multi-filers, such that the effective inductance of each gradient coil can be reduced to the normal inductance divided by a number of the multi-filers, so that the switching time can be reduced considerably.

However, there has been no known scheme for optimizing the system parameters such as the number of the multi-filers to be used, the spatial resolution to be achieved, and the data acquisition time to be realized. Thus, there has been no known prescription for minimizing the data acquisition time for a given number of the multi-filers and a given spatial resolution requirement. Similarly, there has been no known prescription for minimizing the number of the multi-filers for a given spatial resolution requirement and a desired data acquisition time. Likewise, there has been no known prescription for maximizing the spatial resolution for a given number of the multi-filers and a desired data acquisition time.

As a consequence, there has been no known method for optimum setting of the gradient coil configuration conditions suitable for optimizing these system parameters.

In addition, when the gradient coil configuration conditions specifying the basic structure of the gradient coils and the number of the multi-filers are given, there has been no known prescription for optimizing the other system parameters within these given configuration conditions. Thus, there has been no known prescription for minimizing the data acquisition time with respect to the given spatial resolution requirement under the given configuration conditions. Similarly, there has been no known prescription for maximizing the spatial resolution with respect to the desired data acquisition time under the given configuration conditions.

As a consequence, there has been no known method for optimum setting of the gradient coil operation condition suitable for optimizing these system parameters under the given configuration conditions.

Similar problems also arise for the divisional scanning ultra high speed MRI pulse sequence in which the spatial frequency bandwidth is widened by carrying out the data aquisition by a plurality of divided scans, in order to achieve the high level resolution unattainable by the one shot ultra high speed MRI.

Namely, there has been no known scheme for optimizing the system parameters such as the number of the divided scans to be carried out, the number of the multi-filers to be used, the spatial resolution to be achieved, and the data acquisition time to be realized. Consequently, there has been no known prescription for minimizing the data acquisition time for a given number of the divided scans, a given number of the multi-filers, and a given spatial resolution requirement. Similarly, there has been no known prescription for minimizing the number of the multi-filers for a given number of the divided scans, a given spatial resolution requirement, and a desired data acquisition time. Likewise, there has been no known prescription for maximizing the spatial resolution for a given number of the divided scans, a given number of the multi-filers, and a desired data acquisition time. Also, there has been no known prescription for minimizing the number of the divided scans for a given number of the multi-filers, a given spatial resolution requirement, and a desired data acquisition time.

As a consequence, there has been no known method for optimum setting of the gradient coil configuration conditions suitable for optimizing these system parameters.

In addition, when the gradient coil configuration conditions specifying the basic structure of the gradient coils and the number of the multi-filers are given, there has been no known prescription for optimizing the other system parameters within these given configuration conditions. Thus there has been no known prescription for minimizing the data acquisition time with respect to the given number of the divided scans and the given spatial resolution requirement under the given configuration conditions. Similarly, there has been no known prescription for maximizing the spatial resolution with respect to the given number of the divided scans and the desired data acquisition time under the given configuration conditions. Likewise, there has been no known prescription for minimizing the number of the divided scans with respect to the given spatial resolution requirement and the desired data acquisition time under the given configuration conditions.

As a consequence, there has been no known method for optimum setting of the gradient coil operation condition suitable for optimizing these system parameters under the given configuration conditions.

As for the nuclear magnetic resonance angiography (referred also as MRA hereinbelow) pulse sequence, the major technical problem encountered is how to realize the reading pulse sequence which requires a large amplitude and high speed switching, Just as in the case of the one shot ultra high speed MRI. Consequently, the multi-filer gradient coil scheme described above is also effective in this case.

However, there has been no known scheme for optimizing the system parameters such as the number of the multi-filers to be used, the reading direction spatial resolution to be achieved, and the each time to be realized. Thus, there has been no known prescription for minimizing the echo time for a given number of the multi-filers and a given reading direction spatial resolution requirement. Similarly, there has been no known prescription for minimizing the number of the multi-filers for a given reading direction spatial resolution requirement and a desired echo time. Likewise, there has been no known prescription for maximizing the reading direction spatial resolution for a given number of the multi-filers and a desired echo time.

As a consequence, there has been no known method for optimum setting of the gradient coil configuration conditions suitable for optimizing these system parameters.

In addition, when the gradient coil configuration conditions specifying the basic structure of the gradient coils and the number of the multi-filers are given, there has been no known prescription for optimizing the other system parameters within these given configuration conditions. Thus, there has been no known prescription for minimizing the echo time with respect to the given reading direction spatial resolution requirement under the given configuration conditions. Similarly, there has been no known prescription for maximizing the reading direction spatial resolution with respect to the desired echo time under the given configuration conditions.

As a consequence, there has been no known method for optimum setting of the gradient coil operation condition suitable for optimizing these system parameters under the given configuration conditions.

Similar problems also arise for the phase encoding pulse sequence to be used in the ultra high speed MRI and the MRA pulse sequences. Here, the number of the encoding steps is one in the one shot ultra high speed MRI or MRA, but the greater number of the encoding steps is usually required for the divided scanning ultra high speed MRI or MRA as a greater amount of the encoding is required. But, as the number of the encoding steps increases, the encoding pulse width becomes wider, so that the influence of the widened encoding pulse becomes significant for the switching time in the reading pulse sequence.

Yet, there has been no known scheme for optimizing the system parameters such as the number of the multi-filers to be used, the amount of encoding permitted, and the encoding pulse width necessary. Thus, there has been no known prescription for minimizing the encoding pulse width for a given number of the multi-filers, and a given amount of encoding. Similarly, there has been no known prescription for minimizing the number of the multi-filers for a given amount of encoding and a given encoding pulse width. Likewise, there has been no known prescription for maximizing the amount of encoding for a given number of the multi-filers and a given encoding pulse width.

As a consequence, there has been no known method for optimum setting of the gradient coil configuration conditions suitable for optimizing these system parameters.

In addition, when the gradient coil configuration conditions specifying the basic structure of the gradient coils and the number of the multi-filers are given, there has been no known prescription for optimizing the other system parameters within these given configuration conditions. Thus, there has been no known prescription for minimizing the encoding pulse width with respect to the given amount of encoding under the given configuration conditions. Similarly, there has been no known prescription for maximizing the amount of encoding with respect to the given encoding pulse width under the given configuration conditions.

Thus, there has been no known prescription for optimum setting of various gradient coil configuration conditions and the gradient coil operation condition suitable for optimizing various system parameters for each imaging pulse sequence, so that the operation efficiency realizable in the conventional nuclear magnetic resonance imaging has not been an optimum one.

SUMMARY OF THE INVENTION

It is therefore an object of the present invention to provide an active shield gradient coil to be used in a nuclear magnetic resonance imaging and a method of its construction, capable of reducing the heat generation and the self eddy currents in an outer shielding coil, as well as the manufacturing steps and the manufacturing cost required for a realization of the satisfactory active shield gradient coil.

It is another object of the present invention to provide a method for eddy current compensation in a nuclear magnetic resonance imaging, capable of accounting for spatial distribution of the residual eddy current magnetic field.

It is another object of the present invention to provide a method for optimum setting of various system parameters for various imaging pulse sequences to be used in a nuclear magnetic resonance imaging.

It is another object of the present invention to provide a method for optimum setting of various system parameters for various imaging pulse sequences under the given gradient coil configuration to be used in a nuclear magnetic resonance imaging.

According to one aspect of the present invention there is provided an active shield gradient coil to be used in a nuclear magnetic resonance imaging, comprising: inner primary coil means for generating a desired gradient magnetic field within a desired imaging space; and outer shielding coil means, provided in a vicinity of the inner primary coil means, for shielding the gradient magnetic field generated by the inner primary coil means outside of the imaging space; wherein at least one of the inner primary coil means and the outer shielding coil means having at least two coil turns which are provided on a plurality of separate layers and mutually connected electrically.

According to another aspect of the present invention there is provided a method for constructing an active shield gradient coil to be used in a nuclear magnetic resonance imaging, comprising the steps of: manufacturing inner primary coil means for generating a desired gradient magnetic field within a desired imaging space and outer shielding coil means for shielding the gradient magnetic field generated by the inner primary coil means outside of the imaging space from a plurality of coil turns, wherein at least one of the inner primary coil means and the outer shielding coil means has at least two coil turns which are provided on a plurality of separate layers and mutually connected electrically; and assembling the inner primary coil means and the outer shielding coil means to form the active shield gradient coil.

It is preferable to manufacture each of the coil turns from a conductive body by using a mechanical pattern forming manufacturing method, such as an etching manufacturing method, in which each of unnecessary portions of the conductive body can be removed in a minimum size removable in the manufacturing method, so as to form a remaining portion of the conductive body in a desired shape of each of the coil turns.

According to another aspect of the present invention there is provided an active shield gradient coil to be used in a nuclear magnetic resonance imaging, comprising: inner primary coil means for generating a desired gradient magnetic field within a desired imaging space; and outer shielding coil means, provided in a vicinity of the inner primary coil means, for shielding the gradient magnetic field generated by the inner primary coil means outside of the imaging space; wherein the inner primary coil means and the outer shielding coil means are formed by coil turns, each of which is made of a conductive body, and the conductive body of at least one of the coil turns has a slit portion formed thereon in which a part of the conductive body is removed.

According to another aspect of the present invention there is provided a method for eddy current compensation on a gradient coil in a nuclear magnetic resonance imaging, comprising the steps of: measuring a spatial distribution and a time response of a gradient magnetic field and an eddy current magnetic field; determining an eddy current compensation point and an eddy current compensation pulse for compensating a residual eddy current magnetic field within a desired field of view such that a general expression of the residual eddy current magnetic field after the eddy current compensation obtained from the spatial distribution and the time response of the gradient magnetic field and the eddy current magnetic field measured at the measuring step becomes minimum; and inputting the eddy current compensation pulse determined at the determining step to the gradient coil.

According to another aspect of the present invention there is provided a method for optimum setting of various system parameters for various imaging pulse sequences to be used in a nuclear magnetic resonance imaging, comprising the step of: optimizing any one of the system parameters including: a number of multi-filers for driving gradient coils, a data acquisition time, a spatial resolution requirement in a reading direction, a spatial resolution requirement in an encoding direction, a number of divided scans in a reading direction, a number of divided scans in an encoding direction, an echo time, a number of encoding steps, and an encoding pulse width, such that the equation (224) described below is satisfied by these system parameters.

According to another aspect of the present invention there is provided a method for optimum setting of various system parameters for various imaging pulse sequences under a given gradient coil configuration to be used in a nuclear magnetic resonance imaging, comprising the step of: optimizing any one of the system parameters including: a data acquisition time, a spatial resolution requirement in a reading direction, a spatial resolution requirement in an encoding direction, a number of divided scans in a reading direction, a number of divided scans in an encoding direction, an echo time, a number of encoding steps, and an encoding pulse width, such that the equation (225) to be described below is satisfied by these system parameters.

Other features and advantages of the present invention will become apparent from the following description taken in conjunction with the accompanying drawings.

DETAILED DESCRIPTION OF THE PREFERRED EMBODIMENTS

CONFIGURATION OF MRI APPARATUS

Figure 1:
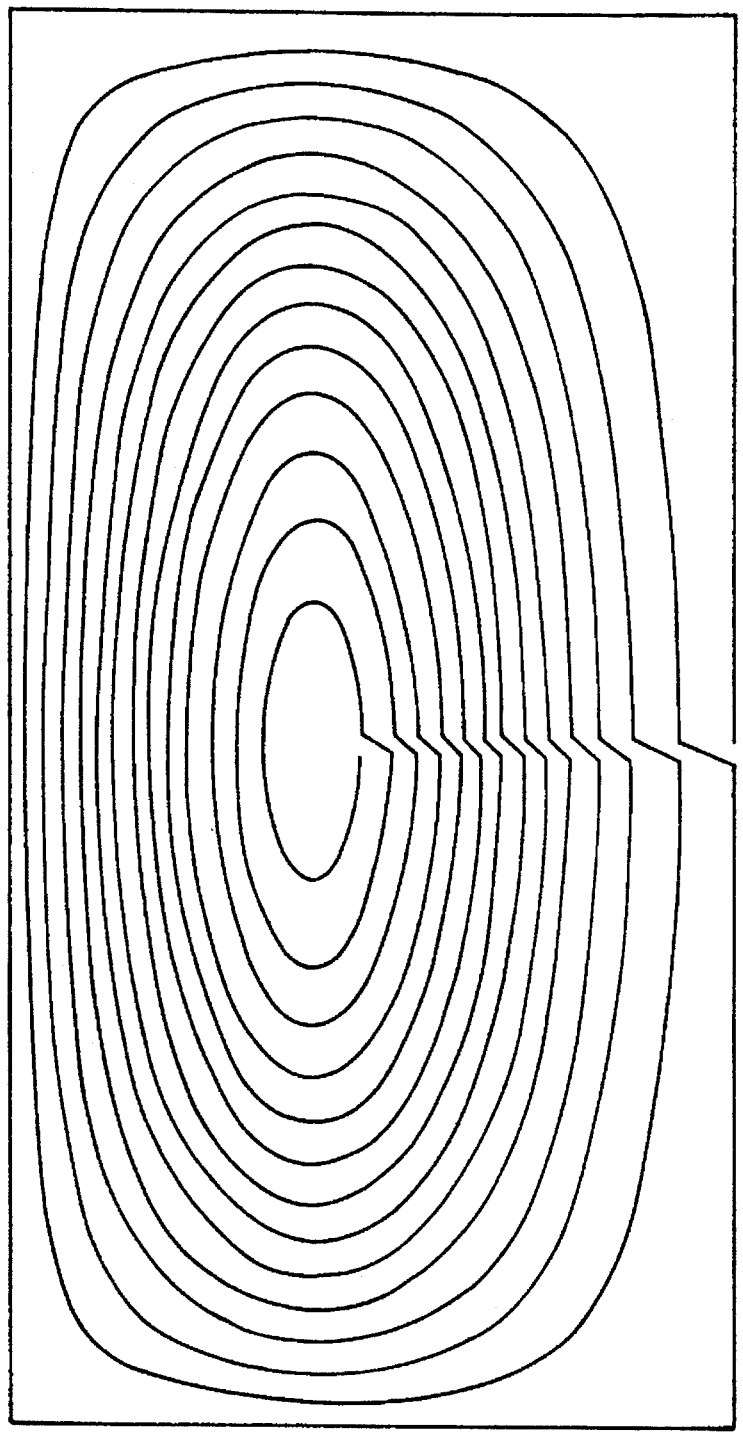
FIG. 1 is an illustration of a conventionally known exemplary coil configuration for the outer shielding coil of the active shield gradient coil (ASGC) to be used in a nuclear magnetic resonance imaging.
Figure 2:
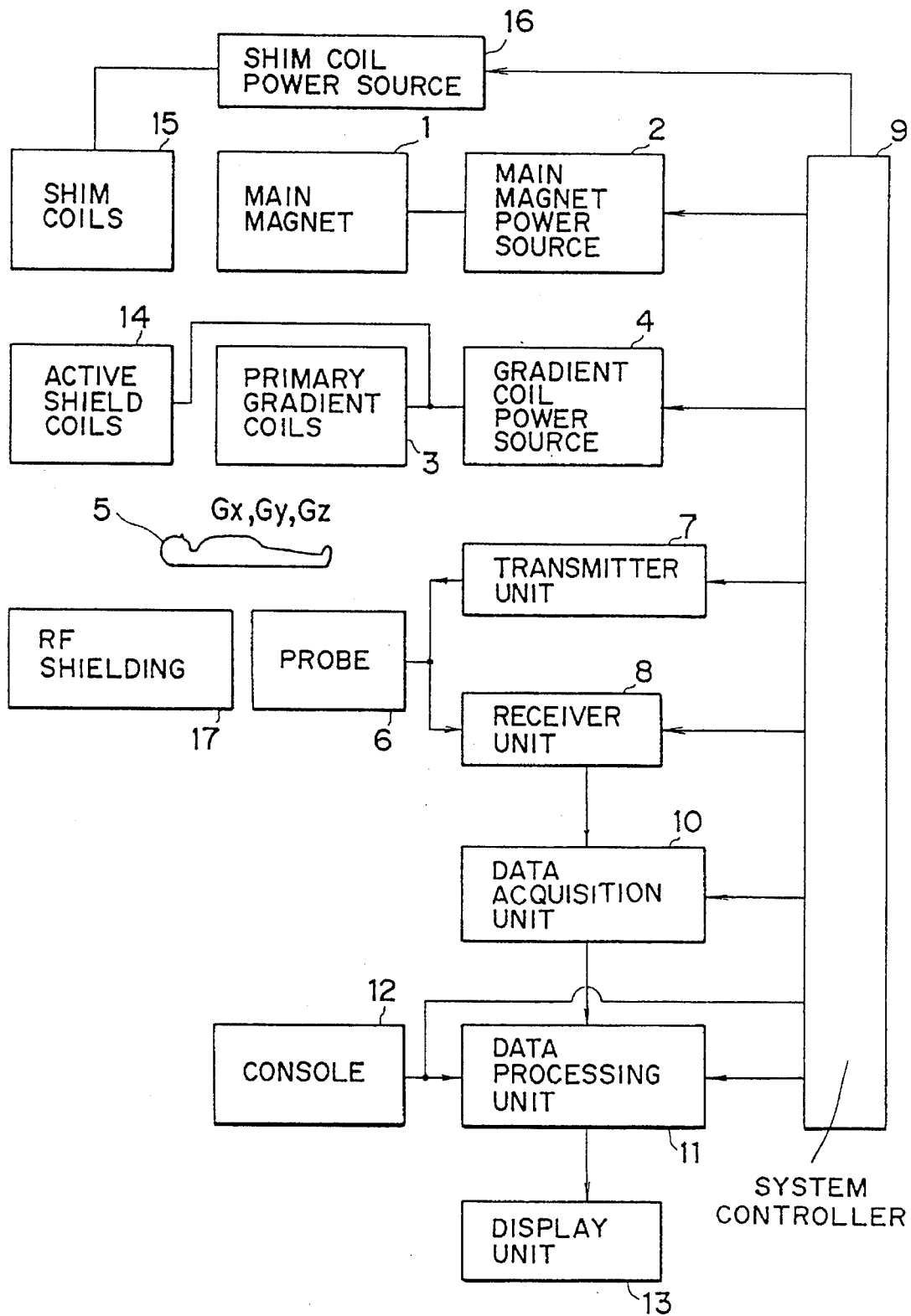
FIG. 2 is a schematic block diagram of one embodiment of a nuclear magnetic resonance imaging (MRI) apparatus according to the present invention.

Referring now to FIG. 2, one embodiment of a nuclear magnetic resonance imaging (MRI) apparatus according to the present invention will be described in detail.

In the configuration shown in FIG. 2, the apparatus comprises: a main magnet 1 for generating a static magnetic field; a main magnet power source 2 for driving the main magnet 1; an active shield gradient coil (ASGC) formed by primary gradient coils 3 for generating gradient magnetic fields, and active shield coils 14 surrounding the primary gradient coils 3; a gradient coil power source 4 for driving the primary gradient coils 3 and the active shield coils 14; shim coils 15 for adjusting the homogeneity of the static magnetic field; shim coil power source 16 for driving the shim coils 15; a probe 6 for applying radio frequency (RF) pulses to the patient 5 and receiving nuclear magnetic resonance (NMR) signals from the patient 5; a RF shielding 17 provided between the primary gradient coils 3 and the probe 6; a transmitter unit 7 for driving the probe 6 to transmit the desired RF pulses; a receiver unit 8 for detecting the NMR signals received by the probe 6; a data acquisition unit 10 for collecting and A/D converting the NMR signals detected by the receiver unit 8; a data processing unit 11 for data processing the A/D converted NMR signals to reconstruct the desired NMR image; a display unit 13 for displaying the NMR image reconstructed by the data processing unit 11; a system controller 9 for controlling the operations of the main magnet power source 2, the gradient coil power source 4, the transmitter unit 7, the receiver unit 8, the data acquisition unit 10, and the data processing unit 11; and a console 12 from which an operator enters various control commands to the system controller 9 and the data processing unit 11.

Here, the gradient coil power source may employ the multi-filer gradient coil scheme, and the primary gradient coils 3 and the active shield coils 14 may be driven independently from each other. Also, the probe 6 may be either one of an integrated transceiver type or separate transmitter and receiver type.

In this apparatus of FIG. 2, the patient 5 is placed inside the static magnetic field generated by the main magnet 1, and three orthogonal gradient magnetic fields generated by the primary gradient coils 3 are superposed onto the static magnetic field while the RF pulses are applied by the probe 6, according to the desired imaging pulse sequence. Then, the NMR signals emitted from the patient 5 in response to the application of the RF pulses are received by the probe 6, according to which the data processing unit 11 reconstructs the desired NMR images by using appropriate data processing operations such as the Fourier transformation.

CONSTRUCTION OF ACTIVE SHIELD GRADIENT COIL

Referring now to FIG. 3 to FIG. 17, the various embodiments of a method for constructing any one of the primary gradient coils and the active shield coils in the ASGC directed toward the reduction of the heat generation in the ASGC, as well as the manufacturing steps and the manufacturing cost, will be described in detail. Here, for the sake of comparison, the examples of conventional methods for constructing the active shield coils in the ASGC will also be described in some detail.

It is to be noted that the embodiments will be described below for a case of constructing the active shield coil as an illustrative example, although the method according to the present invention to be described below is equally applicable to a case of constructing the primary gradient coil as well. It is further to be noted that, in practice, the method according to the present invention to be described below may be applied to either a part or a whole of either one or both of the primary gradient coils and the active shield coils, according to the practical need.

Figure 5:
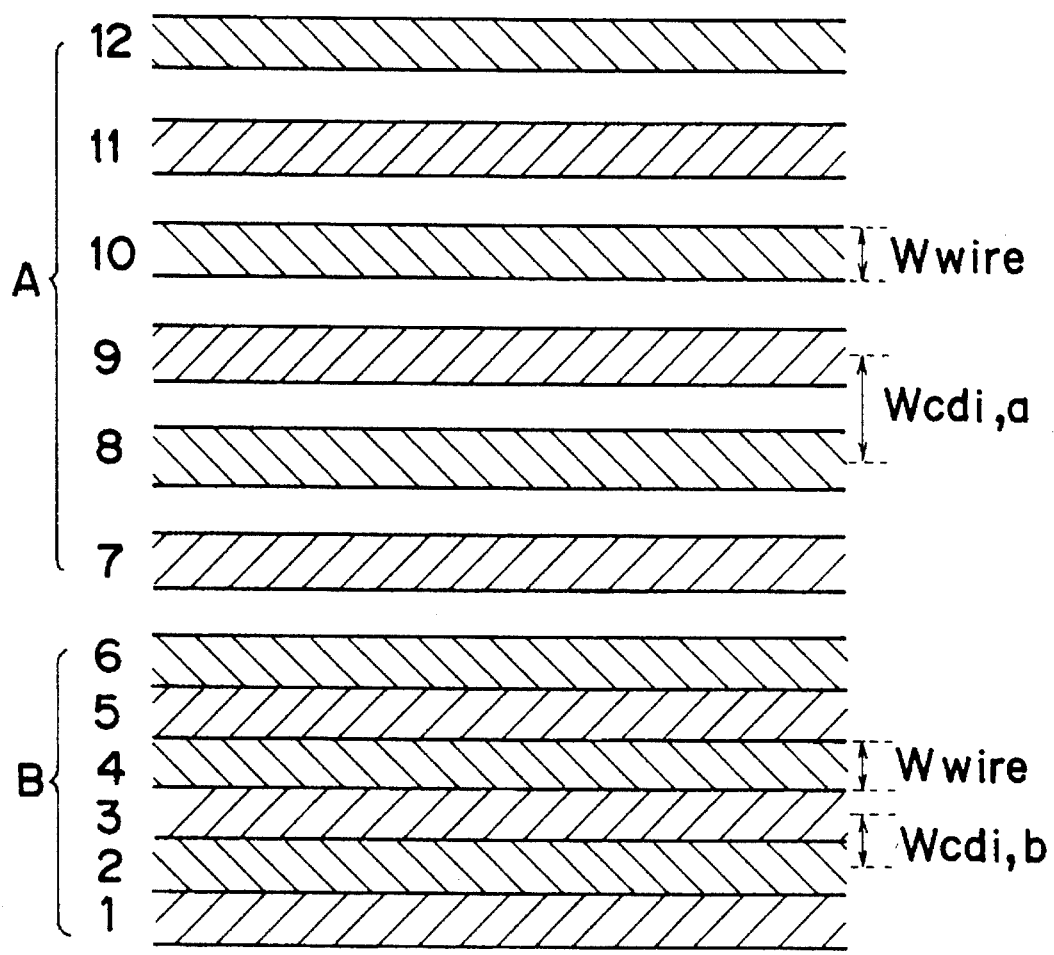
Fig. 5 is an enlarged view of sections of coil turns in an active shield coil to be constructed in the zeroth method, indicating a local coil arrangement pattern.
Figure 6:
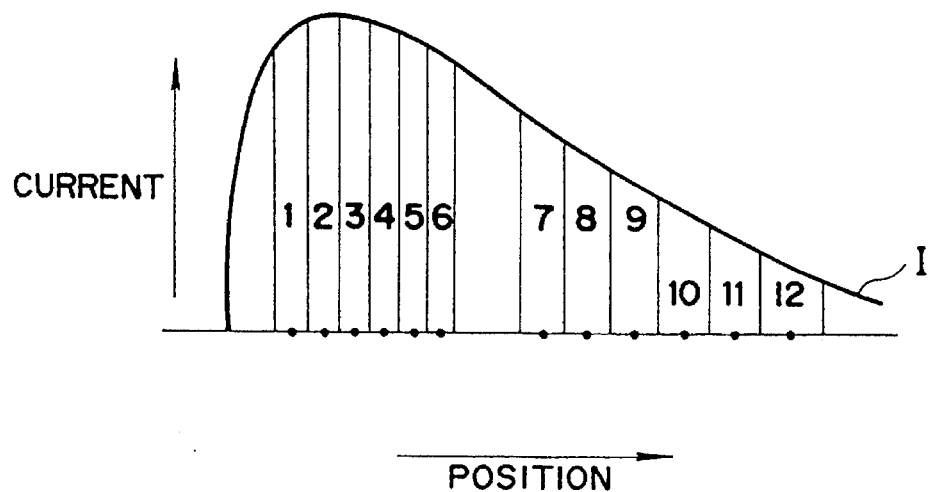
FIG. 6 is a diagram representing a desired continuous current distribution to be realized and assignment of coil turns in a second conventional method for constructing active shield coils referred to as the first method.
Figure 7:
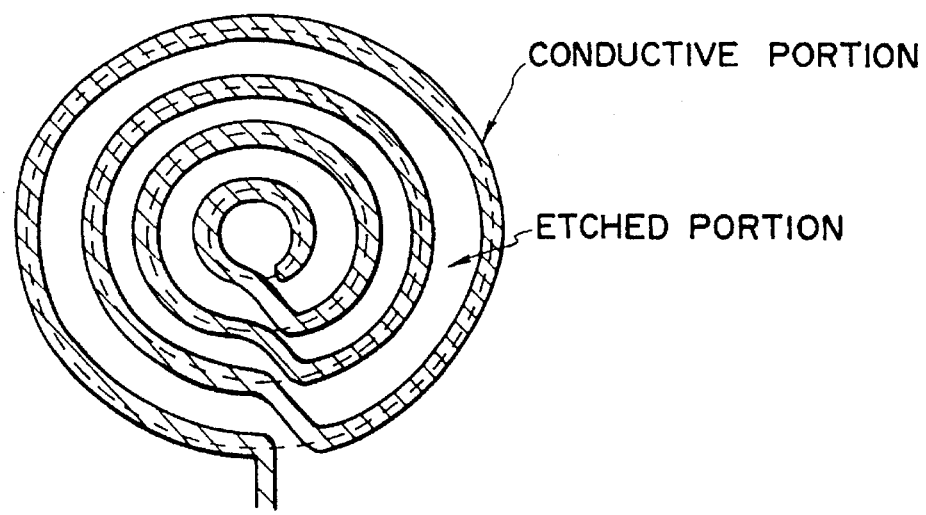
FIG. 7 is a schematic plan view of an active shield coil to be constructed in the first method, indicating an overall coil winding pattern.
Figure 8:
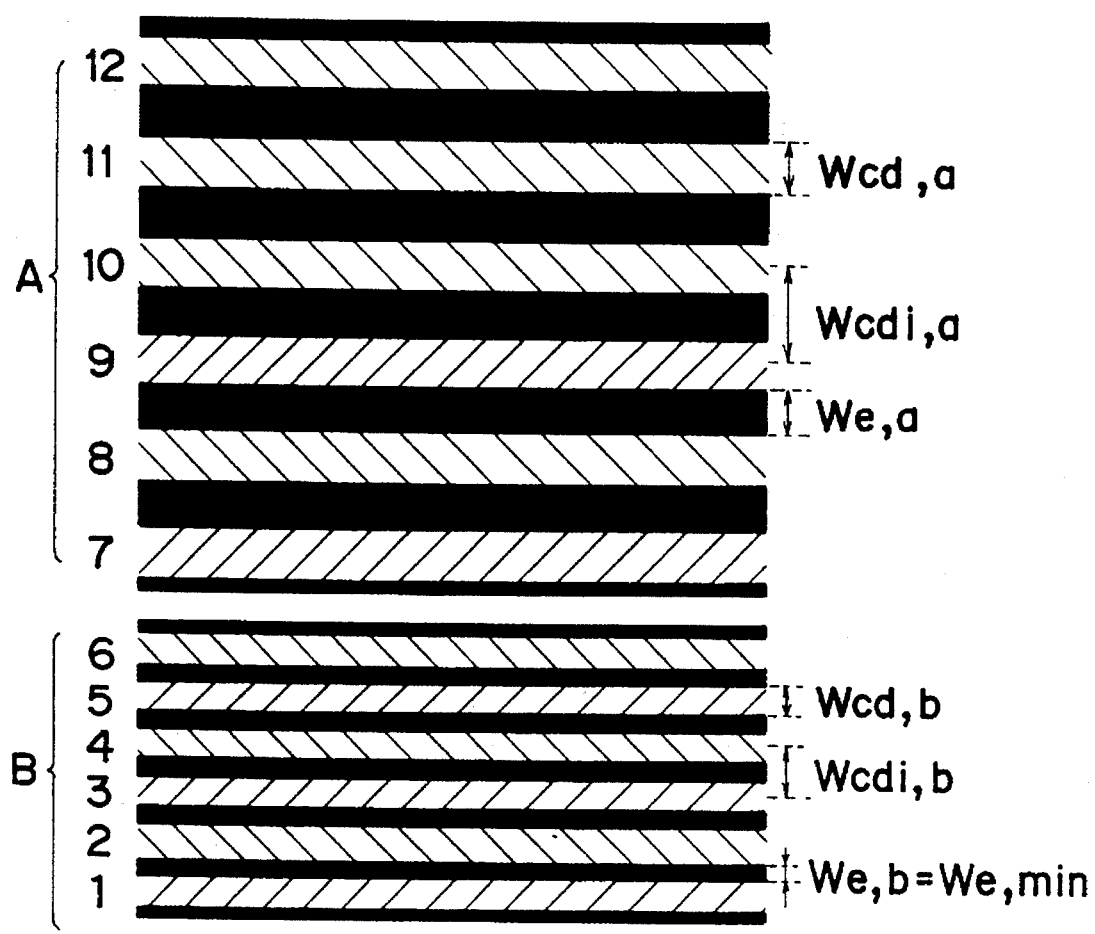
FIG. 8 is an enlarged view of sections of coil turns in an active shield coil to be constructed in the first method, indicating a local coil arrangement pattern.
Figure 9:
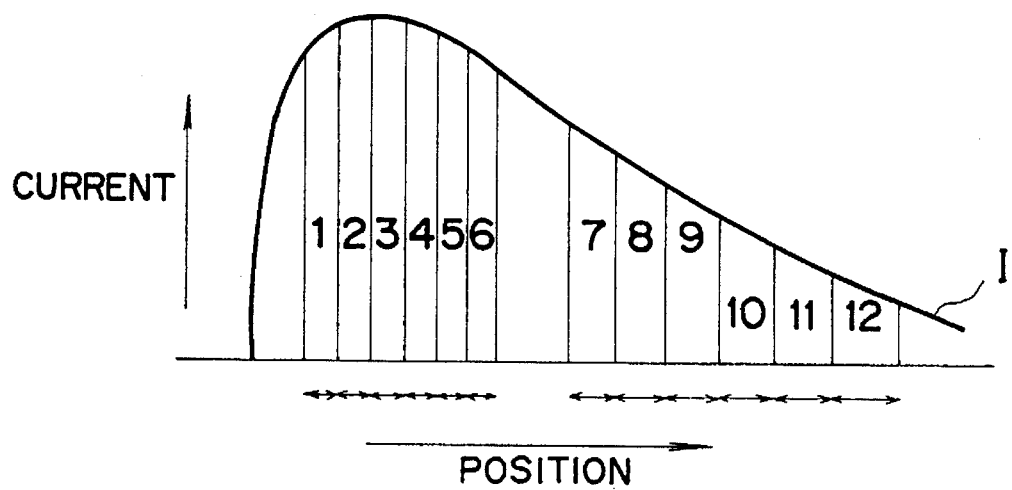
FIG. 9 is a diagram representing a desired continuous current distribution to be realized and assignment of coil turns in a modified conventional method for constructing active shield coils referred to as the second method.
Figure 10:
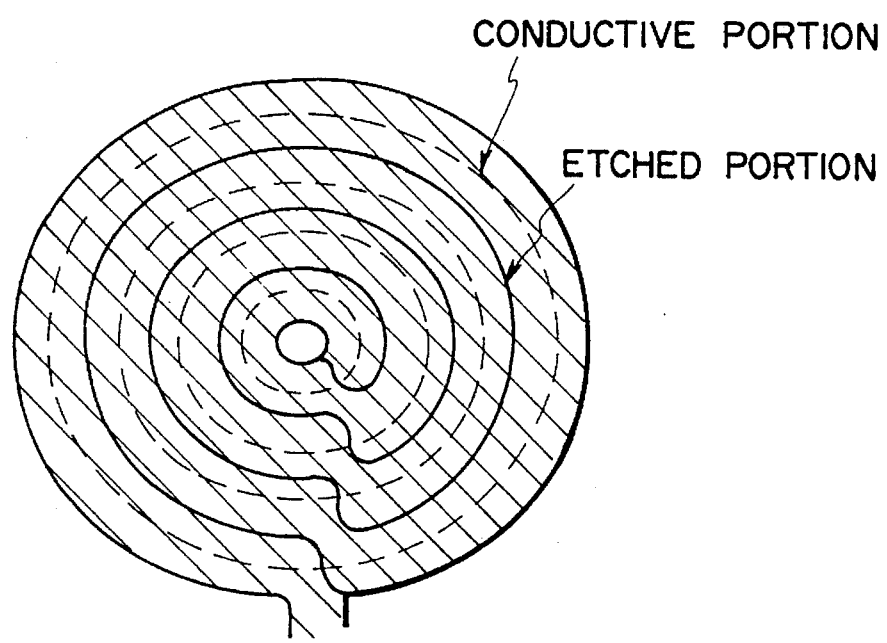
FIG. 10 is a schematic plan view of an active shield coil to be constructed in the second method, indicating an overall coil winding pattern.
Figure 11:
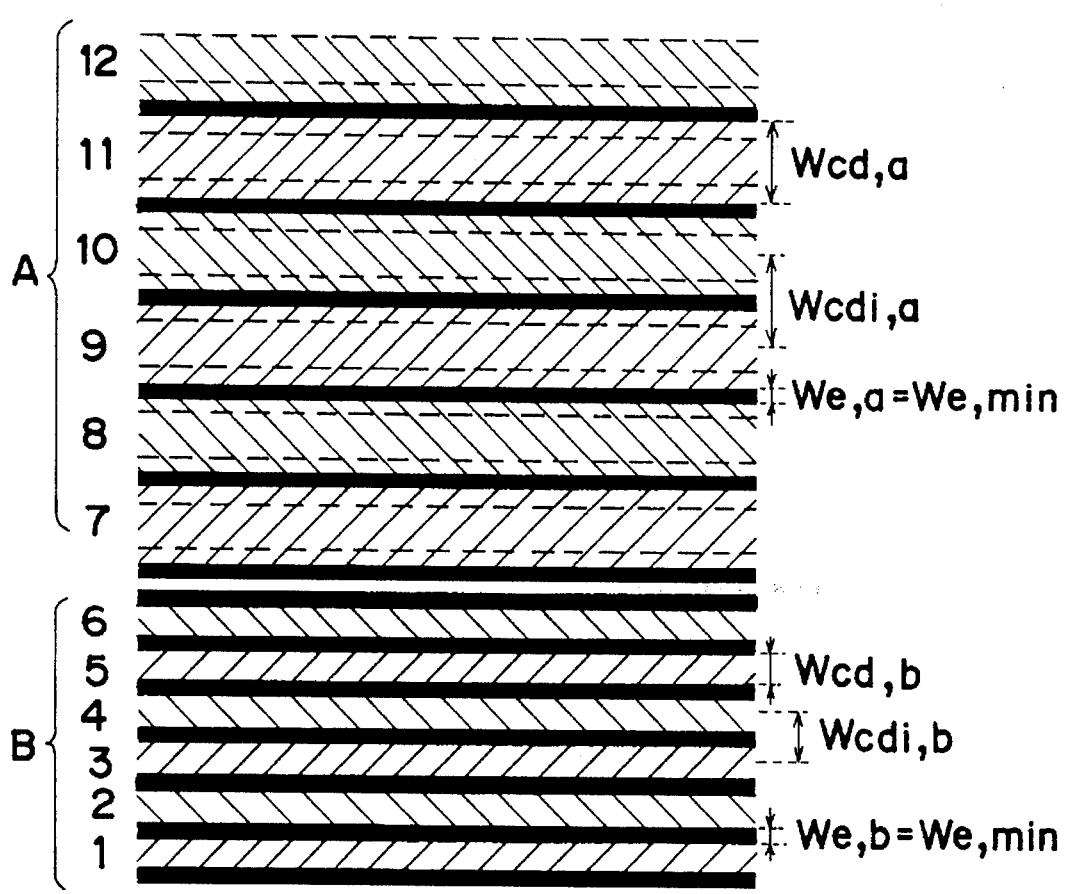
FIG. 11 is an enlarged view of sections of coil turns in an active shield coil to be constructed in the second method, indicating a local coil arrangement pattern.
Figure 12:
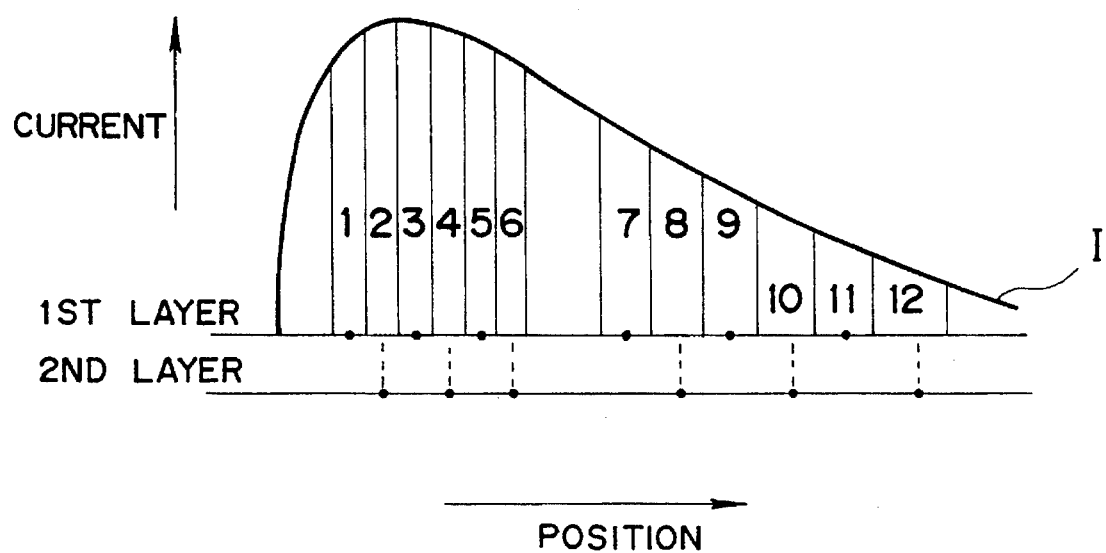
FIG. 12 is a diagram representing a desired continuous current distribution to be realized and assignment of coil turns in a basic method for constructing active shield coils according to the present invention, referred to as the third method.
Figure 13:
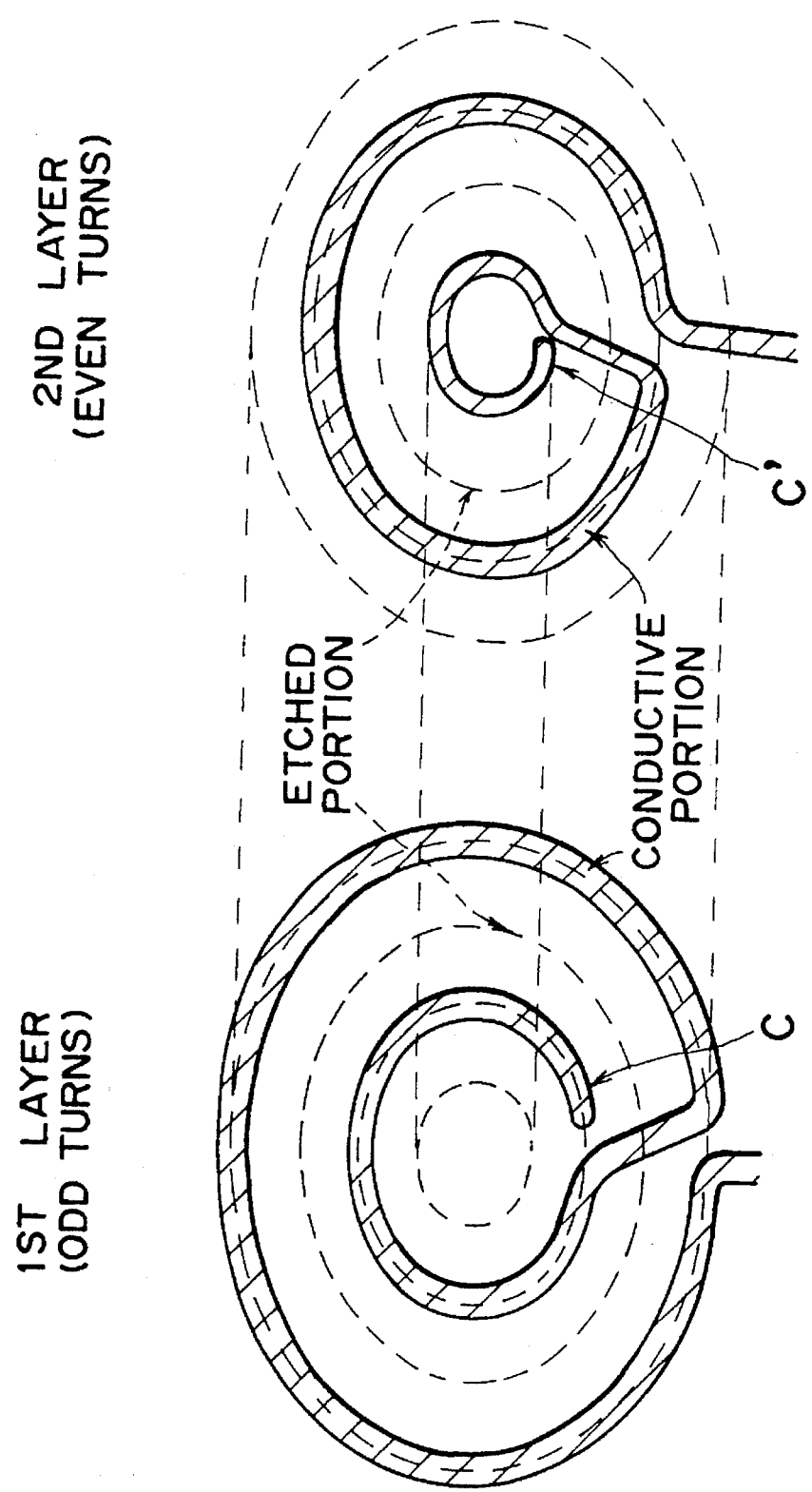
FIG. 13 is a schematic plan view of an active shield coil to be constructed in the third method, indicating an overall coil winding pattern.
Figure 14:
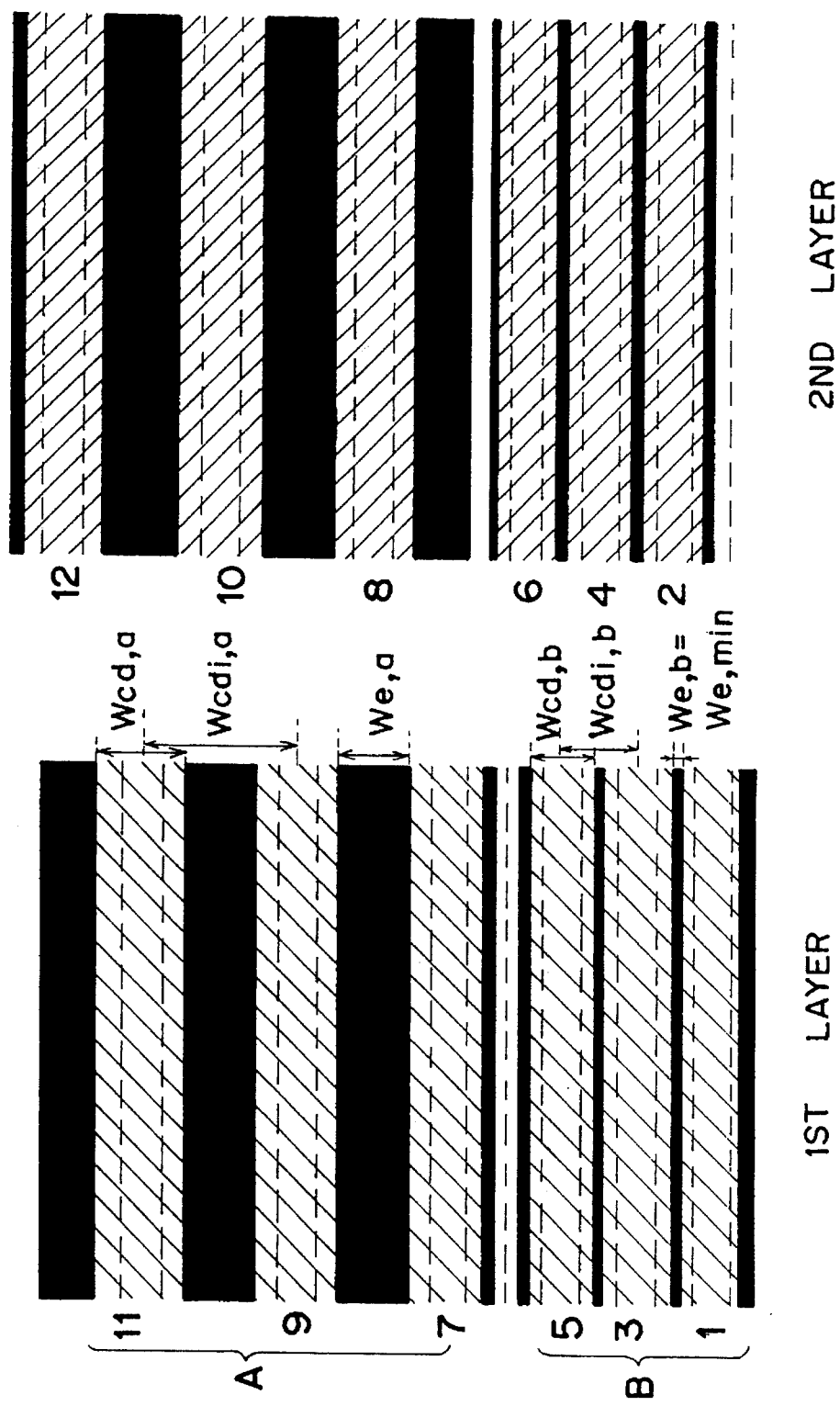
FIG. 14 is an enlarged view of sections of coil turns in an active shield coil to be constructed in the third method, indicating a local coil arrangement pattern.
Figure 15:
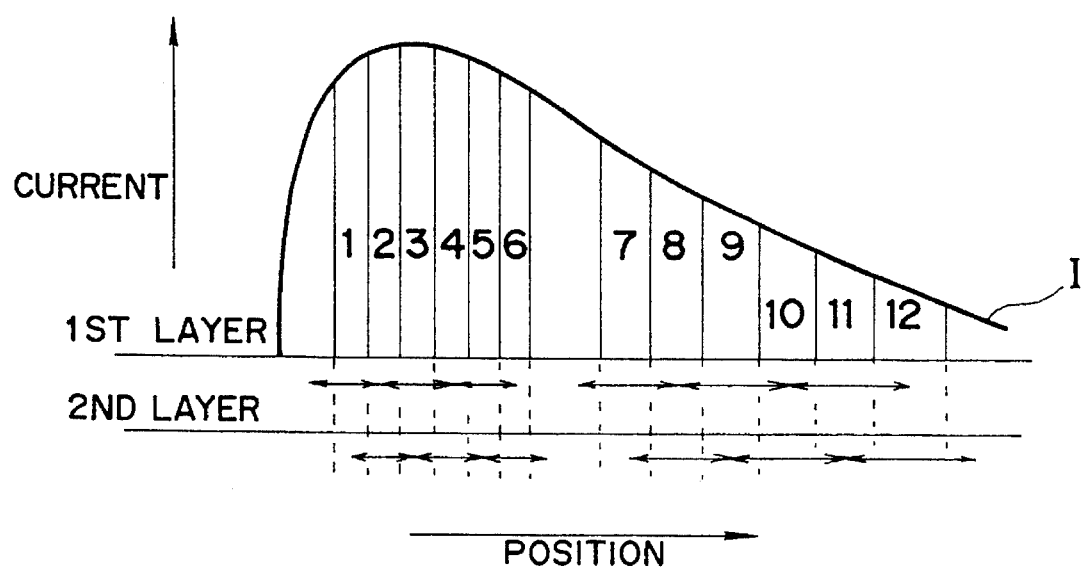
FIG. 15 is a diagram representing a desired continuous current distribution to be realized and assignment of coil turns in a modified method for constructing active shield coils according to the present invention, referred to as the fourth method.
Figure 16:
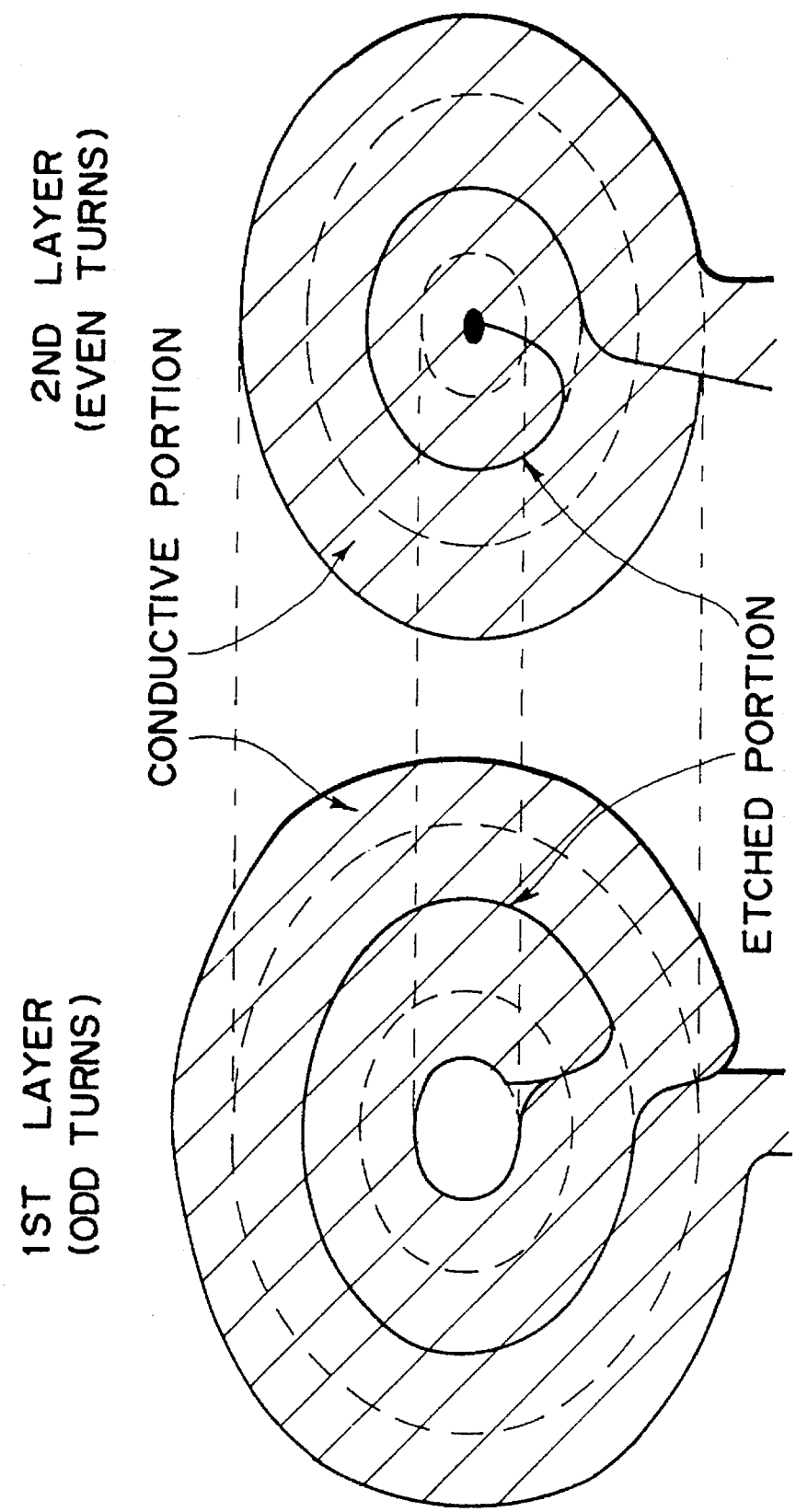
FIG. 16 is a schematic plan view of an active shield coil to be constructed in the fourth method, indicating an overall coil winding pattern.
Figure 17:
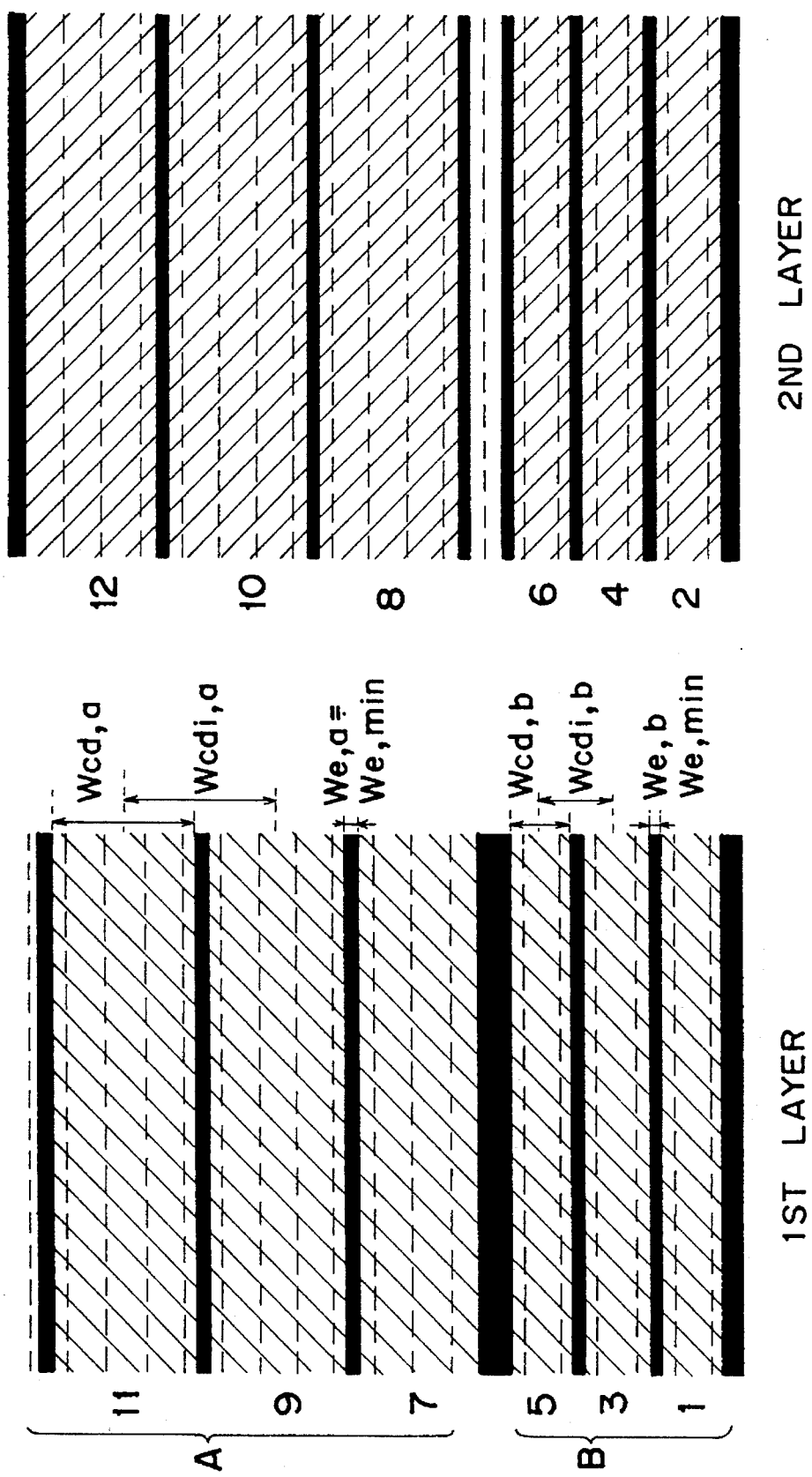
FIG. 17 is an enlarged view of sections of coil turns in an active shield coil to be constructed in the fourth method, indicating a local coil arrangement pattern.

Among these FIG. 3 to FIG. 17, FIG. 3 to FIG. 5 relate to the first conventional method using coil wire winding method, FIG. 6 to FIG. 8 relate to the second conventional method using etching manufacturing method, FIG. 9 to FIG. 11 relate to a modification of the second conventional method using etching manufacturing method, FIG. 12 to FIG. 14 relate to a basic method according to the present invention, and FIG. 15 to FIG. 17 relate to a modified method according to the present invention.

Each of FIGS. 3, 6, 9, 12, and 15 shows a diagram representing a desired continuous current distribution to be realized by each active shield coil (curve I) and assignment of coil turns (black dots in FIGS. 3, 6, and 12, line segments with arrowheads in FIGS. 9 and 15) to positions within the active shield coil in order for the discrete currents flowing through the coil turns to approximate the desired continuous current distribution. In these figures, each of the blocks 1 to 12 covers the same area under the curve I, so that the interval between the center positions of the neighboring blocks is irregular. The blocks 1 to 6 have the coil turns arranged densely, while the blocks 7 to 12 have the coil turns arranged coarsely.

Each of FIGS. 4, 7, 10, 13, and 16 shows a schematic plan view of each active shield coil to be constructed. These FIGS. 4, 7, 10, 13, and 16 are provided to indicate an overall coil winding pattern in each active shield coil to be constructed, so that only four coil turns are depicted in each of these figures for the sake of simplicity, although there are actually twelve of the similarly wound coil turns when each active shield coil is constructed according to the assignment shown in FIGS. 3, 6, 9, 12, and 15.

Each of FIGS. 5, 8.11, 14, and 17 shows an enlarged view of sections of the twelve coil turns in each active shield coil arranged according to the assignment shown in FIGS. 3, 6, 9, 12, and 15, where the coil turns labelled 1 to 12 correspond to the coil turns assigned to the blocks 1 to 12 in FIGS. 3, 6, 9, 12, and 15, respectively. These FIGS. 5, 8, 11, 14, and 17 are provided to indicate a local coil arrangement pattern in each active shield coil, so that the interval between the neighboring coil turns among the coil turns 1 to 6 is depicted as identical, and the interval between the neighboring coil turns among the coil turns 7 to 12 is depicted as identical and twice as wide as the interval among the coil turns 1 to 6, for the sake of simplicity, although the interval between the neighboring coil turns is actually irregular when each active shield coil is constructed according to the assignment shown in FIGS. 3, 6, 9, 12, and 15.

In FIGS. 5, 8, 11, 14, and 17, the region A indicates a coarse region corresponding to the blocks 7 to 12 in which the coil turns are arranged with a wider interval, while the region B indicates a dense region corresponding to the blocks 1 to 6 in which the coil turns are arranged with a narrower interval.

Also, in the following descriptions of these various embodiments, the following notations will be used, some of which are also indicated in FIGS. 5, 8, 11, 14, and 17. Here, an entity having a suffix ",a" relates to the region A, while an entity having a suffix ",b" relates to the region B.

Wwire: Width of a coil wire including wire coating

Wcd,a (Wcd,b): Width of a conductive portion tcd: Thickness of a conductive portion $\lambda$: Packing factor=Ratio of a total volume of conductive portions with respect to total volume of coil wires n1: Number of layers Wcdi,a (Wcdi,b): Interval between center positions of neighboring conductive portions We,a (We,b): Width of an etching groove We,min: Minimum width of an etching groove $\alpha$: Proportional factor of We,min with respect to tcd in the relationship of the following equation (1)

$$We,min = \alpha \cdot tcd \quad (1)$$

Rn,a (Rn,b): Local resistance in n-th method

Figure 3:
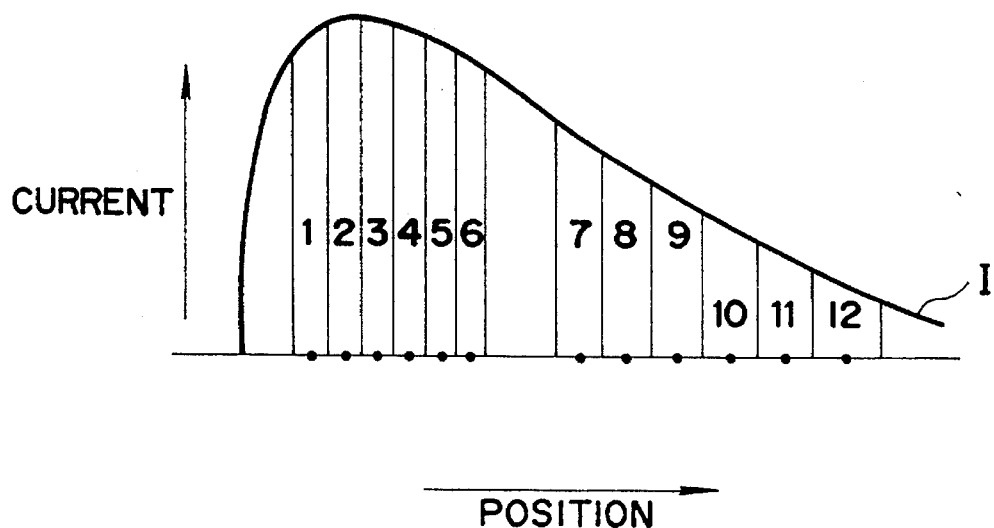
FIG. 3 is a diagram representing a desired continuous current distribution to be realized and assignment of coil turns in a first conventional method for constructing active shield coils referred to as the zeroth method.
Figure 4:
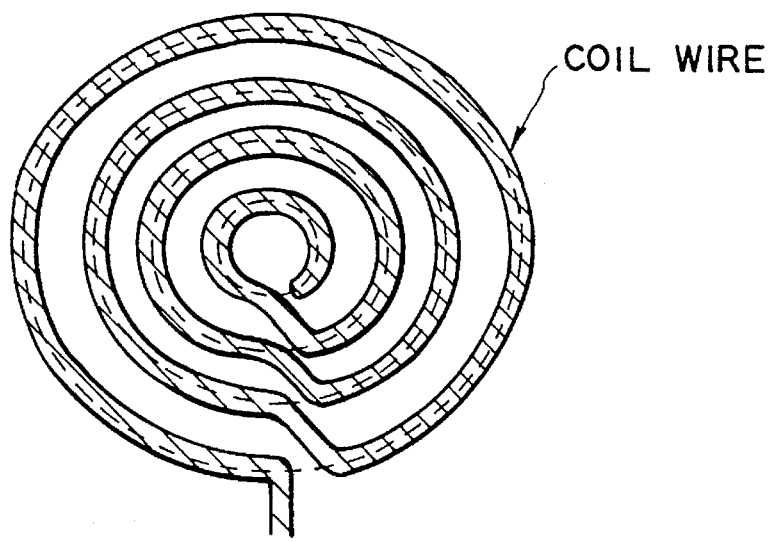
Fig. 4 is a schematic plan view of an active shield coil to be constructed in the zeroth method, indicating an overall coil winding pattern.

Here, the first conventional method of FIGS. 3 to 5 will be referred to as the zeroth method, the second conventional method of FIGS. 6 to 8 will be referred to as the first method, the modified method of FIGS. 9 to 11 will be referred to as the second method, the basic method of FIGS. 12 to 14 will be referred to as the third method, and the modified method of FIGS. 15 to 17 will be referred to as the fourth method, in accordance with the order in which they will be described below.

First, referring to FIG. 3 to FIG. 5, the first conventional method using the coil wire winding to be referred to as the zeroth method will be described.

In this zeroth method, the coil turns are assigned to the center positions (centers of mass) of the blocks, so as to approximate the desired continuous current distribution by the discrete currents flowing through the discrete lines, as indicated in FIG. 3. Here, the conductive portion in the coil winding pattern as shown in FIG. 4 is obtained by winding the coil wire according to this coil winding pattern of FIG. 4, so that the coil turns have the local coil arrangement pattern as shown in FIG. 5.

In this case, the intervals between the neighboring conductive portions Wcdi,a and Wcdi,b in the regions A and B and the widths of the conductive portions Wcd,a and Wcd,b in the regions A and B can be expressed by the following equations (2) to (5), respectively.

$$Wcdi,a = 2 \cdot Wwire \quad (2)$$

$$Wcdi,b = Wwire \quad (3)$$

$$Wcd,a = \lambda \cdot Wwire \quad (4)$$

$$Wcd,b = \lambda \cdot Wwire \quad (5)$$

Consequently, since the resistance is inversely proportional to the width of the conductive portion in general, the local resistance R0,a and R0,b in the regions A and B in this zeroth method can be expressed by the following equations (6) and (7).

$$R0,a \propto 1/(\lambda \cdot Wwire) \quad (6)$$

$$R0,b = R0,a \quad (7)$$

Next, referring to FIG. 6 to FIG. 8, the second conventional method using the etching manufacturing method to be referred to as the first method will be described.

In this first method, the coil turns are assigned to the center positions (centers of mass) of the blocks, just as in a case of the zeroth method described above, so as to approximate the desired continuous current distribution by the discrete currents flowing through the discrete lines, as indicated in FIG. 6. Here, the conductive portion in the coil winding pattern as shown in FIG. 7 is obtained by etching off the etched portion according to this coil winding pattern of FIG. 7, so that the coil turns have the local coil arrangement pattern as shown in FIG. 8, where the conductive portion is indicated by the shaded regions while the etched portion is indicated by the black regions.

In this case, the intervals between the neighboring conductive portions $Wcdi,a$ and $Wcdi,b$ in the regions A and B and the widths of the conductive portions $Wcd,a$ and $Wcd,b$ in the regions A and B can be expressed by the following equations (8) to (11), respectively.

$$Wcdi,a = 2 \cdot Wwire \tag{8}$$

$$Wcdi,b = Wwire \tag{9}$$

$$Wcd,a = Wwire \tag{10}$$

$$Wcd,b = Wwire - We,min \tag{11}$$

As can be seen from the equation (11), the width of the conductive portion in the region B becomes narrower than the width of the coil wire $Wwire$ by the amount of the minimum width of an etching groove $We,min$. Consequently, the local resistance $R1,a$ and $R1,b$ in the regions A and B in this first method can be expressed by the following equations (12) and (13), respectively.

$$R1,a \propto 1/Wwire \tag{12}$$

$$R1,b \propto 1/(Wwire - We,min) \tag{13}$$

Then, the ratio of the local resistances $R1,a$ and $R1,b$ in this first method with respect to the local resistances $R0,a$ and $R0,b$ in the zeroth method described above can be expressed by the following equations (14) and (15), respectively.

$$R1,a/R0,a = \lambda \tag{14}$$

$$\begin{aligned} R1,b/R0,b &= (\lambda \cdot Wwire)/(Wwire - We,min) \\ &= \lambda/(1 - We,min/Wwire) \end{aligned} \tag{15}$$

As can be seen from the equation (14), the local resistance in the region A becomes smaller in this first method by the factor of tile packing factor $\lambda$ compared with the zeroth method.

On the other hand, according to the equation (15), the local resistance in the region B becomes smaller in this first method by the factor of the packing factor $\lambda$ compared with the zeroth method, only when $We,min$ is substantially smaller than $Wwire$. In fact, when $We,min$ is comparable to or even larger than $Wwire$, the local resistance in the region B becomes larger in this first method compared with the zeroth method.

In practice, there are cases in which $We,min$ is required to be comparable to $Wwire$ in some ASGCs, especially in the dense region such as the region B, so that this first method can be associated with the problem of the excessive local heat generation in the dense region.

Next, referring to FIG. 9 to FIG. 11, the modification of the second conventional method using the etching manufacturing method to be referred to as the second method will be described.

In this second method, the width of an etching groove between any neighboring conductive portions is set to be the minimum width of an etching groove $We,min$, such that the coil turns that can effectively be regarded as planes substantially filling the coil cross section are assigned to the blocks, so as to approximate the desired continuous current distribution by the discrete currents flowing through the discrete planes, as indicated in FIG. 9. Here, the conductive portion in the coil winding pattern as shown in FIG. 10 is obtained by etching off the etched portion of the minimum width according to this coil winding pattern of FIG. 10, so that the coil turns have the local coil arrangement pattern as shown in FIG. 11, where the conductive portion is indicated by the shaded regions while the etched portion is indicated by the black regions, and dashed lines on the conductive portion in the region A indicate the width of the conductive portion used in the First method described above which is equal to $Wwire$.

In this case, the intervals between the neighboring conductive portions $Wcdi,a$ and $Wcdi,b$ in the regions A and B and the widths of the conductive portions $Wcd,a$ and $Wcd,b$ in the regions A and B can be expressed by the following equations (16) to (19), respectively.

$$Wcdi,a = 2 \cdot Wwire \tag{16}$$

$$Wcdi,b = Wwire \tag{17}$$

$$Wcd,a = 2 \cdot Wwire - We,min \tag{18}$$

$$Wcd,b = Wwire - We,min \tag{19}$$

Consequently, the local resistance $R1,a$ and $R1,b$ in the regions A and B in this first method can be expressed by the following equations (20) and (21), respectively.

$$R2,a \propto 1/(2 \cdot Wwire - We,min) \tag{20}$$

$$R2,b \propto 1/(Wwire - We,min) \tag{21}$$

Then, the ratio of the local resistances $R2,a$ and $R2,b$ in this second method with respect to the local resistances $R1,a$ and $R1,b$ in the first method described above can be expressed by the following equations (22) and (23), respectively.

$$\begin{aligned} R2,a/R1,a &= Wwire/(2 \cdot Wwire - We,min) \\ &= 1/(2 - We,min/Wwire) \end{aligned} \tag{22}$$

$$R2,b/R1,b = 1 \tag{23}$$

As can be seen from the equation (22), the local resistance in the region A becomes smaller in this second method by the factor of nearly one half compared with the first method, when $We,min$ is substantially smaller than $Wwire$. In general, when the interval between the neighboring conductive portions is $k \cdot Wwire$, where $k$ is an integer, the local resistance in the region A becomes smaller in this second method by the factor of nearly one k-th compared with the first method, provided that $We,min$ is substantially smaller than $Wwire$, so that the even Further reduction of the local resistance in the region A than that indicated by the equation (22) is also possible.

On the other hand, according to the equation (23), the local resistance in the region B in this second method is the same as that in the first method.

Thus, in this second method, it becomes possible to achieve the reduction of the overall resistance of the entire coil as much as the local resistance in the coarse region can be reduced, but the reduction of the local resistance in the dense region cannot be achieved, so that this second method can also be associated with the problem of the excessive local heat generation in the dense region.

Next, referring to FIG. 12 to FIG. 14, the basic method of the present invention using the etching manufacturing method to be referred to as the third method, in which the problem of the excessive local heat generation is resolved, will be described.

In this third method, the coil turns are provided on two separate layers in which the first layer contains the odd turns wound in the counter-clockwise direction while the second layer contains the even turns wound in the clockwise direction, and assigned to the center positions (centers of mass) of the blocks, so as to approximate the desired continuous current distribution by the discrete currents flowing through the discrete lines on two layers, as indicated in FIG. 12.

Here, the conductive portion in the coil winding pattern for each of the first and second layers as shown in FIG. 13 is obtained by etching off the etched portion according to this coil winding pattern of FIG. 13, where the inner end C of the coil for the first layer and the inner end C' of the coil for the second layer are electrically connected in series when the first and second layers are assembled together. Note here that the coils for the first and second layers are wound in opposite directions, so that the current flows in the same direction in both of the first and second layers when the inner ends C and C' are electrically connected in series.

Accordingly, the coil turns have the local coil arrangement pattern including the first and second layers as shown in FIG. 14, where the conductive portion is indicated by the shaded regions while the etched portion is indicated by the black regions, and dashed lines on the conductive portion in both of the regions A and B indicate the width of the conductive portion used in the first method described above which is equal to Wwire.

In this case, the width of each conductive portion is limited to be twice as wide as Wwire at most, so that the intervals between the neighboring conductive portions Wcdi,a and Wcdi,b in the regions A and B and the widths of the conductive portions Wcd,a and Wcd,b in the regions A and B can be expressed by the following equations (24) to (27), respectively.

$$Wcdi,a = 4 \cdot Wwire \tag{24}$$

$$Wcdi,b = 2 \cdot Wwire \tag{25}$$

$$Wcd,a = 2 \cdot Wwire \tag{26}$$

$$Wcd,b = 2 \cdot Wwire - We,min \tag{27}$$

Consequently, the local resistance R3,a and R3,b in the regions A and B in this third method can be expressed by the following equations (28) and (29), respectively.

$$R3,a \propto 1/(2 \cdot Wwire) \tag{28}$$

$$R3,b \propto 1/(2 \cdot Wwire - We,min) \tag{29}$$

Then, the ratio of the local resistances R3,a and R3,b in this third method with respect to the local resistances in the first method in an equivalent double layered configuration corresponding to the double layered configuration of this third method can be expressed by the following equations (30) and (31), respectively.

$$R3,a/(R1,a/2) = 1 \tag{30}$$

$$R3,b/(R1,b/2) = 2 \cdot (Wwire - We,min)/(2 \cdot Wwire - We,min) = 2 \cdot (1 - We,min/Wwire)/(2 - We,min/Wwire) \tag{31}$$

As can be seen from the equation (30), the local resistance in the region A in this third method is the same as that in the first method in the equivalent double layered configuration.

On the other hand, according to the equation (31), when We,min is comparable to Wwire, the local resistance in the region B becomes substantially smaller in this third method compared with the first method in the equivalent double layered configuration.

Now, when this third method is generalized into a case in which the coil turns are provided on nl separate layers, where nl is an integer greater than one, and the width of each conductive portion is limited to be nl-th times as wide as Wwire at most, the intervals between the neighboring conductive portions Wcdi,a and Wcdi,b in the regions A and B and the widths of the conductive portions Wcd,a and Wcd,b in the regions A and B can be expressed by the following equations (32) to (35), respectively.

$$Wcdi,a = 2 \cdot nl \cdot Wwire \tag{32}$$

$$Wcdi,b = nl \cdot Wwire \tag{33}$$

$$Wcd,a = nl \cdot Wwire \tag{34}$$

$$Wcd,b = nl \cdot Wwire - We,min \tag{35}$$

Consequently, the local resistance R3,a and R3,b in the regions A and B in this generalized version of the third method can be expressed by the following equations (36) and (37), respectively.

$$R3,a \propto 1/(nl \cdot Wwire) \tag{36}$$

$$R3,b \propto 1/(nl \cdot Wwire - We,min) \tag{37}$$

Then, the ratio of the local resistances R3,a and R3,b in this generalized version of the third method with respect to the local resistances in the first method in the equivalent double layered configuration can be expressed by the following equations (38) and (39), respectively.

$$R3,a/(R1,a/nl) = 1 \tag{38}$$

$$R3,b/(R1,b/nl) = nl \cdot (Wwire - We,min)/(nl \cdot Wwire - We,min) = nl \cdot (1 - We,min/Wwire)/(nl - We,min/Wwire) \tag{39}$$

As can be seen from the equation (38), the local resistance in the region A in this generalized version of the third method is the same as that in the first method in the equivalent double layered configuration.

On the other hand, according to the equation (39), when We,min is comparable to Wwire, the local resistance in the region B becomes smaller in this generalized version of the third method compared with the first method in the equivalent double layered configuration.

Thus, in this third method, it becomes possible to achieve the reduction of the overall resistance of the entire coil as much as the local resistance in the dense region can be reduced, and the substantial reduction of the local resistance in the dense region cannot be achieved, so that this third method is free of the problem of the excessive local heat generation in the dense region.

Next, referring to FIG. 15 to FIG. 17, the modified method of the present invention using the etching manufacturing method to be referred to as the fourth method, which is the hybrid of the second and third methods described above, will be described.

In this fourth method, just as in the second method described above, the width of an etching groove between any neighboring conductive portions is set to be the minimum width of an etching groove We,min, such that the coil turns that can effectively be regarded as planes substantially filling the coil cross section are assigned to the blocks, so as to approximate the desired continuous current distribution by the discrete currents flowing through the discrete planes, as indicated in FIG. 15.

At the same time, Just as in the third method described above, the coil turns are provided on two separate layers in which the first layer contains the odd turns wound in the counter-clockwise direction while the second layer contains the even turns wound in the clockwise direction.

Here, the conductive portion in the coil winding pattern for each of the first and second layers as shown in FIG. 16 is obtained by etching off the etched portion according to this coil winding pattern of FIG. 16, with the inner ends of the coils for the first and second layers electrically connected in series when the first and second layers are assembled together.

Accordingly, the coil turns have the local coil arrangement pattern including the first and second layers as shown in FIG. 17, where the conductive portion is indicated by the shaded regions while the etched portion is indicated by the black regions, and dashed lines on the conductive portion in both of the regions A and B indicate the width of the conductive portion used in the first method described above which is equal to Wwire.

In this case, the intervals between the neighboring conductive portions Wcdi,a and Wcdi,b in the regions A and B and the widths of the conductive portions Wcd,a and Wcd,b in the regions A and B can be expressed by the following equations (40) to (43), respectively.

$$Wcdi,a = 4 \cdot Wwire \tag{40}$$

$$Wcdi,b = 2 \cdot Wwire \tag{41}$$

$$Wcd,a = 4 \cdot Wwire - We,min \tag{42}$$

$$Wcd,b = 2 \cdot Wwire - We,min \tag{43}$$

Consequently, the local resistance R4,a and R4,b in the regions A and B in this fourth method can be expressed by the following equations (44) and (45), respectively.

$$R4,a \propto 1/(4 \cdot Wwire - We,min) \tag{44}$$

$$R4,b \propto 1/(2 \cdot Wwire - We,min) \tag{45}$$

Then, the ratio of the local resistances R4,a and R4,b in this fourth method with respect to the local resistances in the first method in an equivalent double layered configuration corresponding to the double layered configuration of this fourth method can be expressed by the following equations (46) and (47), respectively.

$$\begin{aligned} R4,a/(R1,a/2) &= 2 \cdot Wwire/(4 \cdot Wwire - We,min) \\ &= 2/(4 - We,min/Wwire) \end{aligned} \tag{46}$$

$$\begin{aligned} R4,b/(R1,b/2) &= 2 \cdot (Wwire - We,min)/ \\ &\quad (2 \cdot Wwire - We,min) \\ &= 2 \cdot (1 - We,min/Wwire)/ \\ &\quad (2 - We,min/Wwire) \end{aligned} \tag{47}$$

As can be seen from the equation (46), the local resistance in the region A becomes smaller in this fourth method by the factor of nearly one half compared with the first method in the equivalent double layer configuration, even when We,min is comparable to Wwire.

On the other hand, according to the equation (47), when We,min is comparable to Wwire, the local resistance in the region B becomes substantially smaller in this fourth method compared with the first method in the equivalent double layered configuration.

Now, when this fourth method is generalized into a case in which the coil turns are provided on nl separate layers, where nl is an integer greater than one, and the width of each conductive portion is limited to be nl-th times as wide as Wwire at most, the intervals between neighboring conductive portions Wcdi,a and Wcdi,b in the regions A and B and the widths of the conductive portions Wcd,a and Wcd,b in the regions A and B can be expressed by the following equations (48) to (51), respectively.

$$Wcdi,a = 2 \cdot nl \cdot Wwire \tag{48}$$

$$Wcdi,b = nl \cdot Wwire \tag{49}$$

$$Wcd,a = 2 \cdot nl \cdot Wwire - We,min \tag{50}$$

$$Wcd,b = nl \cdot Wwire - We,min \tag{51}$$

Consequently, the local resistance R4,a and R4,b in the regions A and B in this generalized version of the fourth method can be expressed by the following equations (52) and (53), respectively.

$$R4,a \propto 1/(2 \cdot nl \cdot Wwire - We,min) \tag{52}$$

$$R4,b \propto 1/(nl \cdot Wwire - We,min) \tag{53}$$

Then, the ratio of the local resistances R4,a and R4,b in this generalized version of the fourth method with respect to the local resistances in the first method in the equivalent double layered configuration can be expressed by the following equations (54) and (55), respectively.

$$R4,a/(R1,a/nl) = nl \cdot Wwire/(2 \cdot nl \cdot Wwire - We,min) = nl/(2 \cdot nl - We,min/Wwire) \tag{54}$$

$$R4,b/(R1,b/nl) = nl \cdot (Wwire - We,min)/(nl \cdot Wwire - We,min) = nl \cdot (1 - We,min/Wwire)/(nl - We,min/Wwire) \tag{55}$$

As can be seen from the equation (54), the local resistance in the region A becomes smaller in this generalized version of the fourth method by the factor of nearly one half compared with the first method in the equivalent double layer configuration, even when We,min is comparable to Wwire.

On the other hand according to the equation (55), when We,min is comparable to Wwire, the local resistance in the region B becomes smaller in this generalized version of the fourth method compared with the first method in the equivalent double layered configuration.

Thus, in this fourth method, it becomes possible to achieve the significant reduction of the overall resistance of the entire coil as well as the substantial reduction of the local resistance In the dense region, so that this fourth method is totally free of the problem of the excessive local heat generation.

Figure 18:
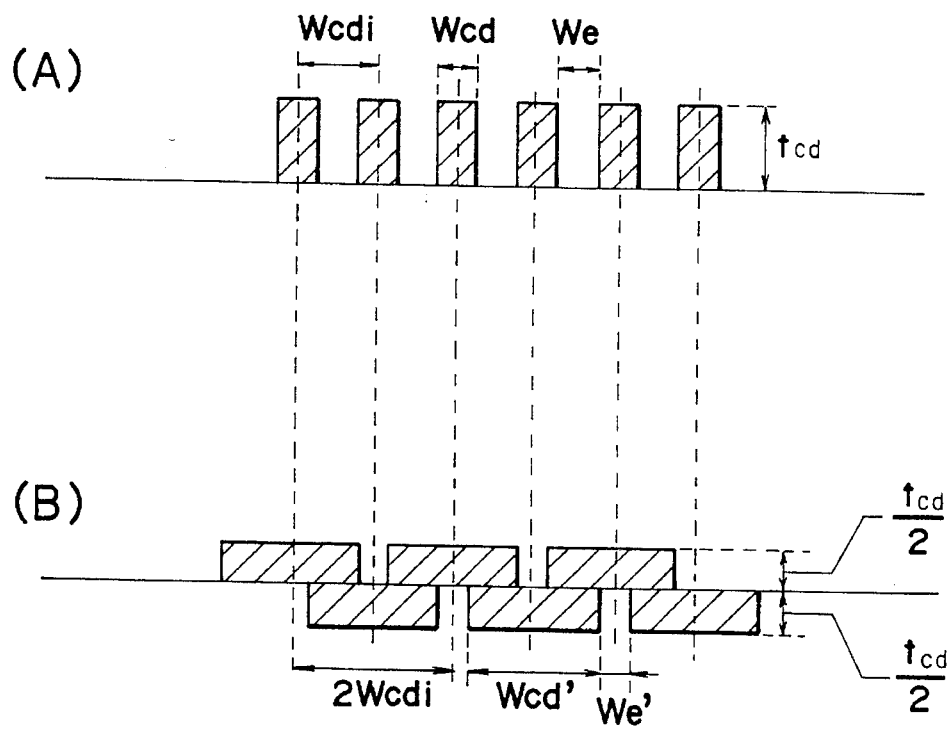
FIG. 18 is side cross sectional views of coil turns of the active shield coils in a conventional single layer configuration and a double layered configuration generalizing the basic method for constructing active shield coils according to the present invention.

Referring now to FIG. 18, another generalization of the basic method of the present invention described above will be described. Namely, in this generalization, the coil turns are provided on two separate layers, Just as in the third method described above, as shown in the part (B) of FIG. 18. Here, however, each layer has a thickness equal to tcd/2, such that the total thickness of the conductive portion is equal to tcd which is the same as the thickness of the conductive portion in the coil in the single layer configuration constructed by using the conventional method using the etching manufacturing method shown in the part (A) of FIG. 18.

In this case, the total resistance R of the single layer configuration and the total resistance R' of the double layered configuration can be expressed by the following equations (56) and (57), respectively.

$$R \propto 1/(Wcd \cdot tcd) = 1/((Wcdi - We) \cdot tcd) \tag{56}$$

$$R' \propto 1/(Wcd' \cdot tcd/2) = 1/((2 \cdot Wcdi - We') \cdot tcd/2) \tag{57}$$

Then, the ratio of the total resistance R' of the double layered configuration with respect to the total resistance R of the single layer configuration can be expressed by the following equation (58).

$$R'/R = 2 \cdot (Wcdi - We)/(2 \cdot Wcdi - We') \tag{58}$$

Now, it is assumed that We is proportional to tcd approximately, so that the following equation (59) holds.

$$We' = We/2 \tag{59}$$

Then, substituting the equation (59) into the equation (58), the following equation (60) can be obtained.

$$R'/R = (1 - We/Wcdi)/(1 - (We/Wcdi)/4) \tag{60}$$

It can be seen from this equation (60) that the reduction of the total resistance due to the double layered configuration becomes ineffective when the width of an etching groove We is substantially smaller than the interval Wcdi between the neighboring conductive portions, as in a case in which We=We,min is used in the coarse region. On the other hand, the reduction of the total resistance due to the double layered configuration is effective when the width of an etching groove We is comparable to the interval Wcdi between the neighboring conductive portions, as in a case in which We=We,min is used in the dense region.

In general, when the coil turns are provided on nl separate layers, where nl is an integer greater than one, the total resistance R' of the multiple nl-layered configuration can be expressed by the following equation (61).

$$R' \propto 1/(Wcd' \cdot tcd/nl) = 1/((nl \cdot Wcdi - We') \cdot tcd/nl) \tag{61}$$

Then, the ratio of the total resistance R' of the multiple hi-layered configuration with respect to the total resistance R of the single layer configuration can be expressed by the following equation (62).

$$R'/R = nl \cdot (Wcdi - We)/(nl \cdot Wcdi - We') \tag{62}$$

Now, as in the above, it is assumed that We is proportional to tcd approximately, so that the following equation (63) holds.

$$We' = We/nl \tag{63}$$

Then, substituting the equation (63) into the equation (62), the following equation (64) can be obtained.

$$R'/R = (1 - We/Wcdi)/(1 - (We/Wcdi)/nl^2) \tag{64}$$

It can be seen from this equation (64) that the reduction of the total resistance due to the multiple nl-layered configuration becomes ineffective when the width of an etching groove We is substantially smaller than the interval Wcdi between the neighboring conductive portions, as in a case in which We=We,min is used in the coarse region. On the other hand, the reduction of the total resistance due to the multiple nl-layered configuration is effective when the width of an etching groove We is comparable to the interval Wcdi between the neighboring conductive portions, as in a case in which We=We,min is used in the dense region.

Figure 19:
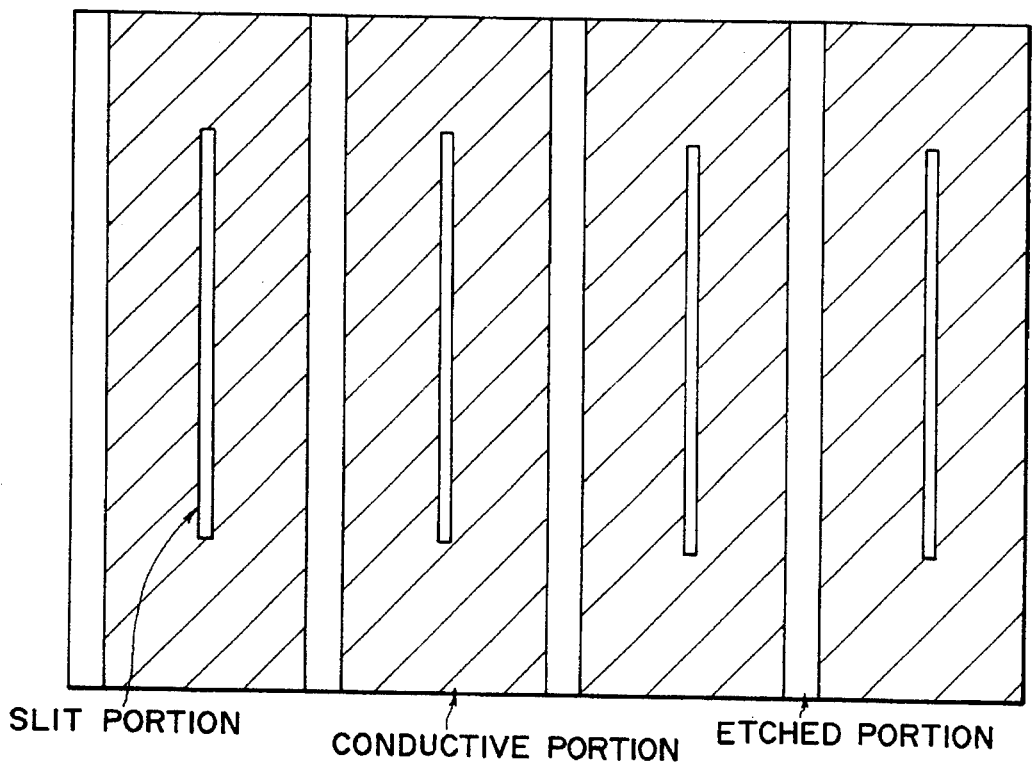
FIG. 19 is a top plan view of sections of coil turns in an active shield coil to be constructed in the method for constructing active shield coils according to the present invention, incorporating the slit portion for reducing the self eddy currents.

Referring now to FIG. 19, the method for constructing the primary gradient coil and the active shield coil in the ASGC directed toward the reduction of the self eddy currents in the ASGC will be described in detail.

It is to be noted that the embodiment will be described below for a case of constructing the active shield coil as an illustrative example, although the method according to the present invention to be described below is equally applicable to a case of constructing the primary gradient coil as well. It is further to be noted that, in practice, the method according to the present invention to be described below may be applied to either a part or a whole of either one or both of the primary gradient coils and the active shield coils, according to the practical need. It is also to be noted that the method to be described below is essentially independent from the various embodiments of the method described above, and it has a general applicability for the construction of any coil.

Now, when the coil turns are obtained by using the etching manufacturing method with the width of an etching groove between any neighboring conductive portions set to be the minimum width of an etching groove We,min, such that the coil turns that can effectively be regarded as planes substantially filling the coil cross section are assigned to the blocks, as in the second and fourth methods described above, while it is possible to achieve the reduction of the resistance, the width of the conductive portion in each coil turn can be significantly widened, such that the significant amount of the self eddy currents due to the switching of the gradient magnetic fields can be generated in such a significantly widened conductive portion, and such self eddy currents can make the ASGC meaningless.

In general, the strength of the self eddy current magnetic field becomes larger for the wider conductive portion, and the time constant of the self eddy current magnetic field becomes larger for the wider conductive portion as well as for the thicker conductive portion.

This problem of the self eddy currents can be resolved by using a configuration as shown in FIG. 19, in which a slit portion is formed on the significantly widened conductive portion. Namely, when such a slit portion is provided, the loop size of the self eddy currents in the conductive portion becomes smaller, so that the time constant can be reduced considerably as the repulsive Coulomb forces among the electrons of the self eddy currents becomes stronger. Moreover, when such a slit portion is provided, the area of the conductive portion becomes smaller, so that the strength of the self eddy current magnetic field can also be reduced.

The location of the slit portion may be selected to be at the center of mass section of the conductive portion or at the central section in the shape of the conductive portion. The location of the slit portion may also be selected to be at sections at which the increase of the resistance due to the insertion of the slit portion is minimum. The location of the slit portion may also be selected to be at sections having contributions to the desired imaging target region to be used in the MRI apparatus.

The formation of the slit portion can be achieved easily by using the mask pattern in the etching manufacturing method.

It is to be noted that, although the method for constructing the active shield coils has been described above for the coil pattern typically used for generating the X-axis and Y-axis gradient magnetic fields, the method is equally applicable to the coil pattern for generating the Z-axis gradient magnetic field.

It is also to be noted that the etching manufacturing method used in the method described above may be replaced by the other equivalent mechanical pattern forming manufacturing methods of corrosion and cutting categories such as the plating method, punching method, press working method, chipping method, laser cutting method, heat cutting method, etc.

It is further to be noted that the method described above is also applicable to the coil in general, other than the active shield coil and the primary gradient coil of the ASGC, such as shim coils, main magnet coils, and probe coils.

Thus, according to the various embodiments of the present invention described in this section, it becomes possible to provide an active shield gradient coil to be used in a nuclear magnetic resonance imaging and a method of its construction, capable of reducing the heat generation and the self eddy currents in an outer shielding coil, as well as the manufacturing steps and the manufacturing cost required for a realization of the satisfactory active shield gradient coil.

EDDY CURRENT COMPENSATION

Now, a method for eddy current compensation accounting for the spatial distribution of the residual eddy current magnetic field according to the present invention will be described in detail.

First, the general expression for the spatial distribution and the time response of the eddy current magnetic field with the eddy current compensation will be derived, for a case of the single component eddy current magnetic field. Here, for the sake of simplicity, the description will be given one dimensionally, but the generalization to the higher dimensionality can be made easily, in an obvious manner.

To start with, the spatial distribution and the time response of the magnetic field $B(x, t)$ containing the gradient magnetic field $Bg(x, t)$ and the eddy current magnetic field $Be(x, t)$, without any eddy current compensation, can be expressed in general by the following equation (65).

$$\begin{aligned} B(x, t) &= Bg(x, t) + Be(x, t) \\ &= G \cdot (x + g(x)) \cdot \phi g(t) + G \cdot (x + e(x)) \cdot \phi e(t) \end{aligned} \quad (65)$$

where:

G: a strength of the field gradient $\phi g(t)$: a time response of the gradient magnetic field (normalized by G)

$\phi e(t)$: a time response of the eddy current magnetic field (normalized by G)

x: spatial coordinate g(x): a spatial non-linearlity of the gradient magnetic field at a coordinate x e(x): a spatial non-linearlity of the eddy current magnetic field at a coordinate x in this equation (65), e(x) is assumed to have either a constant distribution or an average distribution in time over the eddy current magnetic field attenuation. Also, the spatial dependency of the time constant of the eddy current magnetic field is assumed to be negligible.

When this equation (65) is Laplace transformed (denoted by L), the following equation (66) can be obtained.

$$L[B(x, t)] = G \cdot (x + g(x)) \cdot \Phi g(s) + G \cdot (x + e(x)) \cdot \Phi e(s) \quad (66)$$

where:

$$\Phi g(s) = L[\phi g(t)] \quad (67)$$

$$\Phi e(s) = L[\phi e(t)] \quad (68)$$

On the other hand, $\Phi e(s)$ can also be expressed by the following equation (69).

$$\Phi e(s) = He(s) \cdot \Phi g(s) \quad (69)$$

Here, $He(s)$ appearing in the equation (69) is the response function of the eddy current magnetic field with respect to the gradient magnetic field, which is defined by the following equation (70).

$$He(s) = \frac{-u \cdot s}{s + \tau^{-1}} \quad (70)$$

where:

u: a relative strength of spatially linear eddy current magnetic field (normalized by G)

$\tau$: a time constant of the eddy current magnetic field

This equation (70) can be obtained easily from the equivalent circuit models of the gradient magnetic field system and the eddy current magnetic field system. Then, using the equation (69) in the equation (66), the spatial distribution and the Laplace transformed time response of the magnetic field $L[B(x, t)]$ can be expressed by the following equation (71).

$$L[B(x, t)] = G \cdot (x + g(x)) \cdot (1 + He(s)) \Phi g(s) + G \cdot (e(x) - g(x)) \cdot He(s) \Phi e(s) \quad (71)$$

On the other hand, the Laplace transformed time dependent waveform $\tilde{\Phi}g(s)$ of the eddy current compensation pulse to be applied as the input gradient magnetic field for compensating the eddy current magnetic field can be expressed by the following equation (72).

$$\tilde{\Phi}g(s) = (1 + \tilde{H}e(s)) \cdot \Phi g(s) \quad (72)$$

Here, $\tilde{H}e(s)$ appearing in the equation (72) is the response function of an eddy current compensation pulse generating system, which is defined by the following equation (73).

$$\tilde{H}e(s) = \frac{+\tilde{u} \cdot s}{s + \tilde{\tau}^{-1}} \quad (73)$$

where:

$\tilde{u}$: a relative strength of the eddy current compensation pulse (normalized by G)

$\tilde{\tau}$: a time constant of the eddy current compensation pulse

From the equations (71) and (72), the general expression for the spatial distribution and the Laplace transformed time response $L[\tilde{B}(x, t)]$ of the gradient magnetic field and the eddy current magnetic field after the eddy current compensation can be expressed by the following equation (74).

$$\begin{aligned} L[\tilde{B}(x, t)] &= G \cdot (x + g(x)) \cdot (1 + He(s))(1 + \tilde{H}e(s)) \Phi g(s) + \\ &\quad G \cdot (e(x) - g(x)) \cdot He(s)(1 + \tilde{H}e(s)) \Phi g(s) \end{aligned} \quad (74)$$

Also, from the equations (70) and (73), the following equation (75) can be obtained.

$$He(s) \cdot \tilde{H}e(s) = \frac{\tilde{u} \cdot \tau^{-1}}{\tau^{-1} - \tilde{\tau}^{-1}} \cdot He(s) + \frac{u \cdot \tilde{\tau}^{-1}}{\tilde{\tau}^{-1} - \tau^{-1}} \cdot \tilde{H}e(s) \quad (75)$$

Then, using the equation (75) in the equation (74), the following equation (76) can be obtained.

$$\begin{aligned} L[\tilde{B}(x, t)] &= G \cdot (x + g(x)) \cdot \Phi g(s) + \\ &\quad f1 \cdot G \cdot (x + e(x)) \cdot He(s) \Phi g(s) + \\ &\quad f2 \cdot G \cdot (x + g(x)) \cdot \tilde{H}e(s) \Phi g(s) + \\ &\quad f3 \cdot G \cdot (e(x) - g(x)) \cdot \tilde{H}e(s) \Phi g(s) \end{aligned} \quad (76)$$

where:

$$f1 = \frac{(1 + \tilde{u})\tilde{\tau} - \tau}{\tilde{\tau} - \tau} \quad (77)$$

$$f2 = \frac{\tilde{\tau} - (1 - u)\tau}{\tilde{\tau} - \tau} \quad (78)$$

$$f3 = \frac{u \cdot \tau}{\tilde{\tau} - \tau} \tag{79}$$

As can be seen from the equation (76), the spatial dependency of the residual eddy current magnetic field with the eddy current compensation generally contains three components of the gradient magnetic field distribution component $(x+g(x))$, the pre-compensation eddy current magnetic field distribution component $(x+e(x))$, and their difference distribution component $(e(x)-g(x))$.

Consequently, the general expression for the spatial distribution and the time response $\tilde{B}(x, t)$ of the gradient magnetic field and the eddy current magnetic field, after the eddy current compensation, can be expressed by the following equation (80).

$$\begin{aligned}\tilde{B}(x, t) = \; & G \cdot (x + g(x)) \cdot \phi g(t) + \\ & f1 \cdot G \cdot (x + e(x)) \cdot \phi e(t) + \\ & f2 \cdot G \cdot (x + g(x)) \cdot \tilde{\phi} e(t) + \\ & f3 \cdot G \cdot (e(x) - g(x)) \cdot \tilde{\phi} e(t)\end{aligned} \tag{80}$$

where:

$\phi(t)$: the time dependent waveform of the eddy current compensation pulse (normalized by G)

Now, more specific expressions for f1, f2, f3, and $\tilde{B}(x, t)$ can be determined for the specific cases, as follows.

<Case without eddy current compensation>

This corresponds to a case in which $\tilde{u}=0$, so that the following equations (81) and (82) can be obtained from the equations (76) to (79).

$$f1=1 \tag{81}$$

$$\tilde{\phi}e(t)=0 \tag{82}$$

Consequently, $\tilde{B}(x, t)$ can be expressed by the following equation (83) in this case.

$$\tilde{B}(x, t)=G \cdot (x+g(x)) \cdot \Phi g(t) + G \cdot (x+e(x)) \cdot \phi e(t) \tag{83}$$

Note that this equation (83) coincides with the equation (65) described above, as it should.

<Case of linear eddy current compensation>

This corresponds to a case of making the eddy current compensation in spatially linear region, in which $\tilde{u}$ and $\tilde{\tau}$ are set according to the following equations (84) and (85).

$$\tilde{u} = \frac{u}{1-u} \tag{84}$$

$$\tilde{\tau} = (1 - u) \cdot \tau \tag{85}$$

With these settings, the following equations (86) to (88) can be obtained from the equations (77) to (79).

$$f1=0 \tag{86}$$

$$f2=0 \tag{87}$$

$$f3=-1 \tag{88}$$

Consequently, $\tilde{B}(x, t)$ can be expressed by the following equation (89) in this case.

$$\tilde{B}(x, t)=G \cdot (x+g(x)) \cdot \phi g(t) - G \cdot (e(x)-g(x)) \cdot \tilde{\phi}e(t) \tag{89}$$

It can be seen from this equation (89) that the difference of the eddy current magnetic field distribution and the gradient magnetic field distribution will remain as the residual eddy current magnetic field in this case because only a linear eddy current has been compensated.

<Case of eddy current compensation at arbitrary point>

In this case, when the spatial coordinate to make the eddy current compensation is xcp, the relative strength u(xcp) of the eddy current magnetic field at the coordinate xcp can be expressed by the following equation (90).

$$u(xcp) = u \cdot \frac{(xcp + e(xcp))}{(xcp + g(xcp))} \tag{90}$$

Accordingly, $\tilde{u}(xcp)$ and $\tilde{\tau}(xcp)$ are set according to the following equations (91) and (92) in this case.

$$\tilde{u}(xcp) = \frac{u(xcp)}{1 - u(xcp)} \tag{91}$$

$$\tilde{\tau}(xcp) = (1 - u(xcp)) \, \tau \tag{92}$$

With these settings, the following equations (93) to (95) can be obtained from the equations (77) to (79).

$$f1 = 0 \tag{93}$$

$$f2 = \frac{u(xcp) - u}{u(xcp)} \tag{94}$$

$$f3 = -\frac{u}{u(xcp)} \tag{95}$$

Consequently, $\tilde{B}(x, t)$ can be expressed by the following equation (96) in this case.

$$\begin{aligned}\tilde{B}(x, t) = \; & G \cdot (x+g(x)) \cdot \phi g(t) + \\ & \frac{u(xcp) - u}{u(xcp)} \cdot G \cdot (x+g(x)) \cdot \tilde{\phi}e(t) + \\ & \frac{u}{u(xcp)} \cdot G \cdot (e(x)-g(x)) \cdot \tilde{\phi}e(t)\end{aligned} \tag{96}$$

It can be seen from this equation (96) that the spatial dependency of the residual eddy current magnetic field contains two components of $(x+g(x))$ and $(e(x)-g(x))$. In addition, by substituting the equation (90) into this equation (96), it can be verified that the residual eddy current magnetic field becomes zero at this point x=xcp, and that the sign of the residual eddy current magnetic field changes from one side of this point to another side of this point. Here, when only the spatial dependency component for the residual eddy current magnetic field $\tilde{B}e(x)$ is extracted from the equation (96), since $\phi e(t)$ is proportional to $\tilde{u}(xcp)$, the following equation (97) can be obtained.

$$\begin{aligned}\tilde{B}e(x) = \; & \frac{u(xcp) - u}{1 - u(xcp)} \cdot G \cdot (x+g(x)) - \\ & \frac{u}{1 - u(xcp)} \cdot G \cdot (e(x) - g(x))\end{aligned} \tag{97}$$

It is to be noted here that, by using the equation (80) described above, it is also possible to express the residual eddy current magnetic field in a case there are setting errors for the parameters $\tilde{u}$ and $\tilde{\tau}$.

Figure 20:
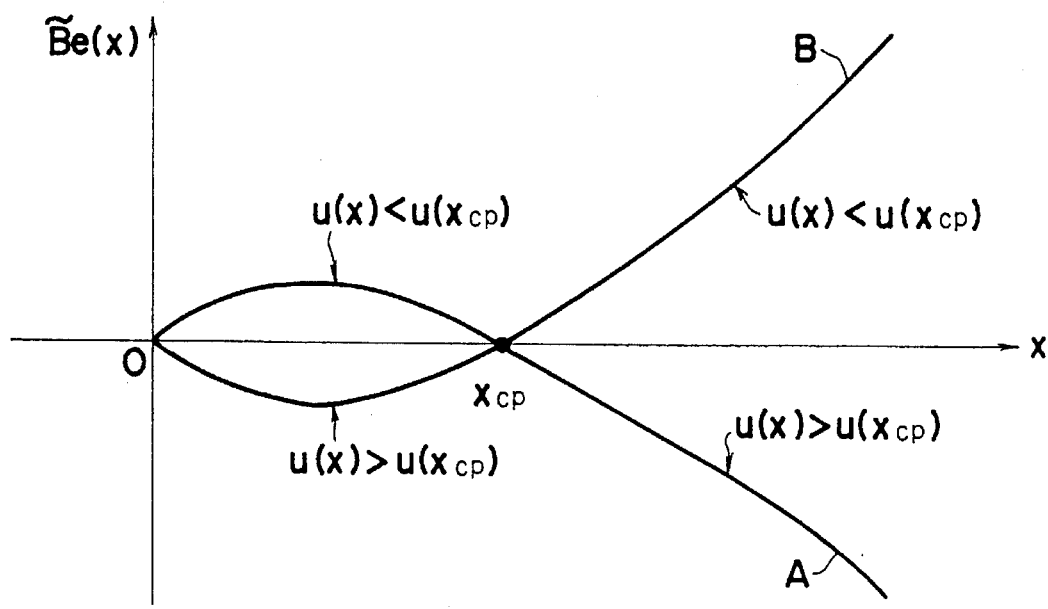
FIG. 20 is a graph of a residual eddy current magnetic field after the eddy current compensation as a function of a spatial position, for two different cases.

The actual behavior of $\tilde{B}e(x)$ can be depicted as shown in FIG. 20, in which the curve A corresponds to the cases satisfying the following conditions (98) and (99), while the curve B corresponds to the cases satisfying the following conditions (100) and (101).

Curve A:

$$u(x) > u(xcp) \text{ for } x > xcp \text{ (Under-compensation)} \tag{98}$$

$$u(x) < u(xcp) \text{ for } x < xcp \text{ (Over-compensation)} \tag{99}$$

Curve B:

$$u(x) < u(xcp) \text{ for } x > xcp \text{ (Over-compensation)} \tag{100}$$

$$u(x) > u(xcp) \text{ for } x < xcp \text{ (Under-compensation)} \tag{101}$$

Next, using the expression for the spatial distribution of the residual eddy current magnetic field obtained above, a first specific embodiment of the method for eddy current compensation accounting for the spatial distribution of the residual eddy current magnetic field according to the present invention will be described.

In this first specific embodiment, the eddy current compensation point is determined as a point within a desired field of view (FOV) at which either a spatial average value of the spatial distribution of the residual eddy current magnetic field becomes zero, or a a spatial root mean square value of tile spatial distribution of the residual eddy current magnetic field becomes minimum, and the eddy current compensation pulse at the determined eddy current compensation point is used as the input gradient magnetic field for compensating the eddy currents.

More specifically, when the desired field of view is an interval [xa, xb], the spatial average value $\tilde{B}e,ave$ and the spatial root mean square value $\tilde{B}e,r.m.s.$ of the spatial distribution of the residual eddy current magnetic field can be defined by the following equations (102) and (103), respectively.

$$\tilde{B}e,ave = \int_{xa}^{xb} \frac{\tilde{B}e(x)}{xb - xa} dx \quad (102)$$

$$(\tilde{B}e,r.m.s.)^2 = \int_{xa}^{xb} \frac{\tilde{B}e(x)^2}{xb - xa} dx \quad (103)$$

Figure 21:
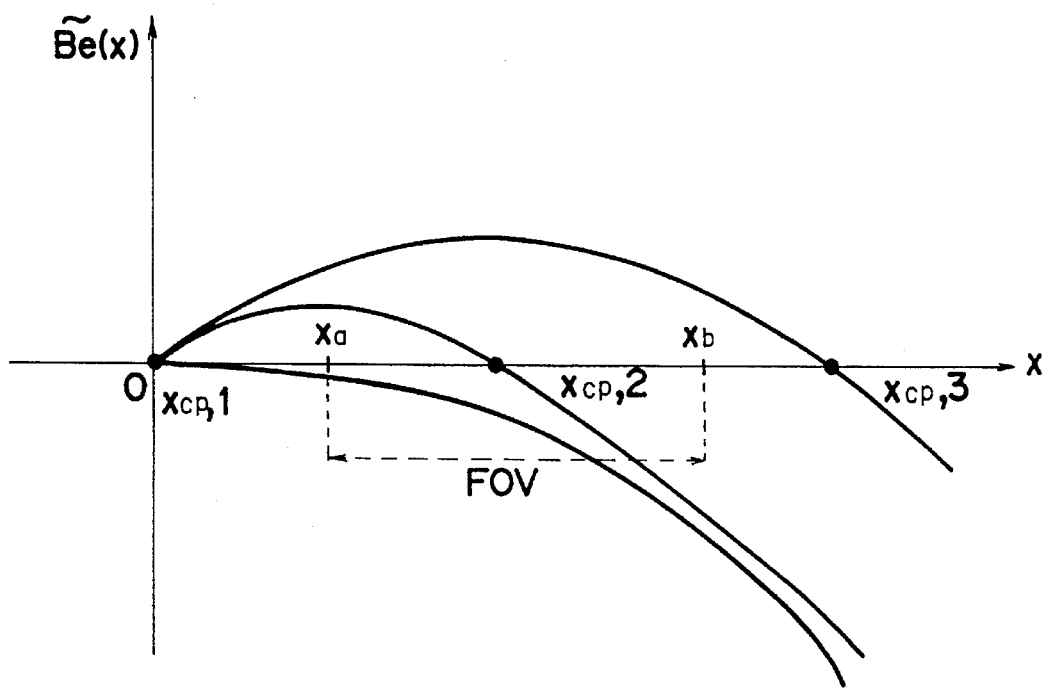
FIG. 21 is a graph of a residual eddy current magnetic field after the eddy current compensation as a function of a spatial position, for three difference eddy current compensation points.

The actual behavior of the residual eddy current magnetic field $\tilde{B}e(x)$ with respect to different eddy current compensation points can be depicted as shown in FIG. 21.

Among these different eddy current compensation points, the point at which the spatial average value $\tilde{B}e,ave$ becomes zero or the spatial root mean square value $\tilde{B}e,r.m.s.$ becomes minimum within the desired field of view is selected as the optimum eddy current compensation point xcp,opt.

Figure 22:
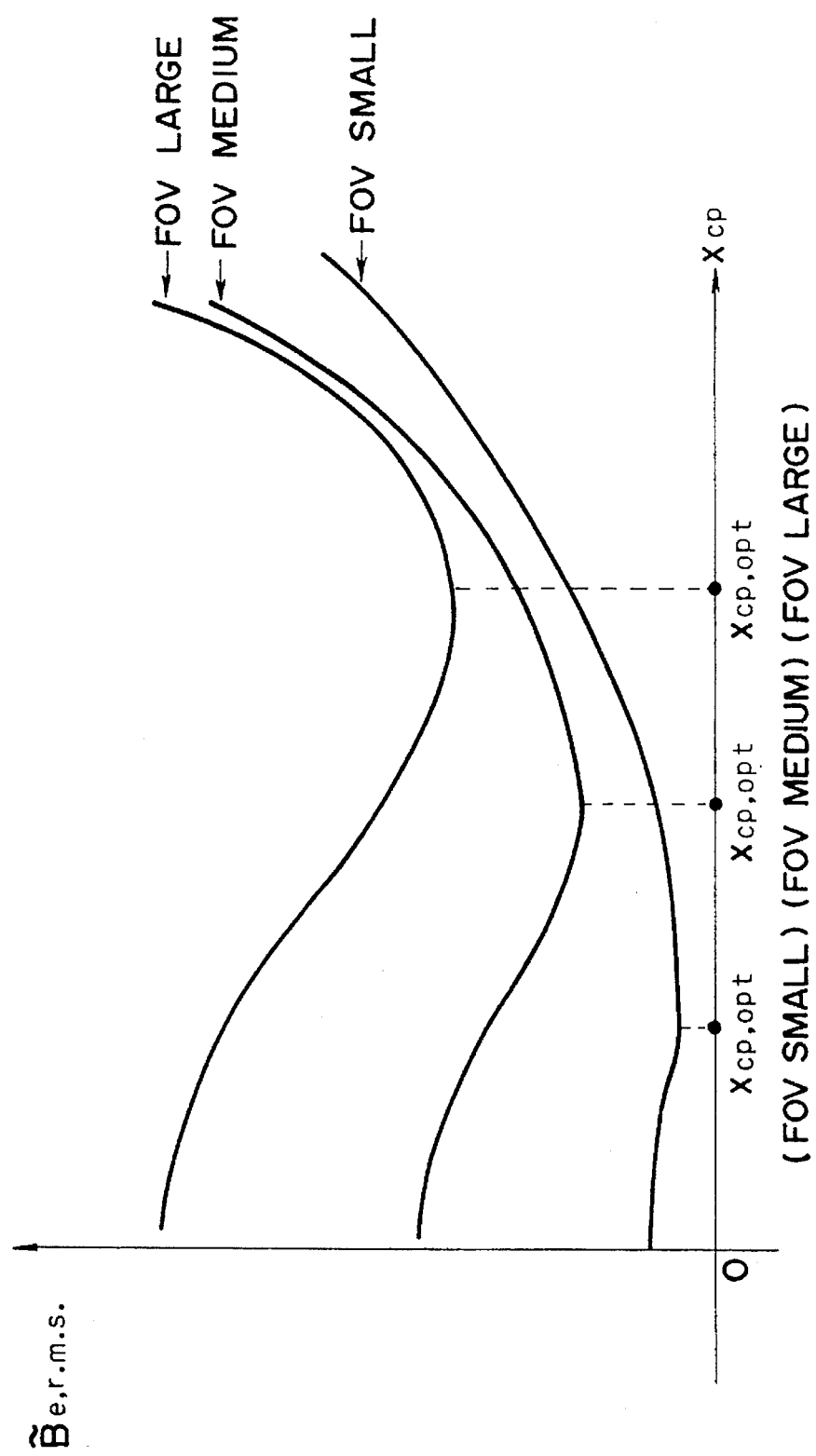
FIG. 22 is a graph of a spatial square average of the residual eddy current magnetic field after the eddy current compensation as a function of the eddy current compensation point, for three different fields of view.

The dependency of the spatial root mean square value $\tilde{B}e,r.m.s.$ on the eddy current compensation point xcp can be depicted as shown in FIG. 22, for example. In general, when the field of view is larger, $\tilde{B}e,r.m.s.$ also becomes larger, so that the optimum eddy current compensation point xcp,opt is located further away from the origin, whereas when the field of view is smaller, $\tilde{B}e,r.m.s.$ also becomes smaller, so that the optimum eddy current compensation point xcp,opt is located closer to the origin.

Consequently, the relative strength $\tilde{u}$ of the eddy current compensation pulse and the time constant $\tilde{\tau}$ of the eddy current compensation pulse can be set according to the following equations (104) and (105) in this case.

$$\tilde{u} = \frac{u(xcp,opt)}{1 - u(xcp,opt)} \quad (104)$$

$$\tilde{\tau} = (1 - u(xcp,opt)) \tau \quad (105)$$

where:

$$u(xcp,opt) = u \cdot \frac{(xcp,opt + e(xcp,opt))}{(xcp,opt + g(xcp,opt))} \quad (106)$$

Thus, according to this first specific embodiment, by setting the optimum eddy current compensation parameters as described above, for each field of view and each pulse sequence direction, the deterioration of the image quality in the nuclear magnetic resonance images to be obtained can be minimized within each field of view in each pulse sequence direction.

It is to be noted that the use of the optimum eddy current compensation point in this first specific embodiment may be modified to the use of an eddy current compensation point in a vicinity of a tolerable range of the image quality deterioration.

Next, using the expression for the spatial distribution of the residual eddy current magnetic field obtained above, a second specific embodiment of the method for eddy current compensation accounting for the spatial distribution of the residual eddy current magnetic field according to the present invention will be described.

In the first specific embodiment described above, the eddy current magnetic field is still remaining at the points other than the optimum eddy current compensation point, because the optimum eddy current compensation is made for only a single point. In order to make an improvement in this aspect, this second specific embodiment uses a plurality of eddy current compensation points such that the spatial root mean square value $Be,r.m.s.$ of the spatial distribution of the residual eddy current magnetic field for the desired field of view [xa, xb] can be made even lower than the first specific embodiment.

Namely, denoting the n-th point among the plurality of the eddy current compensation points as xcp,n (n =1 to N), the response function $\tilde{H}e(s)$ for the eddy current compensation pulse generating system can be set according to the following equations (107) and (108).

$$\tilde{H}e(s) = \sum_{n=1}^{N} \frac{Wn \cdot \tilde{u}n \cdot s}{s + \tilde{\tau}n^{-1}} \quad (107)$$

$$= \sum_{n=1}^{N} Wn \cdot \tilde{H}e,n(s) \quad (108)$$

where:

$\tilde{u}n$: the relative strength of the complete eddy current compensation pulse at xcp,n $\tilde{\tau}n$: the time constant of the eddy current compensation pulse at xcp,n Wn: the weight factor for each eddy current compensation point $\tilde{H}e,n(s)$: the response function for the eddy current compensation pulse generating system with respect to xcp,n Here, $\tilde{u}n$ and $\tilde{\tau}n$ can be expressed more specifically by the following equations (109) and (110), respectively.

$$\tilde{u}n = \frac{u(xcp,n)}{1 - u(xcp,n)} \quad (109)$$

$$\tilde{\tau}n = (1 - u(xcp,n)) \cdot \tau \quad (110)$$

where:

$$u(xcp,n) = u \cdot \frac{(xcp,n + e(xcp,n))}{(xcp,n + g(xcp,n))} \quad (111)$$

When the eddy current compensation is made by using the response function $\tilde{H}e(s)$ for the eddy current compensation pulse gerating system according to the equation (107), the general expression for the spatial distribution and the time response $\tilde{B}(x, t)$ of the gradient magnetic field and the eddy current magnetic field after the eddy current compensation can be expressed by the following equation (112).

$$\tilde{B}(x, t) = G \cdot (x + g(x)) \cdot \phi g(t) + \quad (112)$$
$$\sum_{n=1}^{N} Wn \cdot \left\{ \frac{u(xcp,n) - u}{u(xcp,n)} \cdot G \cdot (x + g(x)) \cdot \tilde{\phi}e(t) - \right.$$
$$\left. \frac{u}{u(xcp,n)} \cdot G \cdot (e(x) - g(x)) \cdot \tilde{\phi}e(t) \right\}$$

where:

$$\sum_{n=1}^{N} Wn = 1 \ (0 \leq Wn \leq 1) \tag{113}$$

Here, when only the spatial dependency component $\tilde{B}e(x)$ for the residual eddy current magnetic field is extracted from the equation (112), the following equation (114) can be obtained.

$$\tilde{B}e(x) = \sum_{n=1}^{N} Wn \cdot \left\{ \frac{u(xcp,n) - u}{1 - u(xcp,n)} \cdot G \cdot (x + g(x)) - \frac{u}{1 - u(xcp,n)} \cdot G \cdot (e(x) - g(x)) \right\} \tag{114}$$

Thus, according to this second specific embodiment, by setting Wn and xcp,n appropriately, it becomes possible to minimize the spatial root mean square value $\tilde{B}e,r.m.s.$ of the spatial distribution of the residual eddy current magnetic field for the desired field of view [xa, xb] defined by the following equation (115).

$$(\tilde{B}e,r.m.s.)^2 = \int_{xa}^{xb} \frac{\tilde{B}e(x)^2}{xb - xa} \, dx \tag{115}$$

It is to be noted that, in a case involving the multiple component eddy current magnetic fields, the eddy current compensation as described above may be applied to each eddy current magnetic field sequentially, in an order of the sizes of their time constants, for example.

It is also to be noted that, because the desired field of view is different for each pulse sequence direction in general, the eddy current compensation as described above may be applied to each of the reading, encoding, and slicing directions separately, for the best possible image quality at the desired field of view. For instance, the optimum eddy current compensation pulse can be determined for each slicing plane to be used in the multi-slice imaging pulse sequence.

Next, using the expression for the spatial distribution of the residual eddy current magnetic field obtained above, a third specific embodiment of the method for eddy current compensation accounting for the spatial distribution of the residual eddy current magnetic field according to the present invention will be described.

In this third specific embodiment, as a superposition of M different types of the eddy current compensation pulses the response function $\tilde{H}e(s)$ for the eddy current compensation pulse generating system is set according to the following equation (116).

$$\tilde{H}e(s) = \sum_{m=1}^{M} \frac{\bar{u}m \cdot s}{s + \bar{\tau}m^{-1}} \tag{116}$$

$$= \sum_{m=1}^{M} \tilde{H}e,m(s) \tag{117}$$

where:

$\bar{u}m$: a relative strength of the m-th eddy current compensation pulse $\bar{\tau}m$: a time constant for the m-th eddy current compensation pulse $\tilde{H}e,m(s)$: a response function for the m-th eddy current compensation pulse generating system When the eddy current compensation is made by using the response function $\tilde{H}e,m(s)$ for the m-th eddy current compensation pulse generating system according to the equation (116), the general expression for the spatial distribution and the time response $\tilde{B}(x, t)$ of the gradient magnetic field and the eddy current magnetic field after the eddy current compensation can be expressed by the following equation (118).

$$\begin{aligned}\tilde{B}(x, t) = & \ G \cdot (x + g(x)) \cdot \phi g(t) + \\ & f1 \cdot G \cdot (x + e(x)) \cdot \phi e(t) + \\ & G \cdot (x + g(x)) \cdot \left( \sum_{m=1}^{M} f2,m \cdot \tilde{\phi} e,m(t) \right) + \\ & G \cdot (e(x) - g(x)) \cdot \left( \sum_{m=1}^{M} f3,m \cdot \tilde{\phi} e,m(t) \right) \end{aligned} \tag{118}$$

where:

$$f1 = 1 + \sum_{m=1}^{M} \frac{\bar{u}m \cdot \bar{\tau}m}{\bar{\tau}m - \tau} \tag{119}$$

$$f2,m = \frac{\bar{\tau}m - (1 - u) \tau}{\bar{\tau}m - \tau} \tag{120}$$

$$f3,m = \frac{u \cdot \tau}{\bar{\tau}m - \tau} \tag{121}$$

and:

$\tilde{\phi}e,m(t)$: time dependent waveform for the m-th eddy current compensation pulse (normalized by G)

Then, assuming that the eddy current compensation pulse is given in a rectangular pulse shape, the spatial distribution of the eddy current magnetic field at a time of the rise of the pulse (t=0) can be expressed by the following equation (122).

$$\begin{aligned}\tilde{B}e(x) = & \ -f1 \cdot u \cdot G \cdot (x + e(x)) + \\ & \left( \sum_{m=1}^{M} f2,m \cdot \bar{u}m \right) \cdot G \cdot (x + g(x)) + \\ & \left( \sum_{m=1}^{M} f3,m \cdot \bar{u}m \right) \cdot G \cdot (e(x) - g(x)) \end{aligned} \tag{122}$$

Thus, according to this third specific embodiment, by setting $\bar{u}m$ and $\bar{\tau}m$ appropriately, it becomes possible to minimize the spatial root mean square value of the spatial distribution of the residual eddy current magnetic field for the desired field of view.

It is to be noted that this third specific embodiment is applicable to a case of a single component eddy current magnetic field as well as a case of the multiple component eddy current magnetic fields.

Figure 23:
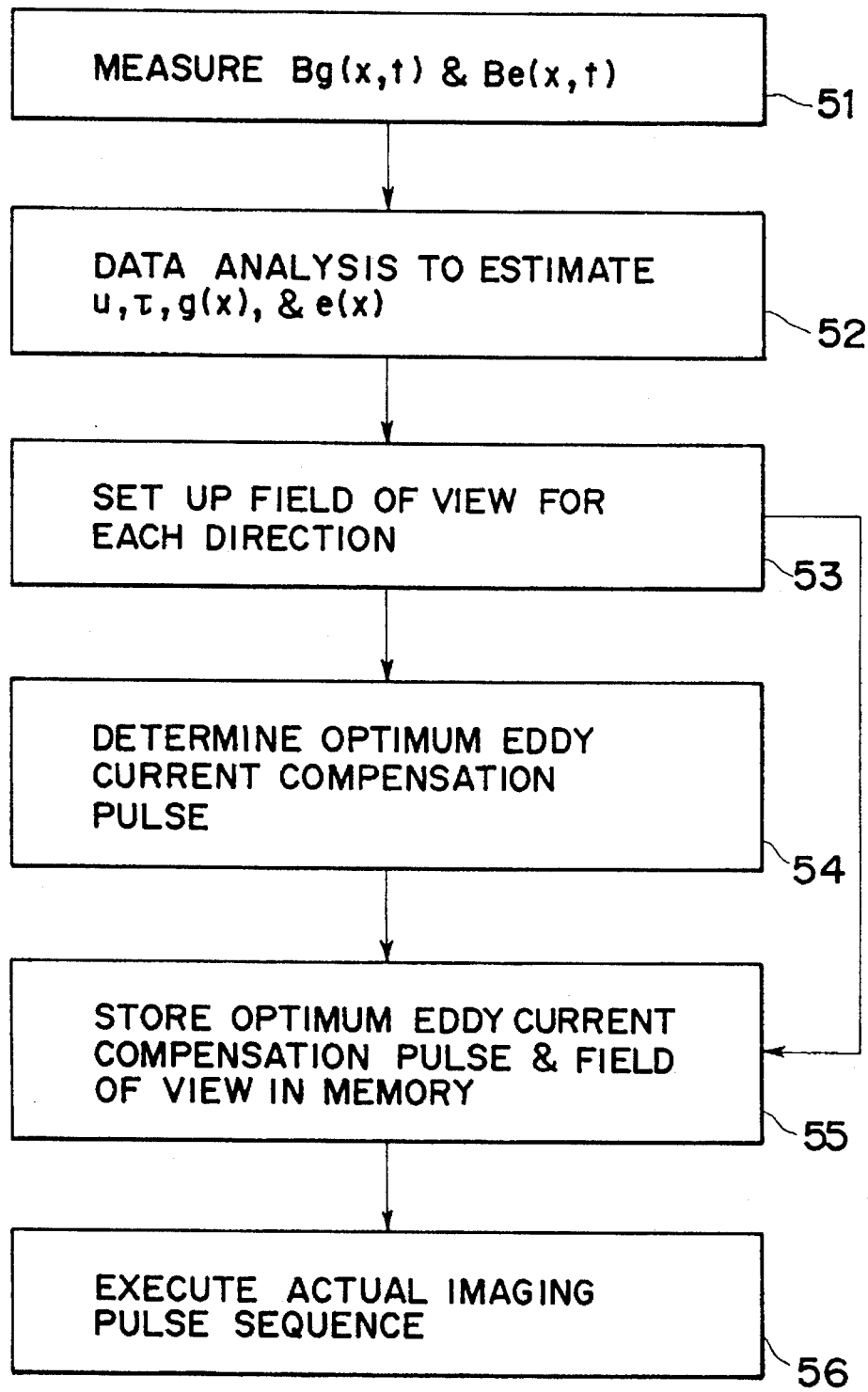
FIG. 23 is a flow chart for a generic procedure of the method for eddy current compensation according to the present invention.

Referring now to the flow chart of FIG. 23, an overall procedure of the method for eddy current compensation accounting for the spatial distribution of the residual eddy current magnetic field according to the present invention will be described.

First, at the step 51, the spatial distribution and the time response of the gradient magnetic field Bg(x, t) and the eddy current magnetic field Be(x, t) are measured. Here, the measurement can be accomplished by executing any available measurement method such as the direct magnetic field measurement using a pick up coil, the phase data measurement from the NMR signals, and the measurement suing the NMR imaging.

Next, at the step 52, the data obtained by the measurement made at the step 51 are analyzed, in order to obtain estimations for required quantities such as the relative strength of the eddy current magnetic field u, the time constant of the eddy current magnetic field $\tau$, and the spatial non-linearlity of the gradient magnetic field and the eddy current magnetic field g(x) and e(x), etc.

Then, at the step 53, the desired field of view is set up for each of the reading, encoding, and slicing directions of the imaging pulse sequence to be used.

Next, at tile step 54, the optimum eddy current compensation pulse is determined for each field of view in a manner described in detail above.

Then, at the step 53, the optimum eddy current compensation pulse determined at the step 54 and the desired field of view set up at the step 53 are stored in correspondence into a memory such as a gradient magnetic field waveform memory.

Finally, at the step 56, the actual imaging pulse sequence is executed by using the desired field of view and the optimum eddy current compensation pulse stored in the memory at the step 55.

It is to be noted that the calculations for the setting of the parameters such as the relative strength of the eddy current magnetic field u and the time constant of the eddy current magnetic field τ as described above can be carried out in the system controller 9 in the configuration of FIG. 2 described above by using appropriate software.

It is also to be noted that the setting of these parameters may also be realized by providing an analog ECC (Eddy Current Compensation) circuit between the gradient coil power source 4 and the system controller 9, and equipping the ECC circuit with automatic or remote controllable potentiometers to make channel gains variable such that the setting can be adjusted for each field of view.

It is also to be noted that the setting of these parameters may also be realized by providing an digital ECC (Eddy Current Compensation) filter formed by digital signal processors between the gradient coil power source 4 and the system controller 9, such that the setting can be adjusted for each field of view.

Now, as already mentioned above, when the gradient coils are provided in a form of ASGC, there is a problem that the ideal number of coil turns for the outer shielding coils must be approximated by the integer number of coil turns realizable in practice, so that only incomplete shielding property can be realizable and there remains some residual eddy current magnetic field. Here, since the residual eddy current magnetic field in this case has a negative sign to weaken the actual gradient magnetic fields in a case of under-shielding, or a positive sign to strengthen the actual gradient magnetic fields in a case of over-shielding.

Consequently, this problem can be resolved by determining the eddy current compensation pulse used in the method for eddy current compensation according to the present invention to be the over-shooting type eddy current compensation pulse when the residual eddy current magnetic field has the negative sign, and the under-shooting type eddy current compensation pulse when the residual eddy current magnetic field has the positive sign, while making the optimal setting of the eddy current compensation pulse to make the spatial average value of the spatial distribution of the residual eddy current magnetic field to be zero, or the spatial root mean square value of the spatial distribution of the residual eddy current magnetic field to be minimum in the manner described in detail above.

Thus, according to the present invention, the eddy current compensation can be made at high precision even when the gradient coils are provide din a form of ASGC.

On the other hand, as also already mentioned above, when the gradient coils are provided in a form of ASGC, there is also a problem that the shielding property provided by the outer shielding coil functions to reduce the strength of the gradient magnetic fields generated by the inner gradient coil, so that it becomes necessary for the inner gradient coil to increase the number of turns in order to generate the gradient magnetic fields of the same strength with the same amount of the supplied gradient coil currents.

This problem can be resolved by thinning the relative number of coil turns in tile outer shielding coil with respect to the inner gradient coil, so as to reduce the inductance, resistance, and switching time for a given gradient field strength G, or to increase the gradient field strength G for a given switching time.

It is obvious, however, that this prescription causes the deterioration of the shielding property of the ASGC, such that there appears some residual eddy current magnetic field.

Yet, this residual eddy current magnetic field can be compensated by using the optimal setting of the eddy current compensation pulse to make the spatial average value of the spatial distribution of the residual eddy current magnetic field to be zero, or the spatial root mean square value of the spatial distribution of the residual eddy current magnetic field to be minimum according to the method for eddy current compensation according to the present invention, so that various types of the high speed imaging pulse sequences requiring the large gradient field strength G and the very fast switching time can be executed by using the ASGC, without introducing any deterioration of the image quality in the NMR images.

In addition, when the method for eddy current compensation according to the present invention is employed, since the optimum eddy current compensation can be achieved always for any situation, there is absolutely no need for the so called over-specification for the ASGC in which the excessive amount of the eddy current compensation measures are provided within the ASGC configuration itself, so that the unnecessary increase of the size and the cost of the MRI apparatus due to such an over-specification can be avoided.

Thus, according to the various embodiments of the present invention described in this section, it becomes possible to provide a method for eddy current compensation in a nuclear magnetic resonance imaging, capable of accounting for spatial distribution of the residual eddy current magnetic field.

OPTIMIZATION OF GRADIENT COIL SYSTEM

Now, various embodiments of the method for optimum setting of various system parameters for each imaging pulse sequence will be described in detail.

First, referring to FIG. 24 to FIG. 30, one embodiment of the method for optimum setting of system parameters for a reading pulse sequence in the one shot ultra high speed MRI pulse sequence shown in FIG. 24 will be described.

Here, the system parameters to be optimized includes: the number of the multi-filers to be used; the spatial resolution to be achieved; and the data acquisition time to be realized.

More specifically, in this embodiment, any one of the following optimizations of the system parameters is to be achieved.

(1) Minimizing the data acquisition time for a given number of the multi-filers and a given spatial resolution requirement.

(2) Minimizing the number of the multi-filers for a given spatial resolution requirement and a desired data acquisition time.

(3) Maximizing the spatial resolution for a given number of the multi-filers and a desired data acquisition time.

Here, which one of the above three optimizations of the system parameters is to be realized is a matter of a design choice.

Figure 24:
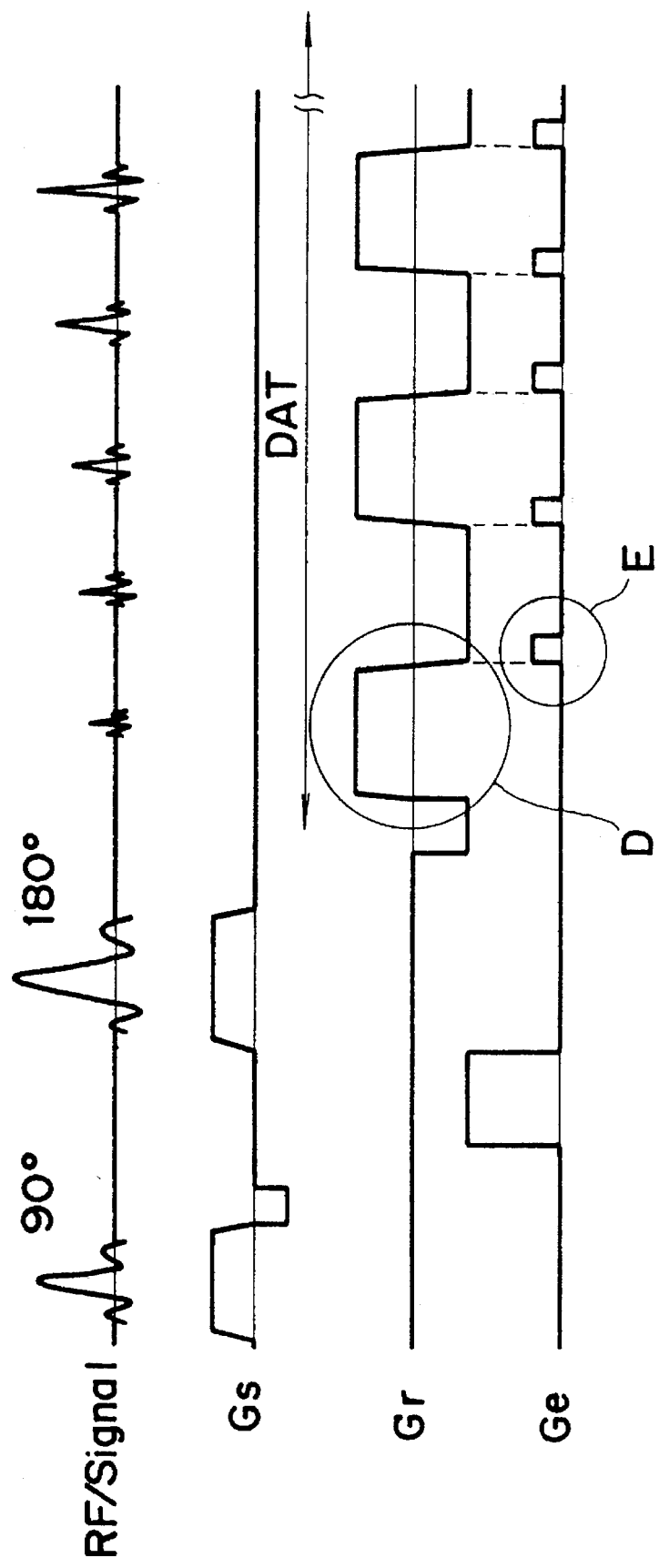
FIG. 24 is a pulse sequence timing chart for a one shot ultra high speed MRI pulse sequence.
Figure 25:
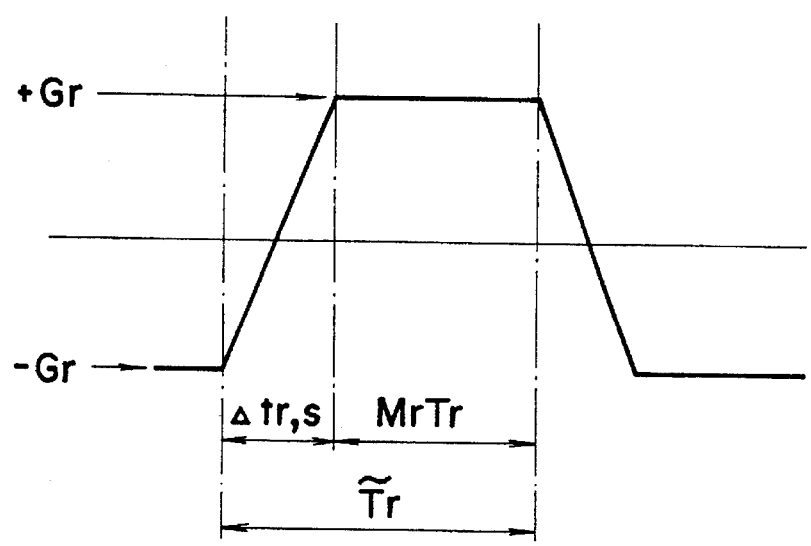
FIG. 25 is an enlarged view of an encircled portion D in the one shot ultra high speed MRI pulse sequence of FIG. 24, showing a reading pulse.
Figure 26:
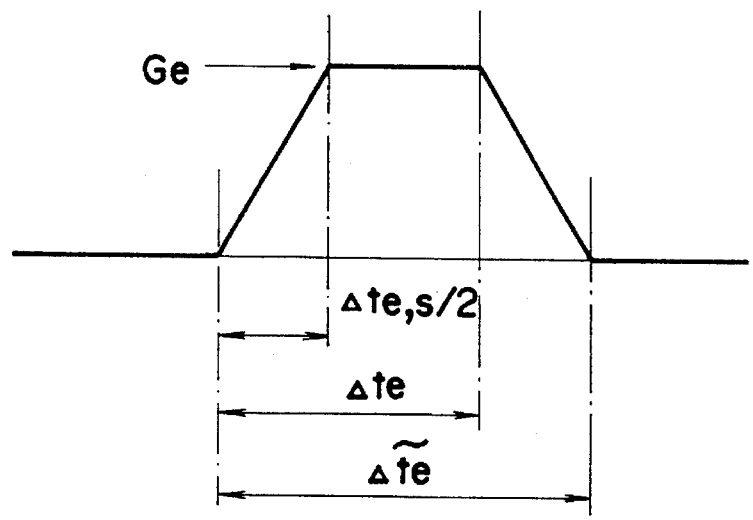
FIG. 26 is an enlarged view of an encircled portion E in the one shot ultra high speed MRI pulse sequence of FIG. 24, showing an encoding pulse.

In this one shot ultra high speed MRI pulse sequence shown in FIG. 24, each reading pulse enclosed within a circle D has a detail view as shown in FIG. 25, while each encoding pulse enclosed within a circle E has a detail view as shown in FIG. 26.

Now, as indicated in FIG. 25, a reading switching period $\tilde{T}r$ can be expressed by the following equation (123).

$$\tilde{T}r = \Delta tr, s + Mr \cdot Tr \qquad (123)$$

where:

$\Delta tr, s$: a reading switching time $Tr$: a reading time $Mr$: a reading time margin rate The reading switching time $\Delta tr, s$ represents a time required from switching the reading gradient magnetic field from $-Gr$ to $+Gr$, or vice versa, and can be expressed by the following equation (124).

$$\Delta tr, s \approx 2 Lr \frac{Ir}{Vmax} \qquad (124)$$

where:

$Ir$: a reading current $Vmax$: a maximum multi-filer output voltage $Lr$: a reading gradient coil inductance The reading time $Tr$ represents a time for carrying out the actual reading operation, and can be expressed by the following equation (125).

$$Tr = \frac{2\pi}{\gamma Gr \Delta xr} \qquad (125)$$

where:

$Gr$: a reading gradient magnetic field strength $\Delta xr$: a spatial resolution requirement in a reading direction (a reading direction pixel size)

$\gamma$: a magnetic moment of a proton nucleus

Here, $Gr$ and $Lr$ can be expressed by the following equations (126) and (127).

$$Gr = kr \cdot Nt, r \cdot Ir \qquad (126)$$

$$Lr = Nmf, r^{\beta 2} \cdot Ntf, r^{\alpha} \cdot L0, r \qquad (127)$$

where:

$kr$: a gradient magnetic field strength per each coil turn in the reading gradient coil with 1 Amp current supply (which depends only on the geometrical structure of the gradient coils)

$L0, r$: a reading gradient coil inductance per each coil turn $Nt, r$: a total number of coil turns in the reading gradient coil $Nmf, r$: a number of multi-filers for the reading gradient coil $Ntf, r$: a number of coil turns in the reading gradient coil per each filer $\alpha$: an index of $Ntf, r$ dependency for $Lr$ (corresponding to a dependency of the inductance on a number of coil turns connected in series)

$\beta$: an index of $Nmf, r$ dependency for $Lr$ (corresponding to a dependency of the inductance on a number of the multi-filers provided in parallel)

In general, $\alpha$ and $\beta$ can be set as indicated by the following equations (128) when the magnetic coupling among the coil turns of the reading gradient coil is complete.

$$\alpha = 2, \beta = 1 \qquad (128)$$

On the other hand, $\alpha$ and $\beta$ can be set as indicated by the following inequalities (129) when the magnetic coupling among the coil turns of the reading gradient coil is incomplete.

$$\alpha < 2, \beta < 1 \qquad (129)$$

In addition, $Ntf, r$ can be expressed by the following equation (130).

$$Ntf, r = \frac{Nt, r}{Nmf, r} \qquad (130)$$

Consequently, from the equations (127) and (130), $Lr$ can be rewritten as the following equation (131).

$$Lr = Nmf^{\beta 2 - \alpha} \cdot Nt, r^{\alpha} \cdot L0, r \qquad (131)$$

On the other hand, by eliminating $Gr$ and $Tr$ from the equations (123), (125), and (126), $Nt, r$ can be expressed by the following equation (132).

$$Nt, r = \frac{2 \pi Mr}{\gamma kr \Delta xr (\tilde{T}r - \Delta tr, s) Ir} \qquad (132)$$

Then, by eliminating $Nt, r$ and $Lr$ from the equations (124), (131), and (132), the following equation (133) can be obtained.

$$\Delta tr, s \cdot (\tilde{T}r - \Delta tr, s)^{\alpha} = \qquad (133)$$

$$\frac{2 \cdot Ir^{1-\alpha}}{Vmax} \cdot Nmf, r^{\beta - \alpha} \cdot \left( \frac{2 \pi Mr}{\gamma kr \Delta xr} \right)^{\alpha} \cdot L0, r$$

Now, by regarding the left hand side of the equation (133) as a function of $\Delta tr, s$, it can be seen that this left hand side takes the maximum value when $\Delta tr, s$ satisfies the following equation (134) and the maximum value in that case can be expressed by the following expression (135).

$$\Delta tr, s = \frac{\tilde{T}r}{1 + \alpha} \qquad (134)$$

$$\frac{\alpha^{\alpha}}{(1 + \alpha)^{1+\alpha}} \cdot \tilde{T}r^{1+\alpha} \qquad (135)$$

Furthermore, $\Delta tr, s$ obviously must satisfy the following condition (136).

$$0 \leq \Delta tr, s \leq \tilde{T}r \qquad (136)$$

Now, the optimization of the reading current $Ir$ will be considered first.

Figure 27:
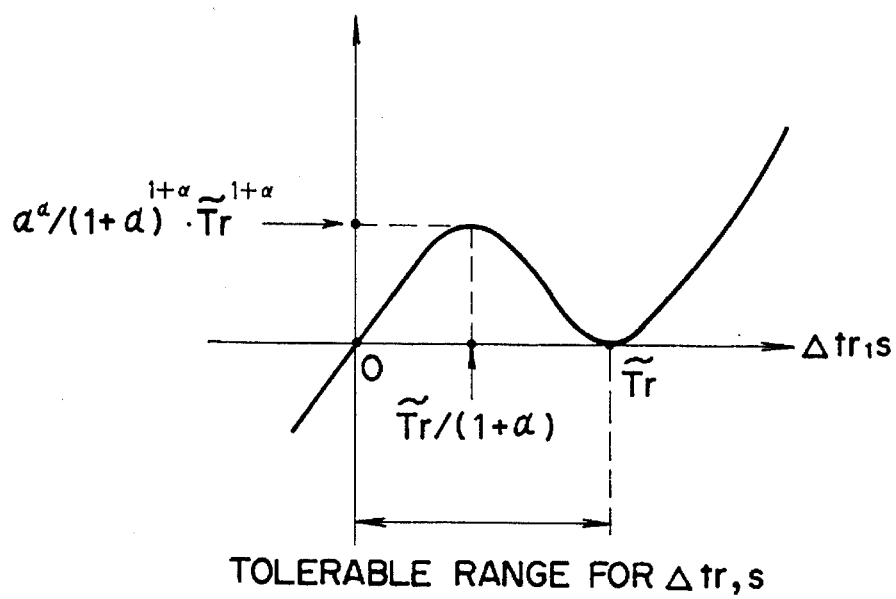
FIG. 27 is a graph of a value of a left hand side of an equation (133) as a function of a reading switching time in the reading pulse of FIG. 25.
Figure 28:
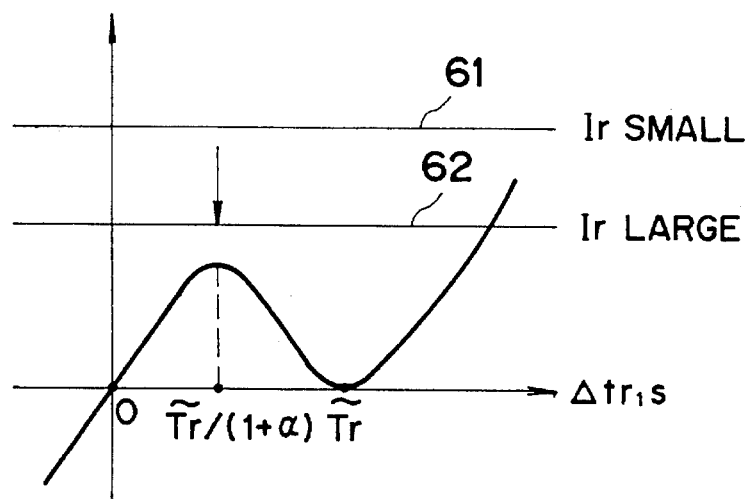
FIG. 28 is a graph of a value of a left hand side of an equation (133) as a function of a reading switching time in the reading pulse of FIG. 25, with indications of the values of the right hand side of the equation (133) for two difference values of a reading current.

Namely, the behavior of the left hand side of the equation (133) can be depicted as shown in FIG. 27. On the other hand, the value of the right hand side of the equation (133) can be indicated with respect to the value of the left hand side by the line parallel to the $\Delta tr, s$ axis, such as lines 61 and 62 indicated in FIG. 28 for the cases of $Ir$ small and large, respectively, for example.

The existence of $\Delta tr, s$ which can satisfy both the equation (133) and the condition (136) implies that a function on the left hand side of the equation (133) and a function on the right hand side of the equation (133) have an intersection within a range given by the condition (136). In this regard, it can be seen from the equation (133) and FIG. 28 that, for the larger $Ir$, the intersection can be found for smaller $\tilde{T}r$, i.e., for smaller number of multi-filers $Nmf, r$ and smaller reading direction pixel size $\Delta xr$.

Consequently, the maximum value $It, max$ of $Ir$ can be expressed by the following equation (137).

$$Ir, max = (1 - ur) Imax \qquad (137)$$

where:

ur: a relative strength of a reading eddy current magnetic field (total of all components)

Imax: a maximum multi-filer output current

Thus, it is sufficient to consider $\Delta tr,s$ which can satisfy the following equation (138) instead of the equation (133).

$$\Delta tr,s \cdot (\tilde{T}r - \Delta tr,s)^\alpha = \quad (138)$$
$$Ar \cdot (1 - ur)^{1-\alpha} \cdot Imax^{1-\alpha} \cdot Vmax^{-1} \cdot Nmf,r^{\beta-\alpha} \cdot \Delta xr^{-\alpha}$$

where:

$$Ar = 2 \cdot L0,r \cdot \left( \frac{2\pi Mr}{\gamma kr} \right)^\alpha \quad (139)$$

Next, on a basis of this equation (138), the optimization of each of $\tilde{T}r$, $Nmf,r$ and $\Delta xr$ will be considered.

Figure 29:
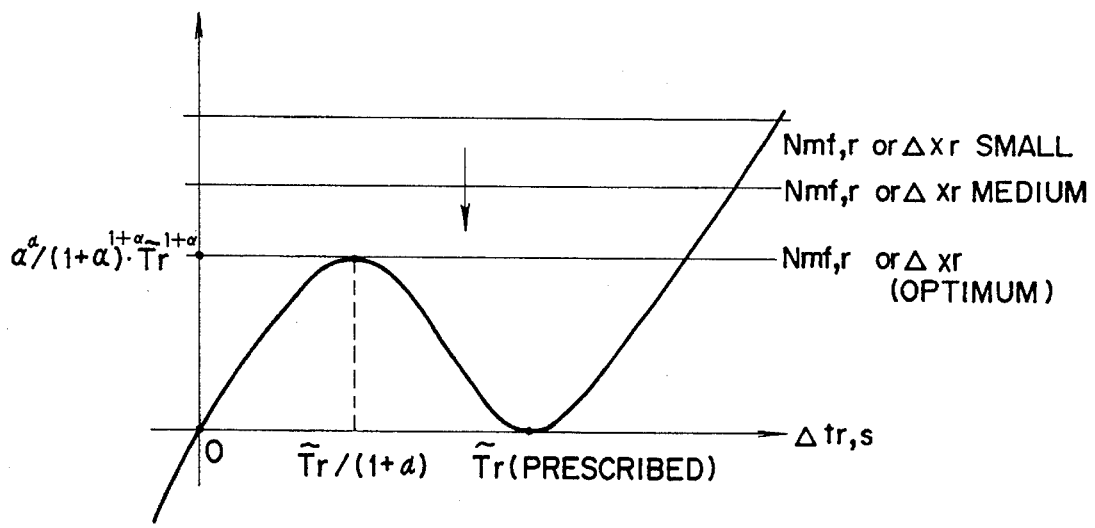
FIG. 29 is a graph of a value of a left hand side of an equation (133) as a function of a reading switching time in the reading pulse of FIG. 25, with indications of the values of the right hand side of the equation (133) for three difference values of a number of multi-filers or a spatial resolution.

Namely, as indicated in FIG. 29, the value of the right hand side of the equation (138) for different settings of $Nmf,r$ or $\Delta xr$ can be indicated with respect to the value of the left hand side of the equation (138) by the line parallel to the $\Delta tr,s$ axis.

The existence of $\Delta tr,s$ which can satisfy both the equation (138) and the condition (136) implies that a function on the left hand side of the equation (138) and a function on the right hand side of the equation (138) must have an intersection within a range given by the equation (136). In this regard, it can be seen from the equation (138) and FIG. 29 that the minimum value of $Nmf,r$ for the prescribed values of $\tilde{T}r$ and $\Delta xr$, or the minimum value of $\Delta xr$ for the prescribed values of $\tilde{T}r$ and $Nmf,r$ can be found at a point at which a function on the left hand side of the equation (138) and a function on the right hand side of the equation (138) have a single intersection, i.e., a point at which the left hand side has the maximum value.

Figure 30:
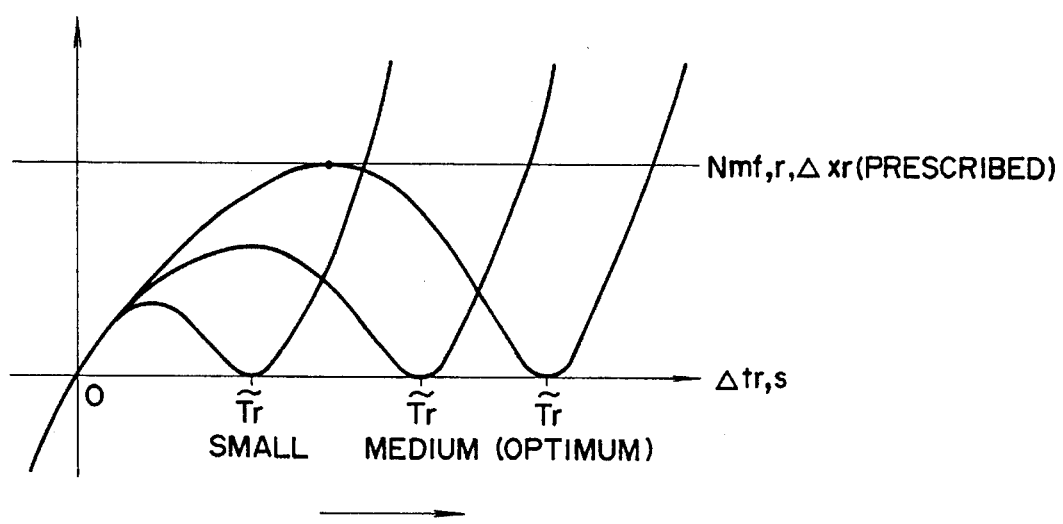
FIG. 30 is a graph of a value of a left hand side of an equation (133) as a function of a reading switching time in the reading pulse of FIG. 25, for three different reading switching periods, with an indication of the values of the right hand side of the equation (133) for given values of a number of multi-filers or a spatial resolution.

On the other hand, as indicated in FIG. 30, the value of the right hand side of the equation (138) for the prescribed settings of $Nmf,r$ and $\Delta xr$ can be indicated with respect to the value of the left hand side of the equation (138) for various different $\tilde{T}r$ settings, by the line parallel to the $\Delta tr,s$ axis, and it can be seen from the equation (138) and FIG. 30 that the minimum value of $\tilde{T}r$ for the prescribed values of $Nmf,r$ and $\Delta xr$ can also be found at a point at which a function on the left hand side of the equation (138) and a function on the right hand side of the equation (138) have a single intersection, i.e., a point at which the left hand side has the maximum value.

Consequently, it can be concluded that the optimum settings for $\tilde{T}r$, $Nmf,r$, and $\Delta xr$ all satisfy the following equation (140), which can easily be obtained by substituting the expression (135) into the equation (138).

$$\frac{\alpha^\alpha}{(1+\alpha)^{1+\alpha}} \tilde{T}r^{1+\alpha} = \quad (140)$$
$$Ar \cdot (1 - ur)^{1-\alpha} \cdot Imax^{1-\alpha} \cdot Vmax^{-1} \cdot Nmf,r^{\beta-\alpha} \cdot \Delta xr^{-\alpha}$$

Now, on the other hand, the relationship between the data acquisition time DAT in the one shot ultra high speed MRI pulse sequence and $\tilde{T}r$ can be expressed by the following equation (141).

$$\tilde{T}r = \frac{DAT}{Ne} = \frac{\Delta xe}{Xe} \cdot DAT \quad (141)$$

where:

Ne: a number of encoding steps (a number of imaging matrices in the encoding direction)

Xe: a size of a field of view in the encoding direction $\Delta xe$: a spatial resolution requirement in the encoding direction Thus, it can easily be seen that the optimum settings of DAT and $\Delta xe$ satisfy the following equation (142) obtained by substituting the equation (141) into the equation (140).

$$\frac{\alpha^\alpha}{(1+\alpha)^{1+\alpha}} \left( \frac{\Delta xe}{Xe} \right)^{1+\alpha} \cdot DAT^{1+\alpha} = \quad (142)$$
$$Ar \cdot (1 - ur)^{1-\alpha} \cdot Imax^{1-\alpha} \cdot Vmax^{-1} \cdot Nmf,r^{\beta-\alpha} \cdot \Delta xr^{-\alpha}$$

Thus, by appropriately rewriting this equation (142), the expressions for the optimum settings of the system parameters DAT, $Nmf,r$, $\Delta xr$, and $\Delta xe$ can be obtained as follows.

(1) The minimum data acquisition time DAT for a given number of the multi-filers $Nmf,r$ and given spatial resolution requirements $\Delta xr$ and $\Delta xe$ can be expressed by the following equation (143).

$$DAT = \left( \frac{(1+\alpha)^{1+\alpha}}{\alpha^\alpha} Ar \right)^{\frac{1}{1+\alpha}} \cdot (1 - ur)^{\frac{1-\alpha}{1+\alpha}} \cdot \quad (143)$$
$$Imax^{\frac{1-\alpha}{1+\alpha}} \cdot Vmax^{\frac{-1}{1+\alpha}} \cdot Xe \cdot Nmf,r^{\frac{\beta-\alpha}{1+\alpha}} \cdot$$
$$re^{-1} \cdot \Delta xr^{-\frac{1+2\alpha}{1+\alpha}}$$

where:

$$re = \frac{\Delta xe}{\Delta xr} \quad (144)$$

Note here that re=2 in a case of using a half encoding scheme.

(2) The minimum number of the multi-filers $Nmf,r$ for given spatial resolution requirements $\Delta xr$ and $\Delta xe$, and a desired data acquisition time DAT can be expressed by the following equation (145).

$$Nmf,r = \left( \frac{(1+\alpha)^{1+\alpha}}{\alpha^\alpha} Ar \right)^{\frac{1}{\alpha-\beta}} \cdot (1 - ur)^{\frac{1-\alpha}{\alpha-\beta}} \cdot \quad (145)$$
$$Imax^{\frac{1-\alpha}{\alpha-\beta}} \cdot Vmax^{\frac{-1}{\alpha-\beta}} \cdot Xe^{\frac{1+\alpha}{\alpha-\beta}} \cdot$$
$$re^{-\frac{1+\alpha}{\alpha-\beta}} \cdot \Delta xr^{-\frac{1+2\alpha}{\alpha-\beta}} \cdot DAT^{-\frac{1+\alpha}{\alpha-\beta}}$$

(3) The maximum spatial resolution, i.e., minimum $\Delta xr$ and $\Delta xe$, for a given number of the multi-filers $Nmf,r$ and a desired data acquisition time DAT can be expressed by the following equations (146) and (147), respectively.

$$\Delta xr = re^{-\frac{1+\alpha}{1+2\alpha}} \cdot \left( \frac{(1+\alpha)^{1+\alpha}}{\alpha^\alpha} Ar \right)^{\frac{1}{1+2\alpha}} \cdot \quad (146)$$
$$(1 - ur)^{\frac{1-\alpha}{1+2\alpha}} \cdot Imax^{\frac{1-\alpha}{1+2\alpha}} \cdot Vmax^{\frac{-1}{1+2\alpha}} \cdot Xe^{\frac{1+\alpha}{1+2\alpha}} \cdot$$
$$Nmf,r^{\frac{\beta-\alpha}{1+2\alpha}} \cdot DAT^{-\frac{1+\alpha}{1+2\alpha}}$$

$$\Delta xe = re \cdot \Delta xr \quad (147)$$
$$= re^{\frac{\alpha}{1+2\alpha}} \cdot \left( \frac{(1+\alpha)^{1+\alpha}}{\alpha^\alpha} Ar \right)^{\frac{1}{1+2\alpha}} \cdot$$
$$(1 - ur)^{\frac{1-\alpha}{1+2\alpha}} \cdot Imax^{\frac{1-\alpha}{1+2\alpha}} \cdot Vmax^{\frac{-1}{1+2\alpha}} \cdot Xe^{\frac{1+\alpha}{1+2\alpha}} \cdot$$
$$Nmf,r^{\frac{\beta-\alpha}{1+2\alpha}} \cdot DAT^{-\frac{1+\alpha}{1+2\alpha}}$$

Accordingly, the various gradient coil configuration conditions suitable for optimizing these system parameters $Nmf,r$, DAT, $\Delta xr$, and $\Delta xe$ as described above can be given by the following equations (148) to (153).

[Reading gradient magnetic field strength $Gr$]

$$Gr = \left(\frac{1+\alpha}{\alpha}\right)\left(\frac{2\pi}{\gamma}\right)\frac{Mr \cdot Xe}{DAT \cdot \Delta xr \, \Delta xe} \quad (148)$$

[Switching time $\Delta tr,s$]

$$\Delta tr,s = \frac{1}{1+\alpha} \cdot \bar{Tr} = \frac{1}{1+\alpha} \cdot \frac{DAT \cdot \Delta xe}{Xe} \quad (149)$$

[Total number of coil turns $Nt,r$]

$$\begin{aligned}
Nt,r &= \frac{Gr}{kr \cdot (1-ur) \, Imax} \\
&= \left(\frac{1+\alpha}{\alpha}\right)\left(\frac{2\pi}{\gamma}\right)\frac{Mr \cdot Xe}{kr(1-ur) \, Imax \cdot DAT \cdot \Delta xr \, \Delta xe}
\end{aligned} \quad (150)$$

[Number of coil turns per each filer (channel) $Ntf,r$]

$$Ntf,r = \frac{Nt,r}{Nmf,r} \quad (151)$$

[Effective inductance per each filer (channel) $Lr$]

$$\begin{aligned}
Lr &= Nmf,r^{\beta-\alpha} \cdot Nt,r^{\alpha} \cdot L0,r \\
&= \frac{\Delta tr,s}{2} \cdot \frac{Vmax}{(1-ur) \, Imax} \\
&= \frac{1}{2(1+\alpha)} \cdot \frac{Vmax \cdot DAT \cdot \Delta xe}{(1-ur) \, Imax \cdot Xe}
\end{aligned} \quad (152)$$

[Rate of change of the gradient field in time $dB/dt$]

$$\begin{aligned}
\frac{dB}{dt} &= \frac{2 \, Gr \, \hat{x}r}{\Delta tr,s} \\
&= \frac{(1+\alpha)^2}{\alpha}\left(\frac{4\pi}{\gamma}\right)\frac{Mr \, \hat{x}r \, Xe^2}{DAT^2 \cdot \Delta xr \, \Delta xe^2}
\end{aligned} \quad (153)$$

where:

$\hat{x}r$: a coordinate of $dB/dt$ measurement point

It is to be noted here that the number of coil turns according to each of the equations (150) and (151) is given as a real number in general, so that the actual number of coil turns to be used in the physical gradient coil configuration will be a nearest integer approximating that real number.

It is also to be noted that $Nt,r$ has an upper limit due to a limited amount of available space in practice, while $dB/dt$ also has an upper limit in view of the influence on the living body. Then, it can be seen from the equations (150) and (153) that these upper limits give rise to certain tolerable ranges for DAT, $\Delta xr$, and $\Delta xe$. Consequently, the settings of DAT, $\Delta xr$, and $\Delta xe$ should be made by taking these tolerable ranges into account.

It is further to be noted that the optimum settings described above may not necessarily be observed strictly, and the settings made within any practically tolerable ranges of these optimum settings may be used for the similar effects.

Next, referring to FIG. 31, one embodiment of the method for optimum setting of system parameters for a reading pulse sequence in the divisional scanning ultra high speed MRI pulse sequence will be described.

Here, the system parameters to be optimized includes: the number of the divided scans to be carried out; the number of the multi-filers to be used; the spatial resolution to be achieved; and the data acquisition time to be realized.

More specifically, in this embodiment, any one of the following optimizations of the system parameters is to be achieved.

(1) Minimizing the data acquisition time for a given number of the divided scans, a given number of the multi-filers, and a given spatial resolution requirement.

(2) Minimizing the number of the multi-filers for a given number of the divided scans, a given spatial resolution requirement, and a desired data acquisition time.

(3) Maximizing the spatial resolution for a given number of the divided scans, a given number of the multi-filers, and a desired data acquisition time.

(4) Minimizing the number of the divided scans for a given number of the multi-filers, a given spatial resolution requirement, and a desired data acquisition time.

Here, which one of the above four optimizations of the system parameters is to be realized is a matter of a design choice.

Figure 31:
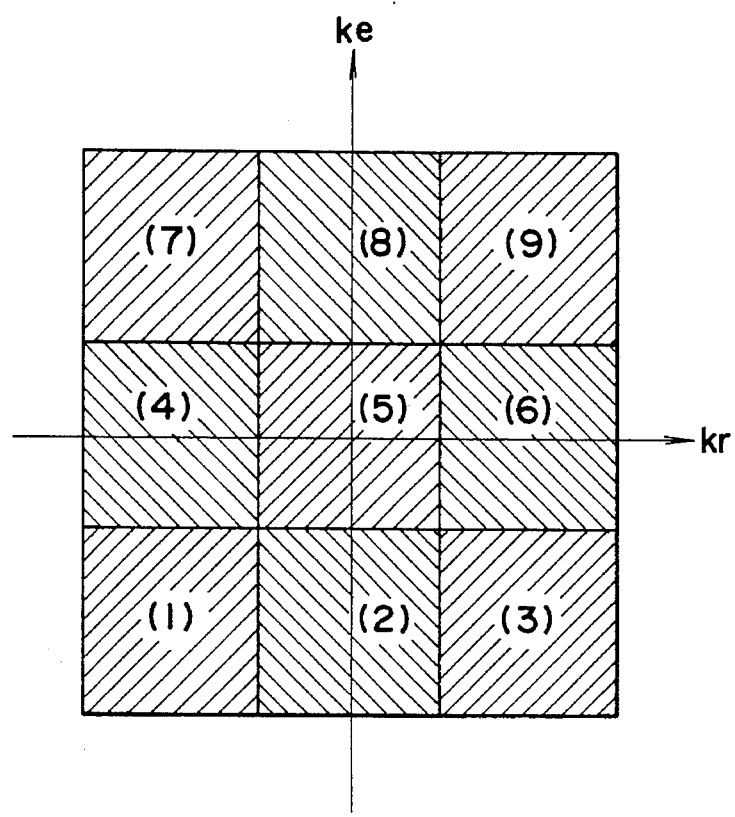
FIG. 31 is a diagram illustrating a manner of divisions of a spatial frequency space (k-space) in a divisional scanning ultra high speed MRI pulse sequence.

In this case of the divisional scanning ultra high speed MRI pulse sequence, the same analysis as that described above for a case of the one shot ultra high speed MRI pulse sequence is valid with the following re-definitions for $\Delta xr$ and $\Delta xe$.

$$\Delta xr \rightarrow ND,r \cdot \Delta xr \quad (154)$$

$$\Delta xe \rightarrow ND,e \cdot \Delta xe \quad (155)$$

where:

$ND,r$: a number of divisions in the reading direction $ND,e$: a number of divisions in the encoding direction In a case the divided scans are to be carried out according to the division of the spatial frequency space (k-space) in the reading direction (kr) and the encoding direction (ke) as shown in FIG. 31, both $ND,r$ and $ND,e$ are set to be three, for example.

Thus, the optimum setting condition for this case of the divisional scanning ultra high speed MRI pulse sequence can be expressed by the following equation (156) obtained by rewriting the equation (142) using these re-definitions (154) and (155).

$$\frac{\alpha^{\alpha}}{(1+\alpha)^{1+\alpha}} \left(\frac{ND,e \cdot \Delta xe}{Xe}\right)^{1+\alpha} \cdot DAT^{1+\alpha} = \quad (156)$$

$$Ar \cdot (1-ur)^{1-\alpha} \cdot Imax^{1-\alpha} \cdot Vmax^{-1} \cdot Nmf,r^{\beta-\alpha} \cdot (ND,r \, \Delta xr)^{-\alpha}$$

Now, a total number of divided scans $Nex$ can be expressed by the following equation (157).

$$Nex = ND,r \cdot ND,e \quad (157)$$

Consequently, using this equation (157) in the equation (156) to eliminate $ND,e$, the following equation (158) can be obtained.

$$\frac{\alpha^{\alpha}}{(1+\alpha)^{1+\alpha}} \cdot Nex^{1+\alpha} \cdot \left(\frac{\Delta xe}{Xe}\right)^{1+\alpha} \cdot DAT^{1+\alpha} = \quad (158)$$

$$Ar \cdot (1-ur)^{1-\alpha} \cdot Imax^{1-\alpha} \cdot Vmax^{-1} \cdot Nmf,r^{\beta-\alpha} \cdot ND,r \cdot \Delta xr^{-\alpha}$$

Now, when $Nex$ is a constant, i.e., when the imaging time is constant, it can be seen from the equation (158) that each of the system parameters DAT, $Nmf,r$, $\Delta xr$, and $\Delta xe$ becomes smaller for the smaller $ND,r$. In other words, these system parameters can be optimized when $ND,r = 1$. This is because the number of switchings ($Nex/ND,e$) during the same data acquisition time becomes smallest when $ND,r = 1$, so that the loss time due to the switching can be minimized in this case.

Thus, by appropriately rewriting this equation (158) with $ND,r = 1$, the expressions for the optimum settings of the system parameters DAT, $Nmf,r$, $\Delta xr$, and $\Delta xe$ can be obtained as follows.

(1) The minimum data acquisition time DAT for a given number of the divided scans $Nex$, a given number of the multi-filers $Nmf,r$, and a given spatial resolution requirements $\Delta xr$ and $\Delta xe$ can be expressed by the following equation (159).

$$DAT = Nex^{-1} \cdot \left( \frac{(1+\alpha)^{1+\alpha}}{\alpha^\alpha} Ar \right)^{\frac{1}{1+\alpha}} \cdot \tag{159}$$

$$(1-ur)^{\frac{1-\alpha}{1+\alpha}} \cdot Imax^{\frac{1-\alpha}{1+\alpha}} \cdot Vmax^{\frac{-1}{1+\alpha}} \cdot Xe \cdot$$

$$Nmf,r^{\frac{\beta-\alpha}{1+\alpha}} \cdot re^{-1} \cdot \Delta xr^{\frac{1+2\alpha}{1+\alpha}}$$

where:

$$re = \frac{\Delta xe}{\Delta xr} \tag{160}$$

(2) The minimum number of the multi-filers $Nmf,r$ for a given number of the divided scans $Nex$, a given spatial resolution requirements $\Delta xr$ and $\Delta xe$, and a desired data acquisition time $DAT$ can be expressed by the following equation (161).

$$Nmf,r = Nex^{\frac{1+\alpha}{\beta-\alpha}} \cdot \left( \frac{(1+\alpha)^{1+\alpha}}{\alpha^\alpha} Ar \right)^{\frac{1}{\alpha-\beta}} \cdot \tag{161}$$

$$(1-ur)^{\frac{1-\alpha}{\alpha-\beta}} \cdot Imax^{\frac{1-\alpha}{\alpha-\beta}} \cdot Vmax^{\frac{-1}{\alpha-\beta}} \cdot Xe^{\frac{1+\alpha}{\alpha-\beta}} \cdot$$

$$re^{-\frac{1+\alpha}{\alpha-\beta}} \cdot \Delta xr^{-\frac{1+2\alpha}{\alpha-\beta}} \cdot DAT^{-\frac{1+\alpha}{\alpha-\beta}}$$

(3) Maximizing the spatial resolution, i.e., minimum $\Delta xr$ and $\Delta xe$, for a given number of the divided scans $Nex$, a given number of the multi-filers $Nmf,r$, and a desired data acquisition time $DAT$ can be expressed by the following equations (162) and (163).

$$\Delta xr = Nex^{-\frac{1+\alpha}{1+2\alpha}} \cdot re^{-\frac{1+\alpha}{1+2\alpha}} \cdot \tag{162}$$

$$\left( \frac{(1+\alpha)^{1+\alpha}}{\alpha^\alpha} Ar \right)^{\frac{1}{1+2\alpha}} \cdot (1-ur)^{\frac{1-\alpha}{1+2\alpha}} \cdot$$

$$Imax^{\frac{1-\alpha}{1+2\alpha}} \cdot Vmax^{\frac{-1}{1+2\alpha}} \cdot Xe^{\frac{1+\alpha}{1+2\alpha}} \cdot$$

$$Nmf,r^{\frac{\beta-\alpha}{1+2\alpha}} \cdot DAT^{-\frac{1+\alpha}{1+2\alpha}}$$

$$\Delta xe = re \cdot \Delta xr \tag{163}$$

$$= Nex^{-\frac{1+\alpha}{1+2\alpha}} \cdot re^{\frac{\alpha}{1+2\alpha}} \cdot$$

$$\left( \frac{(1+\alpha)^{1+\alpha}}{\alpha^\alpha} \right)^{\frac{1}{1+2\alpha}} \cdot (1-ur)^{\frac{1-\alpha}{1+2\alpha}} \cdot$$

$$Imax^{\frac{1-\alpha}{1+2\alpha}} \cdot Vmax^{\frac{-1}{1+2\alpha}} \cdot Xe^{\frac{1+\alpha}{1+2\alpha}} \cdot$$

$$Nmf,r^{\frac{\beta-\alpha}{1+2\alpha}} \cdot DAT^{-\frac{1+\alpha}{1+2\alpha}}$$

Accordingly, the various gradient coil configuration conditions suitable for optimizing these system parameters $Nmf,r$, $DAT$, $\Delta xr$, and $\Delta xe$ as described above can be given by the following equations (164) to (169).

[Reading gradient magnetic field strength $Gr$]

$$Gr = \left( \frac{1+\alpha}{\alpha} \right) \left( \frac{2\pi}{\gamma} \right) \frac{Mr \cdot Xe}{Nex \cdot DAT \cdot \Delta xr \cdot \Delta xe} \tag{164}$$

[Switching time $\Delta tr,s$]

$$\Delta tr,s = \frac{1}{1+\alpha} \cdot \frac{Nex \cdot DAT \cdot \Delta xe}{Xe} \tag{165}$$

-continued

[Total number of coil turns $Nt,r$]

$$Nt,r = \left( \frac{1+\alpha}{\alpha} \right) \cdot \left( \frac{2\pi}{\gamma} \right) \cdot \tag{166}$$

$$\frac{Mr \cdot Xe}{kr(1-ur) Imax \cdot Nex \cdot DAT \cdot \Delta xr \cdot \Delta xe}$$

[Number of coil turns per each filer (channel) $Ntf,r$]

$$Ntf,r = \frac{Nt,r}{Nmf,r} \tag{167}$$

[Effective inductance per each filer (channel) $Lr$]

$$Lr = \frac{1}{2(1+\alpha)} \cdot \frac{Vmax \cdot Nex \cdot DAT \cdot \Delta xe}{(1-ur) Imax \cdot Xe} \tag{168}$$

[Rate of change of the gradient field in time $dB/dt$]

$$\frac{dB}{dt} = \frac{(1+\alpha)^2}{\alpha} \left( \frac{4\pi}{\gamma} \right) \frac{Mr \hat{x}r Xe^2}{Nex^2 \cdot DAT^2 \cdot \Delta xr \cdot \Delta xe^2} \tag{169}$$

It is to be noted here that the same remarks as those given above for the case of the one shot ultra high speed MRI pulse sequence regarding the integer approximation of $Nt,r$ and $Ntf,r$, and the upper limits for $Nt,r$ and $dB/dt$ are also applicable in this case of the divisional scanning ultra high speed MRI pulse sequence.

It is also to be noted here that the equation (158) can be rewritten for the number of the divided scans $Nex$, so that the optimization of $Nex$ (imaging time) with respect to the other system parameters $DAT$, $Nmf,r$, $\Delta xr$, and $\Delta xe$ can be achieved similarly.

It is further to be noted that the optimum settings described above may not necessarily be observed strictly, and the settings made within any practically tolerable ranges of these optimum settings may be used for the similar effects.

Next, referring to FIG. 32 and FIG. 33, one embodiment of the method for optimum setting of system parameters for a reading pulse sequence in the MRA pulse sequence shown in FIG. 32 will be described.

Here, the system parameters to be optimized includes: the number of the multi-filers to be used; the reading direction spatial resolution to be achieved; and the echo time to be realized.

More specifically, in this embodiment, any one of the following optimizations of the system parameters is to be achieved.

(1) Minimizing the echo time for a given number of the multi-filers and a given reading direction spatial resolution requirement.

(2) Minimizing the number of the multi-filers for a given reading direction spatial resolution requirement and a desired echo time.

(3) Maximizing the reading direction spatial resolution for a given number of the multi-filers and a desired echo time.

Here, which one of the above three optimizations of the system parameters is to be realized is a matter of a design choice.

Figure 32:
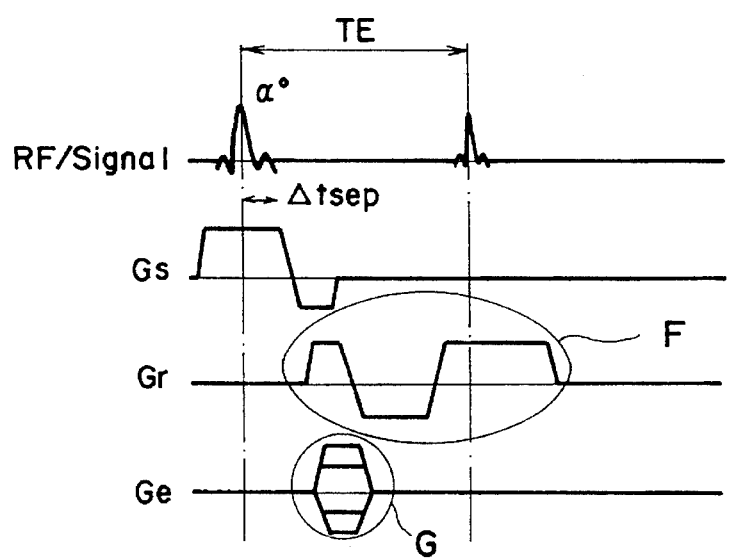
FIG. 32 is a pulse sequence timing chart for a nuclear magnetic resonance angiography pulse sequence.
Figure 33:
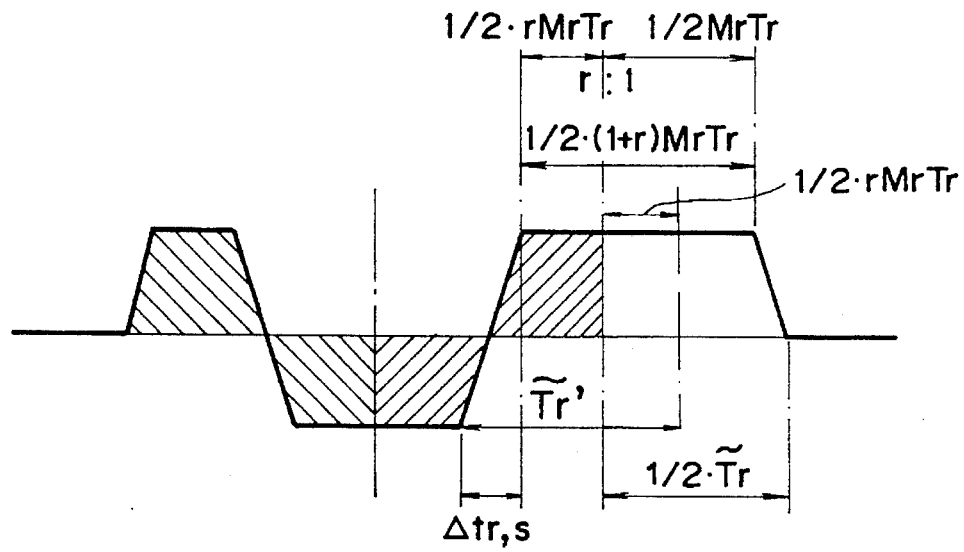
FIG. 33 is an enlarged view of an encircled portion F in the nuclear magnetic resonance angiography pulse sequence of FIG. 32, showing a reading pulse.

In this MRA pulse sequence shown in FIG. 32, each reading pulse enclosed within a circle F has a detail view as shown in FIG. 33.

Here, the reading pulse shown in FIG. 33 is for a case of a first degree flow compensation, in which each of two differently shaded regions has a substantially equal area. In addition, it accounts for an asymmetric read sampling such that the negative side and the positive side have the reading time ratio equal to $r:1$ as indicated in FIG. 33. It should be obvious from FIG. 33 that the reading switching period $\bar{T}r$ (for r=1), the number of multi-filers Nmf,r, and the reading direction spatial resolution Δxr satisfy the equation (140), just as in the case of the one shot ultra high speed MRI pulse sequence described above.

On the other hand, according to FIG. 32 and FIG. 33, the echo time TE can be expressed approximately by the following equation (170).

$$i\ TE \approx \Delta tsep + (2) \cdot (\Delta tr,s + r\ Mr\ Tr) \tag{170}$$

where:

r: an asymmetric reading time ratio

Δtsep: a time loss due to α° selective excitation pulse (a period during which the reading gradient magnetic fields cannot be applied)

Note here that the factor of (2) in the second term on the right hand side of this equation (170) is required because of the first degree flow compensation, so that this factor can be dropped in a case of making no first degree flow compensation.

In addition, it can also be seen that the following equation (171) can be obtained from FIG. 33.

$$\bar{T}r' = \Delta tr,s + r \cdot Mr \cdot Tr \tag{171}$$

Now, comparing this equation (171) with the equation (123) for the case of the one shot ultra high speed MRI pulse sequence described above, it can be seen that $\bar{T}r'$ in the equation (171) corresponds to $\bar{T}r'$ in the equation (123) and rMr in the equation (171) corresponds to Mr in the equation (123), so that the following equation (172) can be obtained from the equations (170) and (171).

$$\left(\frac{1}{2^{1+\alpha}}\right) \cdot \frac{\alpha^\alpha}{(1+\alpha)^{1+\alpha}} \cdot (TE - \Delta tsep)^{1+\alpha} = \tag{172}$$

$$r^\alpha \cdot Ar \cdot (1-ur)^{1-\alpha} \cdot Imax^{1-\alpha} \cdot Vmax^{-1} \cdot Nmf,r^{\beta-\alpha} \cdot \Delta xr^{-\alpha}$$

Thus, by appropriately rewriting this equation (172), the expressions for the optimum settings of the system parameters TE, Nmf,r, and Δxr can be obtained as follows.

(1) The minimum echo time TE for a given number of the multi-filers Nmf,r and a given reading direction spatial resolution requirement Δxr can be expressed by the following equation (173).

$$TE = \Delta tsep + (2) \cdot \left(\frac{(1+\alpha)^{1+\alpha}}{\alpha^\alpha} r^\alpha \cdot Ar\right)^{\frac{1}{1+\alpha}} \cdot \tag{173}$$

$$(1-ur)^{\frac{1-\alpha}{1+\alpha}} \cdot Imax^{\frac{1-\alpha}{1+\alpha}} \cdot Vmax^{\frac{-1}{1+\alpha}} \cdot$$

$$Nmf,r^{\frac{\beta-\alpha}{1+\alpha}} \cdot \Delta xr^{-\frac{\alpha}{1+\alpha}}$$

(2) The minimum number of the multi-filers Nmf,r for given reading direction spatial resolution requirement Δxr, and a desired echo time TE can be expressed by the following equation (174).

$$Nmf,r = (2^{\frac{1+\alpha}{\alpha-\beta}}) \cdot \left(\frac{(1+\alpha)^{1+\alpha}}{\alpha^\alpha} r^\alpha \cdot Ar\right)^{\frac{1}{\alpha-\beta}} \cdot \tag{174}$$

$$(1-ur)^{\frac{1-\alpha}{\alpha-\beta}} \cdot Imax^{\frac{1-\alpha}{\alpha-\beta}} \cdot Vmax^{\frac{-1}{\alpha-\beta}} \cdot$$

$$(TE - \Delta tsep)^{-\frac{1+\alpha}{\alpha-\beta}} \cdot \Delta xr^{-\frac{\alpha}{\alpha-\beta}}$$

(3) The maximum reading direction spatial resolution, i.e., minimum Δxr, for a given number of the multi-filers Nmf,r and a desired echo time TE can be expressed by the following equation (175).

$$\Delta xr = (2^{\frac{1+\alpha}{\alpha}}) \cdot \left(\frac{(1+\alpha)^{1+\alpha}}{\alpha^\alpha} r^\alpha \cdot Ar\right)^{\frac{1}{\alpha}} \cdot \tag{175}$$

$$(1-ur)^{\frac{1-\alpha}{\alpha}} \cdot Imax^{\frac{1-\alpha}{\alpha}} \cdot Vmax^{-\frac{1}{\alpha}} \cdot$$

$$(TE - \Delta tsep)^{-\frac{1+\alpha}{\alpha}} \cdot Nmf,r^{\frac{\beta-\alpha}{\alpha}}$$

Accordingly, the various gradient coil configuration conditions suitable for optimizing these system parameters Nmf,r, TE, and Δxr as described above can be given by the following equations (176) to (181).

[Reading gradient magnetic field strength Gr]

$$Gr = (2) \cdot \left(\frac{1+\alpha}{\alpha}\right) \cdot \left(\frac{2\pi}{\gamma}\right) \frac{r \cdot Mr}{\Delta xr \cdot (TE - \Delta tsep)} \tag{176}$$

[Switching time Δtr,s]

$$\Delta tr,s = \left(\frac{1}{2}\right) \cdot \frac{1}{1+\alpha} \cdot (TE - \Delta tsep) \tag{177}$$

[Total number of coil turns Nt,r]

$$Nt,r = (2) \cdot \left(\frac{1+\alpha}{\alpha}\right) \cdot \left(\frac{2\pi}{\gamma}\right) \cdot \tag{178}$$

$$\frac{r \cdot Mr}{kr\ (1-ur)\ Imax \cdot \Delta xr \cdot (TE - \Delta tsep)}$$

[Number of coil turns per each filer (channel) Ntf,r]

$$Ntf,r = \frac{Nt,r}{Nmf,r} \tag{179}$$

[Effective inductance per each filer (channel) Lr]

$$Lr = \left(\frac{1}{2}\right) \cdot \frac{1}{2(1+\alpha)} \cdot \frac{Vmax \cdot (TE - \Delta tsep)}{(1-ur)\ Imax} \tag{180}$$

[Rate of change of the gradient field in time dB/dt]

$$\frac{dB}{dt} = (2^2) \cdot \frac{(1+\alpha)^2}{\alpha} \cdot \left(\frac{4\pi}{\gamma}\right) \cdot \frac{r \cdot Mr\ xr}{\Delta xr \cdot (TE - \Delta tsep)^2} \tag{181}$$

It is to be noted here that the same remarks as those given above for the case of the one shot ultra high speed MRI pulse sequence regarding the integer approximation of Nt,r and Ntf,r, and the upper limits for Nt,r and dB/dt are also applicable in this case of the MRA pulse sequence.

It is further to be noted that the optimum settings described above may not necessarily be observed strictly, and the settings made within any practically tolerable ranges of these optimum settings may be used for the similar effects.

Next, referring to FIG. 26 and FIG. 34, one embodiment of the method for optimum setting of system parameters for a phase encoding pulse sequence to be used in the ultra high speed MRI and the MRA pulse sequences will be described.

Here, the system parameters to be optimized includes: the number of the multi-filers to be used; the amount of encoding permitted (a number of encoding steps); and the encoding pulse width necessary.

More specifically, in this embodiment, any one of the following optimizations of the system parameters is to be achieved.

(1) Minimizing the encoding pulse width for a given number of the multi-filers, and a given amount of encoding.

(2) Minimizing the number of the multi-filers for a given amount of encoding and a given encoding pulse width.

(3) Maximizing the amount of encoding for a given number of the multi-filers and a given encoding pulse width.

Here, which one of the above three optimizations of the system parameters is to be realized is a matter of a design choice.

Figure 34:
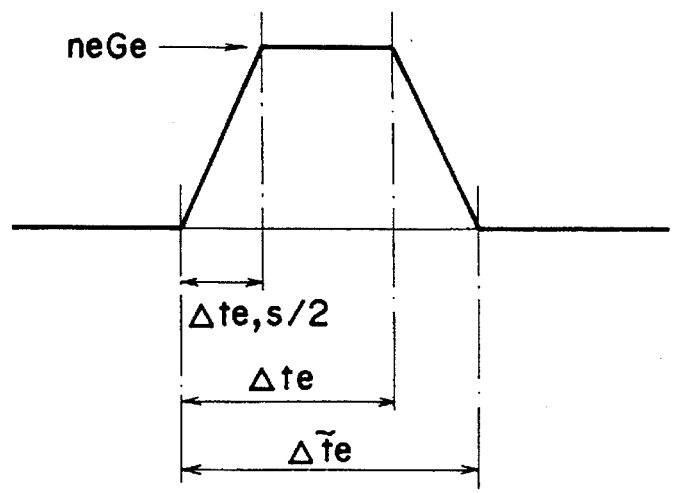
FIG. 34 is an enlarged view of an encircled portion G in the nuclear magnetic resonance angiography pulse sequence of FIG. 32, showing an encoding pulse.

In the MRA pulse sequence shown in FIG. 32, each encoding pulse enclosed within a circle G has a detail view as shown in FIG. 34. It is also to be noted that, in the one shot ultra high speed MRI pulse sequence shown in FIG. 24, each encoding pulse enclosed within a circle E has a detail view as shown in FIG. 26 which is analoguous to that shown in FIG. 34. In the following, the description will be given in terms of the quantities indicated in FIG. 34 as an example, although the similar description given in terms of the quantities indicated in FIG. 26 is also valid similarly.

It should be obvious from FIG. 34 that the encoding pulse width $\Delta \bar{t}e$ can be expressed by the following equation (182).

$$\Delta \bar{t}e = \frac{1}{2}\Delta te,s + \Delta te \tag{182}$$

where:

$\Delta te,s$: an encoding switching time $\Delta te$: an encoding input pulse width (rectangular)

The encoding switching time $\Delta te,s$ represents a time required from switching the encoding gradient magnetic field from $-ne \cdot Ge$ to $+ne \cdot Ge$, or vice versa, and can be expressed by the following equation (183).

$$\frac{1}{2}\Delta te,s \approx 2 \left( \frac{Le}{2} \right) \frac{Ie}{Vmax} \tag{183}$$

where:

Ie: an encoding current

Vmax: a maximum multi-filer output voltage

Le: an encoding gradient coil inductance

On the other hand, the encoding input pulse width $\Delta te$ can be expressed by the following equation (184).

$$\Delta te = \frac{2\pi}{\gamma Ge Xe} \tag{184}$$

where:

Ge: an encoding gradient magnetic field strength per each encoding step

Xe: a size of a field of view in an encoding direction $\gamma$: a magnetic moment of a proton nucleus Moreover, Ge and Le can be expressed by the following equations (185) and (186).

$$ne \, Ge = ke \cdot Nt,e \cdot Ie \tag{185}$$

$$\frac{Le}{2} \approx Nmf,e^{\beta} \cdot Ntf,e^{\alpha} \cdot \frac{L0,e}{2} \tag{186}$$

where:

ne: a number of encoding steps ke: a gradient magnetic field strength per each coil turn in the encoding gradient coil with 1 Amp current supply (which depends only on the geometrical structure of the gradient coils)

L0,e: an encoding gradient coil inductance per each coil turn

Nt,e: a total number of coil turns in the encoding gradient coil

Nmf,e: a number of multi-filers for the encoding gradient coil

Ntf,e: a number of coil turns in the encoding gradient coil per each filer $\alpha$: an index of Ntf,e dependency for Le (corresponding to a dependency of the inductance on a number of coil turns connected in series)

$\beta$: an index of Nmf,e dependency for Le (corresponding to a dependency of the inductance on a number of the multi-filers provided in parallel)

Now, in comparison of these equations with the corresponding equations for a case of the reading pulse sequence in the one shot ultra high speed MRI pulse sequence described above, it can easily be seen that the following correspondences among the parameters in these two cases can be established.

| Reading pulse | Encoding pulse |
|---|---|
| $\bar{T}r$ | $\Delta \bar{t}e$ |
| $\Delta tr, s$ | $(\frac{1}{2})\Delta te, s$ |
| MrTr | $\Delta te$ |
| Gr | Ge |
| Axr | Xe |
| kr | (ke/ne) |
| L0, r | $(\frac{1}{2})$L0, e |

It can also easily be seen that the other parameters are substantially the equivalent except for the difference in their suffix ",r" and ",e".

Thus, the optimum setting condition for this case of the phase encoding pulse sequence can be expressed by the Following equation (187) obtained by rewriting the equation (140) using these correspondences of the parameters.

$$\frac{\alpha^{\alpha}}{(1+\alpha)^{1+\alpha}} \Delta te^{1+\alpha} = Ae \cdot (1-ue)^{1-\alpha} \cdot Imax^{1-\alpha} \cdot \tag{187}$$

$$Vmax^{-1} \cdot Xe^{-\alpha} \cdot ne^{\alpha} \cdot Nmf,e^{\beta-\alpha}$$

where:

$$Ae = L0,e \left( \frac{2\pi}{\gamma ke} \right)^{\alpha} \tag{188}$$

Thus, by appropriately rewriting this equation (187), the expressions for the optimum settings of the system parameters $\Delta \bar{t}e$, Nmf,e, and ne can be obtained as follows.

(1) The minimum encoding pulse width $\Delta \bar{t}e$ for a given number of the multi-filers Nmf,e, and a given amount of encoding ne can be expressed by the following equation (189).

$$\Delta \bar{t}e = \left( \frac{(1+\alpha)^{1+\alpha}}{\alpha^{\alpha}} Ae \right)^{\frac{1}{1+\alpha}} \cdot (1-ue)^{\frac{1-\alpha}{1+\alpha}} \cdot \tag{189}$$

$$Imax^{\frac{1-\alpha}{1+\alpha}} \cdot Vmax^{-\frac{1}{1+\alpha}} \cdot Xe^{-\frac{\alpha}{1+\alpha}} \cdot$$

$$ne^{\frac{\alpha}{1+\alpha}} \cdot Nmf,e^{\frac{\beta-\alpha}{1+\alpha}}$$

(2) The minimum number of the multi-filers Nmf,e for a given amount of encoding ne and a given encoding pulse width $\Delta \bar{t}e$ can be expressed by the following equation (190).

$$Nmf,e = \left( \frac{(1+\alpha)^{1+\alpha}}{\alpha^{\alpha}} Ae \right)^{\frac{1}{\alpha-\beta}} \cdot (1-ue)^{\frac{1-\alpha}{\alpha-\beta}} \cdot \tag{190}$$

$$Imax^{\frac{1-\alpha}{\alpha-\beta}} \cdot Vmax^{\frac{-1}{\alpha-\beta}} \cdot Xe^{-\frac{\alpha}{\alpha-\beta}} \cdot$$

$$ne^{\frac{\alpha}{\alpha-\beta}} \cdot \Delta \bar{t}e^{-\frac{1+\alpha}{\alpha-\beta}}$$

(3) The maximum amount of encoding ne for a given number of the multi-filers Nmf,e and a given encoding pulse width $\Delta \bar{t}e$ can be expressed by the following equation (191).

$$ne = \left( \frac{(1+\alpha)^{1+\alpha}}{\alpha^\alpha} Ae \right)^{-\frac{1}{\alpha}} \cdot (1-ue)^{\frac{\alpha-1}{\alpha}} \cdot \qquad (191)$$

$$Imax^{\frac{\alpha-1}{\alpha}} \cdot Vmax^{\frac{1}{\alpha}} \cdot Xe \cdot Nmf,e^{\frac{\alpha-\beta}{\alpha}} \cdot \tilde{\Delta te}^{\frac{1+\alpha}{\alpha}}$$

Accordingly, the various gradient coil configuration conditions suitable for optimizing these system parameters $\tilde{\Delta te}$, $Nmf,e$, and $ne$ as described above can be given by the following equations (192) to (196).

[Encoding gradient magnetic field strength $Ge$ (for $ne$ steps)]

$$ne\, Ge = \left( \frac{1+\alpha}{\alpha} \right) \cdot \left( \frac{2\pi}{\gamma} \right) \cdot \frac{ne}{Xe \cdot \tilde{\Delta te}} \qquad (192)$$

[Switching time $\Delta te,s$]

$$\frac{\Delta te,s}{2} = \frac{1}{1+\alpha} \cdot \tilde{\Delta te} \qquad (193)$$

[Total number of coil turns $Nt,e$]

$$Nt,e = \left( \frac{1+\alpha}{\alpha} \right)\left( \frac{2\pi}{\gamma} \right) \frac{1}{ke\,(1-ue)\,Imax \cdot Xe \cdot \tilde{\Delta te}} \qquad (194)$$

[Number of coil turns per each filer (channel) $Ntf,e$]

$$Ntf,e = \frac{Nt,e}{Nmf,e} \qquad (195)$$

[Effective inductance per each filer (channel) $Le$]

$$Le = \frac{1}{(1+\alpha)} \cdot \frac{Vmax \cdot \tilde{\Delta te}}{(1-ue)\,Imax} \qquad (196)$$

It is to be noted here that the same remarks as those given above for the case of the one shot ultra high speed MRI pulse sequence regarding the integer approximation of $Nt,r$ and $Ntf,r$, and the upper limit for $Nt,r$ are also applicable for the corresponding $Nt,e$ and $Ntf,e$ in this case of the encoding pulse sequence.

It is further to be noted that the optimum settings described above may not necessarily be observed strictly, and the settings made within any practically tolerable ranges of these optimum settings may be used for the similar effects.

It is also to be noted here that the situations of various embodiments for various different imaging pulse sequences described above may be co-existent in a practical case. In such a case, it suffices to adopt the most severe conditions among the various conditions obtained for each of these co-existing situations.

Thus, according to the various embodiments of the present invention described in this section, it becomes possible to provide a method for optimum setting of various gradient coil system parmeters for various imaging pulse sequences to be used in a nuclear magnetic resonance imaging.

OPTIMIZATION OF GRADIENT COIL SYSTEM UNDER GIVEN GRADIENT COIL CONFIGURATION

Now, various embodiments of the method for optimum setting of various system parameters for each imaging pulse sequence under the given gradient coil configuration will be described in detail.

First, one embodiment of the method for optimum setting of system parameters under the given gradient coil configuration for a reading pulse sequence in the one shot ultra high speed MRI pulse sequence will be described.

Here, the system parameters to be optimized includes: the spatial resolution to be achieved; and the data acquisition time to be realized.

More specifically, in this embodiment, any one of the following optimizations of the system parameters is to be achieved.

(1) Minimizing the data acquisition time for a given spatial resolution requirement, under the given gradient coil configuration.

(2) Maximizing the spatial resolution for a desired data acquisition time, under the given gradient coil configuration.

Here, which one of the above two optimizations of the system parameters is to be realized is a matter of a design choice. In the following, the case of (1) will be described in detail as an example.

Now, as already described above, the reading switching period $\tilde{Tr}$ can be expressed by the equation (123), while the reading switching time $\Delta tr,s$ and the reading time $Tr$ can be expressed by the equations (124) and (125), respectively.

Then, using these equations (123), (124), and (125), the following equation (197) can be obtained.

$$\tilde{Tr} = 2\,Lr\,\frac{Ir}{Vmax} + \frac{2\pi Mr}{\gamma\,kr\,\Delta xr\,Nt,r} \cdot \frac{1}{Ir} \qquad (197)$$

Now, regarding $\tilde{Tr}$ as a function of $Ir$, the optimum reading current $Ir,opt$ for minimizing $\tilde{Tr}$ can be expressed by the following equation (198).

$$Ir,opt = \left( \frac{\pi\,Mr\,Vmax}{\gamma\,kr\,\Delta xr\,Nt,r\,Lr} \right)^{0.5} \qquad (198)$$

In this case, the optimum setting $\tilde{Tr},opt$ corresponding to this $Ir,opt$ can be expressed by the following equation (199).

$$\tilde{Tr},opt = 2 \cdot \left( \frac{4\pi\,Mr\,Lr}{\gamma\,kr\,\Delta xr\,Nt,r\,Vmax} \right)^{0.5} \qquad (199)$$

Then, the optimum data acquisition time $DAT,opt$ in the one shot ultra high speed MRI pulse sequence can be expressed by the following equation (200).

$$\begin{aligned} DAT,opt &= Ne \cdot \tilde{Tr},opt \\ &= \frac{2\,Xe}{\Delta xe} \left( \frac{4\pi\,Mr\,Lr}{\gamma\,kr\,\Delta xr\,Nt,r\,Vmax} \right)^{0.5} \end{aligned} \qquad (200)$$

In other words when the reading current $Ir$ is set to be the optimum reading current $Ir,opt$ according to the equation (198), it becomes possible to minimize the data acquisition time $DAT$ for given spatial resolution requirements $\Delta xr$ and $\Delta xe$ in the one shot ultra high speed MRI pulse sequence under the given gradient coil configuration.

Here, however, there is an exception when $Ir,opt$ is greater than the maximum reading current $It,max$ given by the equation (137), i.e., the following inequality (201) holds.

$$Ir,opt > (1-ur)Imax \qquad (201)$$

This exception is obviously necessary because, in such an exceptional case, It is physically impossible to supply $Ir,opt$ expressed by the equation (200) by the available multi-filers. Consequently, the minimum data acquisition time $DAT$ for the given spatial resolution requirements $\Delta xr$ and $\Delta xe$ in the one shot ultra high speed MRI pulse sequence under the given gradient coil configuration can be obtained by $Ir$ expressed by the following equation (202) in such an exceptional case.

$$Ir = (1-ur)Imax \tag{202}$$

Accordingly, in such an exceptional case, the minimum data acquisition time DAT in the one shot ultra high speed MRI pulse sequence can be expressed by the following equation (203).

$$DAT = \frac{Xe}{\Delta xe} \left( \frac{2 Lr}{Vmax} (1-ur) Imax + \frac{2 \pi Mr}{\gamma \, kr \, \Delta xr \, Nt,r} \cdot \frac{1}{(1-ur) Imax} \right) \tag{203}$$

Moreover, in a case of adopting the half encoding scheme, the spatial resolution requirement $\Delta xe$ can be expressed by the following equation (204).

$$\Delta Xe = 2 \cdot \Delta xr \tag{204}$$

Thus, in such a case, the optimum reading current $Ir,opt$ is the same as that expressed by the equation (198), the minimum data acquisition time DAT in the one shot ultra high speed MRI pulse sequence can be substantially one half of those given by the equations (200) or (203).

It is to be noted here that, by rewriting the equation (197) for $\Delta xr$, the maximum spatial resolution requirement $\Delta xr$ with respect to the given data acquisition time DAT can be determined in a similar manner.

It is further to be noted that the optimum settings described above may not necessarily be observed strictly, and the settings made within any practically tolerable ranges of these optimum settings may be used for the similar effects.

Next, one embodiment of the method for optimum setting of system parameters under the given gradient coil configuration for a reading pulse sequence in the divisional scanning ultra high speed MRI pulse sequence will be described.

Here, the system parameters to be optimized includes: the number of the divided scans to be carried out; the spatial resolution to be achieved; and the data acquisition time to be realized.

More specifically, in this embodiment, any one of the following optimizations of the system parameters is to be achieved.

(1) Minimizing the data acquisition time for a given number of the divided scans, and a given spatial resolution requirement, under the given gradient coil configuration.

(2) Maximizing the spatial resolution for a given number of the divided scans, and a desired data acquisition time, under the given gradient coil configuration.

(3) Minimizing the number of the divided scans for a given spatial resolution requirement, and a desired data acquisition time, under the given gradient coil configuration.

Here, which one of the above three optimizations of the system parameters is to be realized is a matter of a design choice.

In this case, the data acquisition time DAT in a case of using the reading current Ir can be expressed by the following equation (205).

$$DAT = \frac{Xe}{ND,e \, \Delta xe} \cdot \left( \frac{2 Lr}{Vmax} Ir + \frac{2 \pi Mr}{\gamma \, kr \, ND,r \, \Delta xr \, Nt,r} \cdot \frac{1}{Ir} \right) \tag{205}$$

Then, the optimum reading current $Ir,opt$ for minimizing this DAT can be expressed by the following equation (206).

$$Ir,opt = \left( \frac{\pi Mr \, Vmax}{\gamma \, kr \, ND,r \, \Delta xr \, Nt,r \, Lr} \right)^{0.5} \tag{206}$$

Then, the optimum data acquisition time $DAT,opt$ in the divisional scanning ultra high speed MRI pulse sequence can be expressed by the following equation (207).

$$DAT,opt = \frac{2 Xe}{ND,e \, \Delta xe} \cdot \left( \frac{4 \pi Mr \, Lr}{\gamma \, kr \, ND,r \, \Delta xr \, Nt,r \, Vmax} \right)^{0.5} \tag{207}$$

Here, using the equation (157) in this equation (207), the following equation (208) can be obtained.

$$DAT,opt = \frac{2 Xe}{Nex \cdot \Delta xe} \cdot \left( \frac{4 \pi Mr \, Lr \cdot ND,r}{\gamma \, kr \, \Delta xr \, Nt,r \, Vmax} \right)^{0.5} \tag{208}$$

Now, when Nex is a constant, i.e., when the imaging time is constant, it can be seen from the equation (208) that each of the system parameter $DAT,opt$ becomes smallest for the smallest $ND,r=1$. In other words, for the given DAT, when $ND,r=1$, Nex becomes minimum. This is because the number of switchings (Nex/ND,e) during the same data acquisition time becomes smallest when $ND,r=1$, so that the loss time due to the switching can be minimized in this case.

When the inequality (201) holds, however, the minimum data acquisition time DAT for the divisional scanning ultra high speed MRI pulse sequence under the given gradient coil configuration can be obtained by Ir according to the equation (202), just as in the case of the one shot ultra high speed MRI pulse sequence described above, and the minimum DAT in such a case can be expressed by the following equation (209).

$$DAT = \frac{Xe}{ND,e \, \Delta xe} \cdot \left( \frac{2 Lr}{Vmax} (1-ur) Imax + \frac{2 \pi Mr}{\gamma \, kr \, ND,r \, \Delta xr \, Nt,r} \cdot \frac{1}{(1-ur) Imax} \right) \tag{209}$$

It is to be noted here that, by rewriting the equation (205) for $\Delta xe$, the maximum spatial resolution requirement is $\Delta xe$ with respect to the given data acquisition time DAT can be determined in a similar manner.

It is further to be noted that the optimum settings described above may not necessarily be observed strictly, and the settings made within any practically tolerable ranges of these optimum settings may be used for the similar effects.

Next, one embodiment of the method for optimum setting of system parameters under the given gradient coil configuration for a reading pulse sequence in the MRA pulse sequence will be described.

Here, the system parameters to be optimized includes: the reading direction spatial resolution to be achieved; and the echo time to be realized.

More specifically, in this embodiment, any one of the following optimizations of the system parameters is to be achieved.

(1) Minimizing the echo time for a given reading direction spatial resolution requirement under the given gradient coil configuration.

(2) Maximizing the reading direction spatial resolution for a desired echo time under the given gradient coil configuration.

Here, which one of the above two optimizations of the system parameters is to be realized is a matter of a design choice. In the following, the case of (1) will be described in detail as an example.

As already described above, the reading pulse shown in FIG. 33 is for a case of a first degree flow compensation, in which each of two differently shaded regions has a substantially equal area. In addition, it accounts for an asymmetrical reading sampling such that the negative side and the positive side have the reading time ratio equal to r:1. as indicated in FIG. 33.

Here, the echo time TE can be expressed approximately by the following equation (210).

$$TE \approx (2) \cdot \left( 2 \frac{Lr}{Vmax} Ir + 2 \cdot \frac{1}{2} rMrTr \right) + \Delta tsep \quad (210)$$

Note here that the factor of (2) in the first term on the right hand side of this equation (210) is required because of the first degree flow compensation, so that this factor can be dropped in a case of making no first degree flow compensation.

In addition, using the relationships of the equations (127) and (128) in the equation (210), the following equation (211) can be obtained.

$$TE = (2) \cdot \left( 2 \frac{Lr}{Vmax} Ir + \frac{2\pi r Mr}{\gamma kr \Delta xr Nt,r} \cdot \frac{1}{Ir} \right) + \Delta tsep \quad (211)$$

Then, by regarding this TE as a function of Ir, the optimum reading current Ir,opt for minimizing TE can be expressed by the following equation (212).

$$Ir,opt = \left( \frac{\pi r Mr Vmax}{\gamma kr \Delta xr Nt,r Lr} \right)^{0.5} \quad (212)$$

In this case, the optimum setting TE,opt corresponding to this Ir,opt can be expressed by the following equation (213).

$$TE,opt = (2) \cdot 2 \left( \frac{4\pi r Mr Lr}{\gamma kr \Delta xr Nt,r Vmax} \right)^{0.5} + \Delta tsep \quad (213)$$

When the inequality (201) holds, however, the minimum each time TE for the MRA pulse sequence under the given gradient coil configuration can be obtained by Ir according to the equation (202), just as in the case of the one shot ultra high speed MRI pulse sequence described above, and the minimum TE in such a case can be expressed by the following equation (214).

$$TE = (2) \cdot \left( 2 \frac{Lr}{Vmax} (1-ur) Imax + \frac{2\pi r Mr}{\gamma kr \Delta xr Nt,r} \cdot \frac{1}{(1-ur) Imax} \right) + \Delta tsep \quad (214)$$

It is to be noted here that, by rewriting the equation (211) for $\Delta xr$, the maximum spatial resolution requirement $\Delta xr$ with respect to the given echo time TE can be determined in a similar manner.

It is further to be noted that the optimum settings described above may not necessarily be observed strictly, and the settings made within any practically tolerable ranges of these optimum settings may be used for the similar effects.

Next, one embodiment of the method for optimum setting of system parameters under the given gradient coil configuration for a phase encoding pulse sequence to be used in the ultra high speed MRI and the MRA pulse sequences will be described.

Here, the system parameters to be optimized includes: the amount of encoding permitted (a number of encoding steps); and the encoding pulse width necessary.

More specifically, in this embodiment, any one of the following optimizations of the system parameters is to be achieved.

(1) Minimizing the encoding pulse width for a given amount of encoding under the given gradient coil configuration.

(2) Maximizing the amount of encoding for a given encoding pulse width under the given gradient coil configuration.

Here, which one of the above two optimizations of the system parameters is to be realized is a matter of a design choice. In the following, the case of (1) will be described in detail as an example.

Now, each encoding pulse shown in FIG. 34 is an encoding pulse with the amount of encoding equal to $ne \cdot \gamma Ge \Delta te$, and according to the equation (184), the size of a field of view in an encoding direction Xe can be expressed by the following equation (215) in this case.

$$Xe = \frac{2\pi}{\gamma Ge \Delta te} \quad (215)$$

Also, as already described above, according to FIG. 34, the encoding pulse width $\Delta te$ can be expressed by the equation (182), while the encoding switching time $\Delta te,s$ and the encoding gradient magnetic field strength per each encoding step Ge can be expressed by the equations (183) and (185), respectively.

Thus, using the equations (215), (183), and (185) to rewrite the equation (182), the following equation (216) can be obtained.

$$\tilde{\Delta te} = Le \frac{Ie}{Vmax} + \frac{ne \cdot 2\pi}{\gamma ke Xe Nt,e} \cdot \frac{1}{Ie} \quad (216)$$

Then, by regarding this $\tilde{\Delta te}$ as a function of Ie, the optimum encoding current Ie,opt for minimizing $\tilde{\Delta te}$ can be expressed by the following equation (217).

$$Ie,opt = \left( \frac{ne \cdot 2\pi Vmax}{\gamma ke Xe Nt,e Le} \right)^{0.5} \quad (217)$$

In this case, the optimum setting $\tilde{\Delta te},opt$ corresponding to this Ie,opt can be expressed by the following equation (218).

$$\tilde{\Delta te},opt = 2 \cdot \left( \frac{ne \cdot 2\pi \cdot Le}{\gamma ke Xe Nt,e Vmax} \right)^{0.5} \quad (218)$$

Here, however, there is an exception when Ie,opt is greater than the maximum encoding current Imax, i.e., the following inequality (219) holds.

$$Ie,opt > (1-ue) \cdot Imax \quad (219)$$

This is obviously because, in such an exceptional case, it is physically impossible to supply Ie,opt expressed by the equation (217) by the available multi-filers. Consequently, the minimum encoding pulse width $\Delta te$ in the phase encoding pulse sequence for a given amount of encoding under the given gradient coil configuration can be obtained by Ir expressed by the following equation (220) in such an exceptional case.

$$Ie = (1-ue) Imax \quad (220)$$

where:
ue: a relative strength of an encoding eddy current magnetic field (total of all components)

Accordingly, in such an exceptional case, the minimum encoding pulse width $\tilde{\Delta te}$ in the phase encoding pulse sequence can be expressed by the following equation (221).

$$\tilde{\Delta te} = \frac{Le}{Vmax} (1-ue) \cdot Imax + \frac{ne \cdot 2\pi}{\gamma ke Xe Nt,e} \cdot \frac{1}{(1-ue) \cdot Imax} \quad (221)$$

Here, the typical value of the number of encoding steps ne for the divisional scanning ultra high speed MRI pulse sequence can be expressed by the following equation (222) in terms of the number of divisions in the encoding direction ND,e.

$$ne = ND,e \qquad (222)$$

On the other hand, the typical value of the number of encoding steps ne for the MRA pulse sequence can be expressed by the following equation (223) in terms of the number of matrices in the encoding directions Ne.

$$ne = \frac{Ne}{2} \qquad (223)$$

It is to be noted here that, by rewriting the equation (216) for ne, the maximum amount of encoding ne with respect to the given encoding pulse width $\Delta te$ can be determined in a similar manner.

It is further to be noted that the optimum settings described above may not necessarily be observed strictly, and the settings made within any practically tolerable ranges of these optimum settings may be used for the similar effects.

Thus, according to the embodiments of the present invention described in this section, it becomes possible to provide a method for optimum setting of various system parameters for various imaging pulse sequences under the given gradient coil configuration to be used in a nuclear magnetic resonance imaging.

In summary, the various embodiments of the method for optimum setting of various system parmeters for various imaging pulse sequences to be used in a nuclear magnetic resonance imaging according to the present invention can be expressed collectively as follows.

In the method for optimum setting of various system parameters for various imaging pulse sequences to be used in a nuclear magnetic resonance imaging according to the present invention, any one of the following system parameters can be optimized.

Nmf: a number of multi-filers for driving gradient coils,
DAT: a data acquisition time,
$\Delta xr$: a spatial resolution requirement in a reading direction,
$\Delta xe$: a spatial resolution requirement in an encoding direction,
ND,r: a number of divided scans in a reading direction,
ND,e: a number of divided scans in an encoding direction,
TE: an echo time,
ne: a number of encoding steps, and
$\Delta te$: an encoding pulse width, The optimum setting of these system parameters can be determined to be that for which the following equation (224) is satisfied by these system parameters.

$$\alpha^\alpha/(1+\alpha)^{1+\alpha} \cdot \Delta T^{1+\alpha} = A \cdot LO \cdot (\gamma \cdot k)^{-\alpha} \cdot (1-u)^{1-\alpha} \cdot Imax^{1-\alpha} \cdot Vmax^{-1} \cdot Nmf^{\beta-\alpha} \cdot \Delta x^{-\alpha} \qquad (224)$$

where:
$\alpha$: an index of dependency of a gradient coil inductance on a number of coil turns connected in series,
$\beta$: an index of dependency of a gradient coil inductance on a number of the multi-filers provided in parallel,
$\gamma$: a magnetic moment of a proton nucleus,
k: a gradient magnetic field strength per each coil turn in a gradient coil with 1 Amp current supply,
L0: a gradient coil inductance per each coil turn,
u: a relative strength of an eddy current magnetic field,
Imax: a maximum multi-filer output current,
Vmax: a maximum multi-filer output voltage,
Nmf: a number of multi-filers for a gradient coil, $\Delta T$:
(1) for a reading pulse sequence in a one shot ultra high speed nuclear magnetic resonance imaging pulse sequence,
$\Delta T = DAT \cdot \Delta xe/Xe$
where Xe: a size of a field of view in an encoding direction,
(2) for a reading pulse sequence in a divisional scanning ultra high speed nuclear magnetic resonance imaging pulse sequence,
$\Delta T = DAT \cdot ND,e \cdot \Delta xe/Xe$
(3) for a reading pulse sequence in a nuclear magnetic resonance angiography pulse sequence,
$\Delta T = (TE - \Delta tsep)/2$
with a first degree flow compensation
$\Delta T = (TE - \Delta tsep)$
without a first degree flow compensation
where $\Delta tsep$: a loss time due to RF pulse,
(4) for an encoding pulse sequence,
$\Delta T = \Delta te$ $\Delta x$:
(1) for a reading pulse sequence in a one shot ultra high speed nuclear magnetic resonance imaging pulse sequence,
$\Delta x = \Delta xr$
(2) for a reading pulse sequence in a divisional scanning ultra high speed nuclear magnetic resonance imaging pulse sequence,
$\Delta x = ND,r \cdot \Delta xr$
(3) for a reading pulse sequence in a nuclear magnetic resonance angiography pulse sequence,
$\Delta x = \Delta xr$
(4) for an encoding pulse sequence,
$\Delta x = Xe/ne$ A:
(1) for a reading pulse sequence in a one shot ultra high speed nuclear magnetic resonance imaging pulse sequence.
$A = 2 \cdot (2\pi \cdot Mr)^{60}$
where Mr: a reading time margin rate
(2) for a reading pulse sequence in a divisional scanning ultra high speed nuclear magnetic resonance imaging pulse sequence,
$A = 2 \cdot (2\pi \cdot Mr)^{60}$
(3) for a reading pulse sequence in a nuclear magnetic resonance angiography pulse sequence,
$A = 2 \cdot (2\pi \cdot Mr)^{60}$
where r: an asymmetric read sampling ratio,
(4) for an encoding pulse sequence,
$A = (2\pi)^\alpha$ The gradient coil configuration can then be specified in accordance with the determined optimum setting of the system parameters.

On the other hand, the various embodiments of the method for optimum setting of various system parmeters for various imaging pulse sequences under the given gradient coil configuration to be used in a nuclear magnetic resonance imaging according to the present invention can be expressed collectively as follows.

In the method for optimum setting of various system parameters for various imaging pulse sequences under the given gradient coil configuration to be used in a nuclear magnetic resonance imaging according to the present invention, any one of the following system parameters can be optimized.

DAT : a data acquisition time,
$\Delta xr$ : a spatial resolution requirement in a reading direction, Δxe : a spatial resolution requirement in an encoding direction, ND,r : a number of divided scans in a reading direction, ND,e : a number of divided scans in an encoding direction, TE : an echo time.

ne: a number of encoding steps, and

Δte: an encoding pulse width,

The optimum setting of these system parameters can be determined to be that for which the following equation (225) is satisfied by these system parameters.

$$I = (\gamma \cdot k \cdot \Delta x \cdot Nt \cdot L)^{-0.5} \cdot (A \cdot Vmax)^{0.5} \qquad (225)$$

where:

I: a multi-filer output current

γ: a magnetic moment of a proton nucleus k: a gradient magnetic field strength per each coil turn in a gradient coil with 1 Amp current supply Nt: a total number of coil turns in a gradient coil L: a gradient coil inductance per each filer Vmax: a maximum multi-filer output voltage Δx:
(1) for a reading pulse sequence in a one shot ultra high speed nuclear magnetic resonance imaging pulse sequence,
Δx=Δxr
(2) for a reading pulse sequence in a divisional scanning ultra high speed nuclear magnetic resonance imaging pulse sequence,
Δx=ND,r·Δxr
(3) for a reading pulse sequence in a nuclear magnetic resonance angiography pulse sequence,
Δx=Δxr
(4) for an encoding pulse sequence,
Δx=Xe/ne
where Xe: a size of a field of view in an encoding direction A:
(1) for a reading pulse sequence in a one shot ultra high speed nuclear magnetic resonance imaging pulse sequence,
A=π·Mr
where Mr: a reading time margin rate
(2) for a reading pulse sequence in a divisional scanning ultra high speed nuclear magnetic resonance imaging pulse sequence,
A=π·Mr
(3) for a reading pulse sequence in a nuclear magnetic resonance angiography pulse sequence,
A=π·r·Mr
where r: an asymmetric read sampling ratio,
(4) for an encoding pulse sequence,
A=2π

The optimum current supply to the gradient coil can then be specified by comparing the multi-filer output current I determined by the equation (225) for the optimum setting of the system parameters, with an exceptional case multi-filer output current Iex determined by the following equation (226), $$Iex = (1-u) \cdot Imax \qquad (226)$$

where:

u: a relative strength of an eddy current magnetic field

Imax: a maximum multi-filer output current and setting the optimum current supply to the gradient coil to be a smaller one of the multi-filer output current I and the exceptional case multi-filer output current I found by the above comparison.

It is to be noted here that, besides those already mentioned above many modifications and variations of the various embodiments described above may be made without departing from the novel and advantageous features of the present invention. Accordingly, all such modifications and variations are intended to be included within the scope of the appended claims.

What is claimed is:

1. An active shield gradient coil to be used in nuclear magnetic resonance imaging, comprising:

inner primary coil means for generating a desired gradient magnetic field within a desired imaging space; and outer shielding coil means, provided in a vicinity of the inner primary coil means, for shielding the gradient magnetic field generated by the inner primary coil means outside of the desired imaging space;

wherein at least one of the inner primary coil means and the outer shielding coil means has coil members provided on a plurality of separate layers, one different coil member in each layer, mutually connected electrically.

2. The active shield gradient coil of claim 1, wherein each of the coil members is made of a conductive body manufactured by a mechanical pattern forming manufacturing method for removing unnecessary portions of the conductive body to form a remaining portion of the conductive body in a desired shape of said each of the coil members.

3. The active shield gradient coil of claim 2, wherein the mechanical pattern forming manufacturing method is an etching manufacturing method.

4. The active shield gradient coil of claim 2, wherein each of the unnecessary portions of the conductive body removed by the mechanical pattern forming manufacturing method is in a minimum size removable in the mechanical pattern forming manufacturing method.

5. The active shield gradient coil of claim 1, wherein the plurality of separate layers are arranged within a predetermined thickness of said at least one of the inner primary coil means and the outer shielding coil means.

6. The active shield gradient coil of claim 5, wherein each of the coil members has a thickness equal to the predetermined thickness divided by a total number of coil members.

7. The active shield gradient coil of claim 1, wherein the coil members include a first coil member corresponding to odd coil turns and a second coil member corresponding to even coil turns, the first coil member and the second coil member being mutually connected electrically such that a direction of a current flow through the first coil member is identical to a direction of a current flow through the second coil member.

8. The active shield gradient coil of claim 7, wherein the first coil member and the second coil member are wound in opposite directions.

9. An active shield gradient coil to be used in nuclear magnetic resonance imaging, comprising:

inner primary coil means for generating a desired gradient magnetic field within a desired imaging space; and outer shielding coil means, provided in a vicinity of the inner primary coil means, for shielding the gradient magnetic field generated by the inner primary coil means outside of the imaging space;

wherein the inner primary coil means and the outer shielding coil means are formed by coil members, each of which is made of a conductive body, and the conductive body of at least one of the coil members has a slit portion formed thereon in which a part of the conductive body is removed.

10. The active shield gradient coil of claim 9, wherein the slit portion is located on the conductive body at such a position that a generation of eddy currents within the conductive body is suppressed by a presence of the slit portion.

11. An active shield gradient coil to be used in nuclear magnetic resonance imaging, comprising:

inner primary coil means for generating a desired gradient magnetic field within a desired imaging space; and outer shielding coil means, provided in a vicinity of the inner primary coil means, for shielding the gradient magnetic field generated by the inner primary coil means outside of the desired imaging space;

wherein at least one of the inner primary coil means and the outer shielding coil means has coil members provided on a plurality of separate layers, one different coil member in each layer, mutually connected electrically, and wherein the coil members include a first coil member and a second coil member having turns offset with respect to each other.

* * * * *